United States Patent
Honda et al.

(10) Patent No.: US 10,665,629 B2
(45) Date of Patent: May 26, 2020

(54) IMAGING DEVICE FOR REDUCING LUMINACE UNEVENNESS

(71) Applicant: SONY CORPORATION, Tokyo (JP)

(72) Inventors: Motonari Honda, Kanagawa (JP); Ryoji Suzuki, Kanagawa (JP); Takeshi Matsunuma, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/076,593

(22) PCT Filed: Feb. 10, 2017

(86) PCT No.: PCT/JP2017/004952
§ 371 (c)(1),
(2) Date: Aug. 8, 2018

(87) PCT Pub. No.: WO2017/145815
PCT Pub. Date: Aug. 31, 2017

(65) Prior Publication Data
US 2019/0043911 A1 Feb. 7, 2019

(30) Foreign Application Priority Data

Feb. 24, 2016 (JP) ................. 2016-032717

(51) Int. Cl.
*H01L 27/14* (2006.01)
*H01L 27/146* (2006.01)
(Continued)

(52) U.S. Cl.
CPC .... *H01L 27/14636* (2013.01); *H01L 21/7682* (2013.01); *H01L 27/14603* (2013.01);
(Continued)

(58) Field of Classification Search
CPC .. H04N 5/374; H04N 21/768; H04N 27/1464; H04N 5/3741
(Continued)

(56) References Cited

U.S. PATENT DOCUMENTS

2011/0266421 A1  11/2011  Nozaki et al.
2013/0020468 A1*  1/2013  Mitsuhashi ....... H01L 27/14627
                                                         250/208.1
(Continued)

FOREIGN PATENT DOCUMENTS

CN  102237379 A  11/2011
CN  103022062 A  4/2013
(Continued)

OTHER PUBLICATIONS

International Search Report and Written Opinion of PCT Application No. PCT/JP2017/004952, dated Apr. 25, 2017, 17 pages of ISRWO.

*Primary Examiner* — Mohammad M Hoque
(74) *Attorney, Agent, or Firm* — Chip Law Group

(57) ABSTRACT

The present technology relates to an imaging device designed to be able to reduce luminance unevenness. An imaging device includes a photodiode and a wiring layer formed on a surface facing the incident surface of the photodiode. A wiring line is formed in the wiring layer, and the wiring line in a pixel is formed in a different pattern from a pattern in a different pixel. Another imaging device including a photodiode and a wiring layer formed on a surface facing the incident surface of the photodiode. A wiring line is formed in the wiring layer. A gap having a different dielectric constant from the dielectric constant of the material forming the wiring layer is formed in the wiring layer,
(Continued)

and the gap in a pixel is formed in a different pattern from a pattern in a different pixel. The present technology can be applied to imaging devices.

18 Claims, 37 Drawing Sheets

(51) Int. Cl.
 *H01L 21/768* (2006.01)
 *H04N 5/374* (2011.01)
(52) U.S. Cl.
 CPC .. *H01L 27/14645* (2013.01); *H01L 27/14667* (2013.01); *H01L 27/1464* (2013.01); *H04N 5/3741* (2013.01)
(58) Field of Classification Search
 USPC ........................................................ 257/443
 See application file for complete search history.

(56) References Cited

U.S. PATENT DOCUMENTS

2014/0145287 A1\* 5/2014 Kato ................. H01L 27/14621
 257/432
2015/0036030 A1\* 2/2015 Kido ...................... H04N 5/332
 348/281
2015/0123228 A1 5/2015 Hatano et al.
2016/0133664 A1 5/2016 Aoki

FOREIGN PATENT DOCUMENTS

| | | | |
|---|---|---|---|
| CN | 103765590 A | 4/2014 |
| CN | 104349147 A | 2/2015 |
| CN | 104541371 A | 4/2015 |
| JP | 2008-147333 A | 6/2008 |
| JP | 2009-026941 A | 2/2009 |
| JP | 2010-118412 A | 5/2010 |
| JP | 2012-064703 A | 3/2012 |
| JP | 2013-055159 A | 3/2013 |
| JP | 2013-058661 A | 3/2013 |
| JP | 2014-072237 A | 4/2014 |
| JP | 2015-029012 A | 2/2015 |
| JP | 2015-035492 A | 2/2015 |
| JP | 2015-056417 A | 3/2015 |
| KR | 10-2015-0018775 A | 2/2015 |
| TW | 201138074 A | 11/2011 |
| WO | 2013/031707 A1 | 3/2013 |
| WO | 2013/172232 A1 | 11/2013 |
| WO | 2015/019931 A1 | 2/2015 |

\* cited by examiner

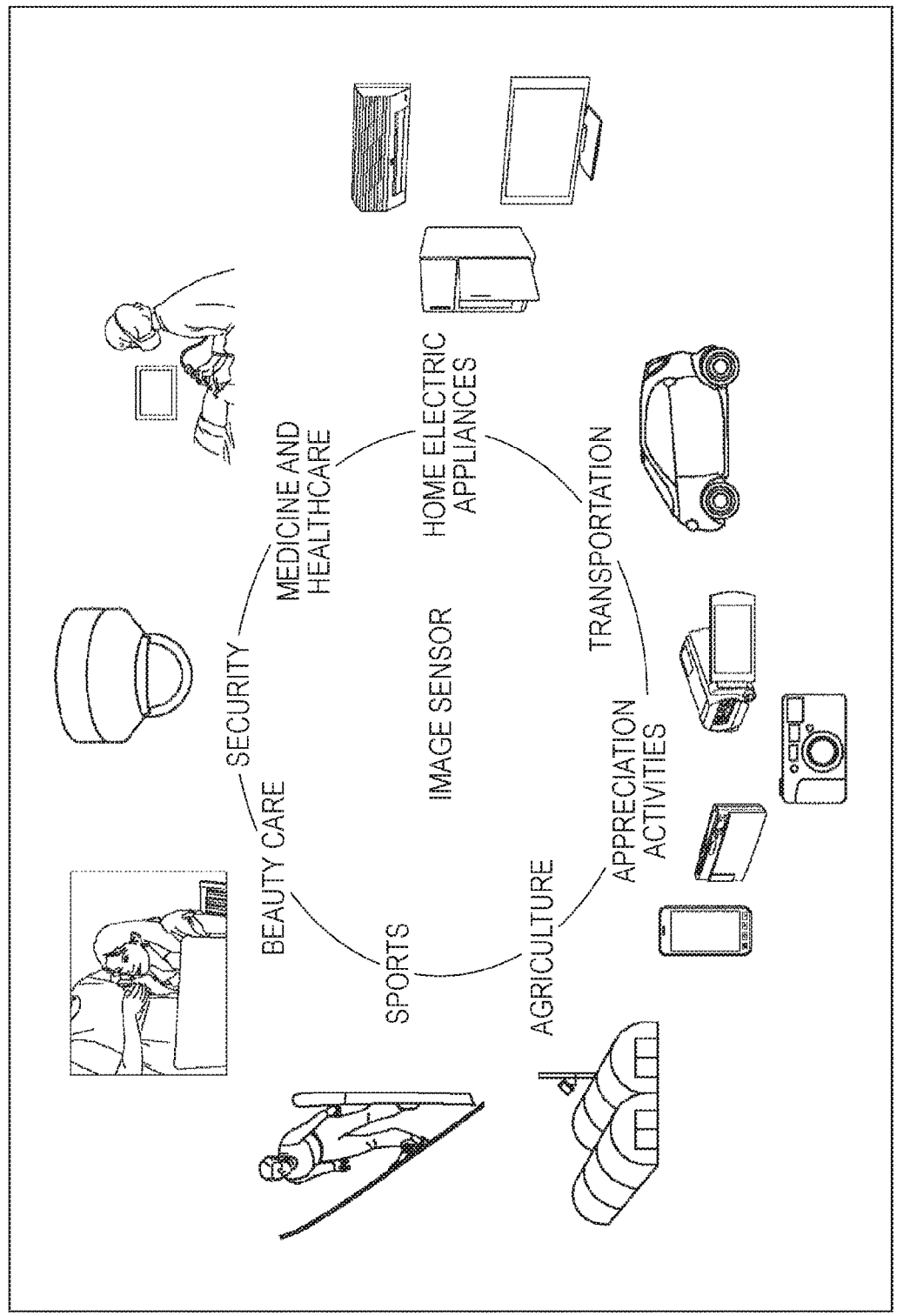

IMAGING DEVICE FOR REDUCING LUMINACE UNEVENNESS

CROSS REFERENCE TO RELATED APPLICATIONS

This application is a U.S. National Phase of International Patent Application No. PCT/JP2017/004952 filed on Feb. 10, 2017, which claims priority benefit of Japanese Patent Application No. JP 2016-032717 filed in the Japan Patent Office on Feb. 24, 2016. Each of the above-referenced applications is hereby incorporated herein by reference in its entirety.

TECHNICAL FIELD

The present technology relates to an imaging device, and to an imaging device designed to improve image quality, for example.

BACKGROUND ART

Imaging devices in which a plurality of charge coupled devices (CCDs), complementary metal-oxide semiconductor (CMOS) elements, and the like are two-dimensionally arranged are used these days in digital video cameras, digital still cameras, and the like. An imaging device is manufactured by forming photoelectric conversion portions and a diffusion layer through impurity introduction such as ion implantation into a substrate, and then depositing and processing films to form wiring layers and insulating films. Light that has entered the imaging device is absorbed by the photoelectric conversion portions, and is converted into electric charge. This electric charge is accumulated in the photoelectric conversion portions, and the total amount of the accumulated electric charge is detected. Thus, a signal corresponding to the incident light intensity is acquired.

However, if the penetration length of incident light is greater than the depth of the substrate, the incident light is not sufficiently absorbed by the photoelectric conversion portions, and part of the incident light passes through the substrate. As a result, the part of the incident light is not converted into a charge signal, and light use efficiency becomes lower. Patent Document 1 suggests improving sensitivity by effectively performing photoelectric conversion on light that has passed through the photoelectric conversion portions and has a long wavelength.

CITATION LIST

Patent Documents

Patent Document 1: Japanese Patent Application Laid-Open No. 2008-147333
Patent Document 2: Japanese Patent Application Laid-Open No. 2015-56417
Patent Document 3: Japanese Patent Application Laid-Open No. 2012-64703

SUMMARY OF THE INVENTION

Problems to be Solved by the Invention

In the imaging device disclosed in Patent Document 1, the reflector includes the same material as the wiring layer. The wiring layer is used as the connecting wiring lines of an amplification transistor for extracting photoelectric conversion signals and the like, and the formation region of the reflector can be formed only in a region excluding these wiring lines, and therefore, the layout area is restricted. For this reason, the reflection efficiency of light reflected light by the reflector has a limit.

Patent Document 2 suggests improving reflection efficiency and sensitivity by providing reflective portions that reflect light transmitted without being absorbed by the photoelectric conversion portions, toward the photoelectric conversion portions. However, the reflective portions are periodically arranged. Therefore, there is a possibility that periodic luminance unevenness will be caused, and image quality will be degraded due to the luminance unevenness.

Patent Document 3 suggests preventing wiring line reflection by periodically arranging fine conductive particles between the photoelectric conversion portions and the wiring layer to provide a conductive structure layer, and absorbing light having passed through the photoelectric conversion portions with localized plasmon. However, since the absorption wavelength is determined by the period of the conductive structure, the absorption wavelength is limited, and there is a possibility that the effect to reduce reflection by wiring lines cannot be fully exhibited.

Therefore, there is a demand for luminance unevenness reduction and image quality improvement.

The present technology has been developed in view of those circumstances, and is to enable luminance unevenness reduction and image quality improvement.

Solutions to Problems

A first imaging device according to one aspect of the present technology includes: a photodiode; and a wiring layer formed on a surface facing the incident surface of the photodiode, a wiring line being formed in the wiring layer. The wiring line in a pixel is formed in a different pattern from a pattern in a different pixel.

A second imaging device according to one aspect of the present technology includes: a photodiode; and a wiring layer formed on a surface facing the incident surface of the photodiode, a wiring line being formed in the wiring layer. A gap having a different dielectric constant from the dielectric constant of the material forming the wiring layer is formed in the wiring layer, and the gap in a pixel is formed in a different pattern from a pattern in a different pixel.

In the first imaging device according to one aspect of the present technology, a wiring layer that is formed on a surface facing the incident surface of a photodiode and has a wiring formed therein is provided, and the wiring line in a pixel is formed in a different pattern from a pattern in a different pixel.

In the second imaging device according to one aspect of the present technology, a wiring layer that is formed on a surface facing the incident surface of a photodiode and has a wiring line formed therein is provided. A gap having a different dielectric constant from the dielectric constant of the material forming the wiring layer is formed in the wiring layer, and the gap in a pixel is formed in a different pattern from a pattern in a different pixel.

Effects of the Invention

According to one aspect of the present technology, luminance unevenness can be reduced, and image quality can be improved.

It should be noted that the effects of the present technology are not necessarily limited to the effects described herein, and may include any of the effects described in the present disclosure.

BRIEF DESCRIPTION OF DRAWINGS

FIG. 25 is a diagram for explaining a color layout.
FIG. 26 is a diagram for explaining a color layout.
FIG. 38 is a diagram for explaining examples of use of imaging devices.

MODES FOR CARRYING OUT THE INVENTION

<Configuration of an Imaging Device>

Figure 1:
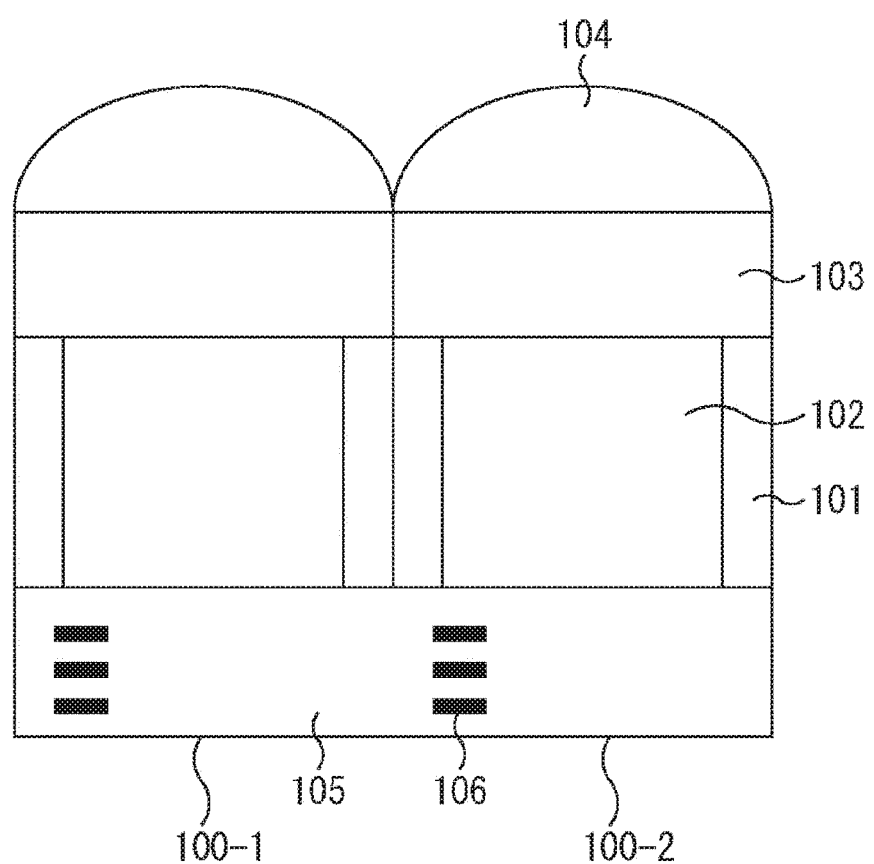
FIG. 1 is a diagram showing the configuration of an embodiment of pixels to which the present technology is applied.

FIG. 1 is a diagram showing the configuration of an embodiment of an imaging device to which the present technology is applied. FIG. 1 is a cross-sectional view showing a pixel structure of an imaging device. In the description below, two adjacent pixels (pixels 100-1 and 100-2) are shown in the drawing and are described. However, an appropriate number of such pixels are arranged in rows and columns in a matrix fashion. Further, although a back-illuminated imaging device is described herein as an example, the following description does not limit applications of the present technology to back-illuminated imaging devices.

In the pixel structure shown in FIG. 1, on-chip lenses 104 are formed above a silicon substrate 101 in which photodiodes 102 are formed, via color filters 103. Further, a wiring layer 105 provided with wiring lines 106 to be used for reading signal charges and applying voltages to respective components are formed on the surface opposite from the light incident surface (the side on which the on-chip lenses 104 are provided).

The wiring lines 106 include a metal, and are used for reading signal charges and applying voltages to the respective components.

Meanwhile, there is a possibility that light transmitted through the silicon substrate 101 is reflected by the wiring lines 106, and reenters the photodiodes 102. If the wiring lines 106 are periodically arranged, reflected light also periodically enters the photodiodes 102. As a result, periodic brightness unevenness occurs, and image quality might be degraded. Therefore, the layouts and the shapes of the wiring lines 106 are changed, so that the wiring lines 106 do not have a periodic structure, and periodic luminance unevenness is prevented. The following is a description of such an embodiment.

<Shapes and Layouts of Wiring Lines>

Figure 2:
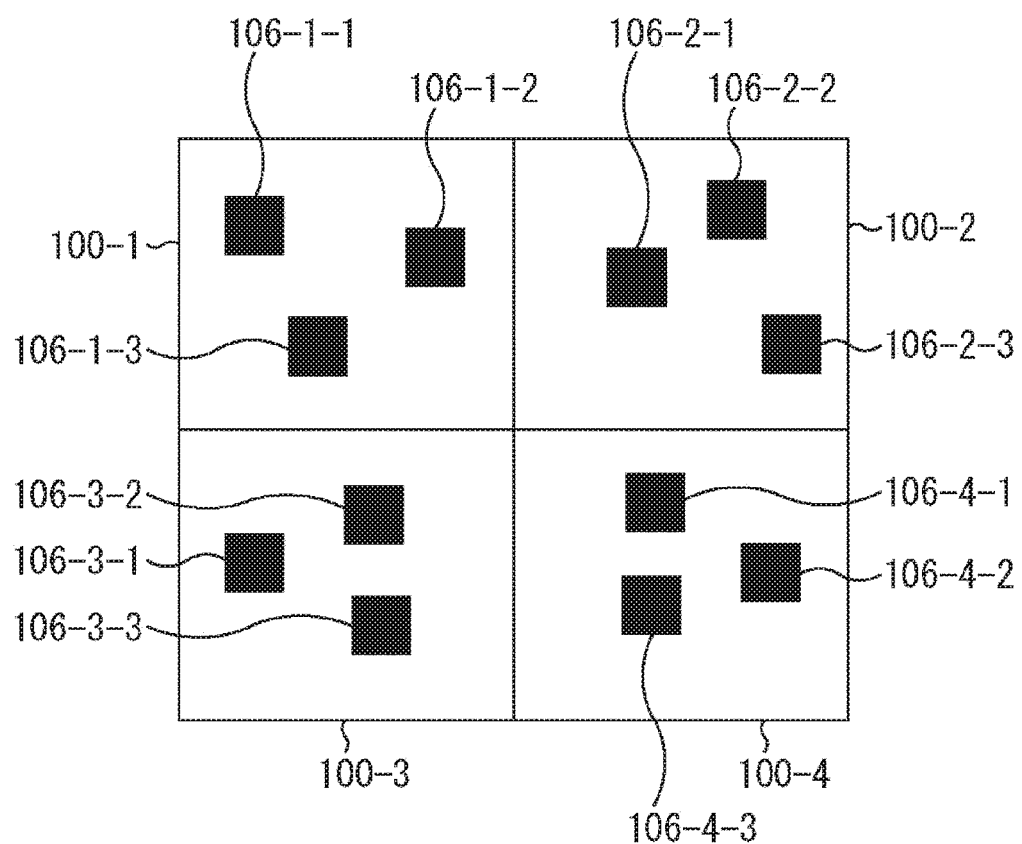
FIG. 2 is a diagram for explaining a wiring pattern.

FIG. 2 is a plan view showing pixel structures of an imaging device. FIG. 2 shows 2×2 or four pixels, and these four pixels are pixels 100-1 through 100-4. Wiring lines 106-1-1 through 106-1-3 are formed in the pixel 100-1, wiring lines 106-2-1 through 106-2-3 are formed in the pixel 100-2, wiring lines 106-3-1 through 106-3-3 are formed in the pixel 100-3, and wiring lines 106-4-1 through 106-4-3 are formed in the pixel 100-4.

Three wiring lines 106 are formed in the each of the pixels 100-1 through 100-4. The respective wiring lines 106 are the same in being designed to have the same shape (quadrangular shape) and size, but differ from one another in position at which the wiring lines 106 are disposed in the pixels 100.

In the example shown in FIG. 2, the positions of the wiring lines 106 in the pixels 100 differ from one pixel 100 to another. In other words, the wiring lines 106 are disposed so that the distances between adjacent wiring lines 106 vary.

For example, the wiring line 106-1-1 of the pixel 100-1 is formed at an upper left position in the pixel 100-1. Any wiring line 106 is not formed at an upper left position in the pixel 100-2, the upper left position corresponding to the upper left position in the pixel 100 in which the wiring line 106-1-1 of the pixel 100-1 is disposed. In this manner, the positions at which the wiring lines 106 are formed in the pixels 100 differ from one pixel 100 to another.

As the positions of the wiring lines 106 are set irregularly (without having any predetermined pattern) as described above, it becomes possible to eliminate periodicity in the layouts of the wiring lines 106, and reduce luminance unevenness.

Figure 3:
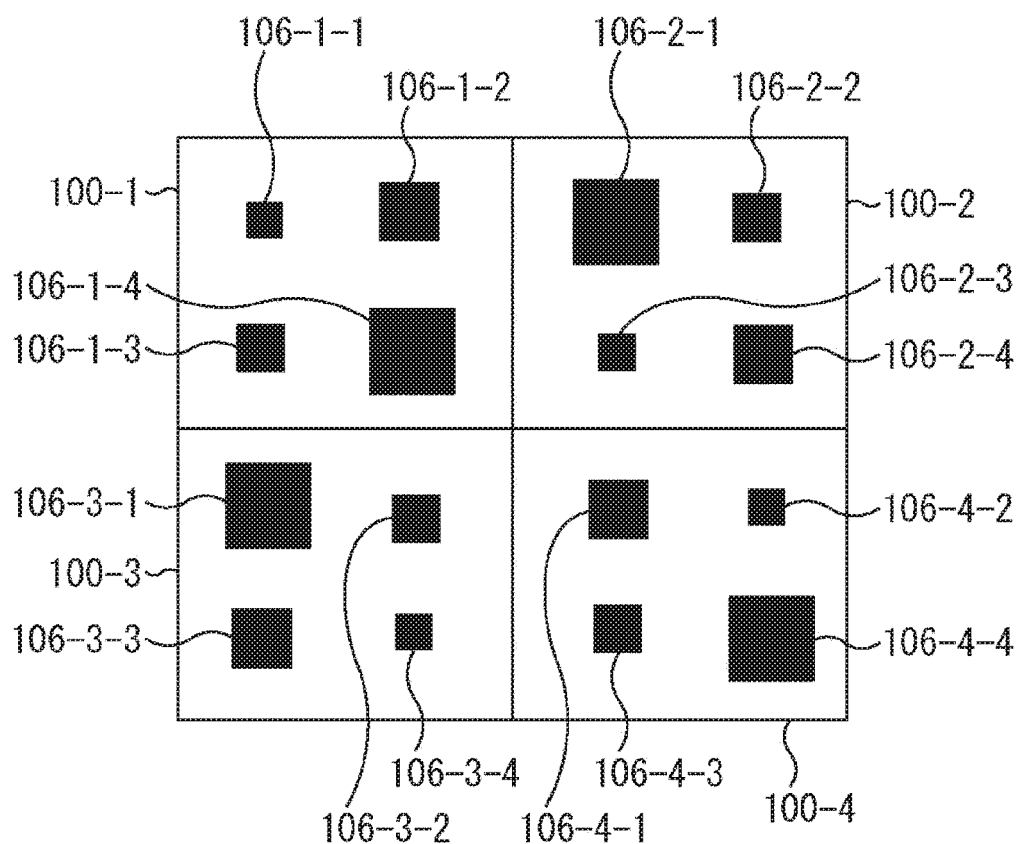
FIG. 3 is a diagram for explaining a wiring pattern.

FIG. 3 is a plan view showing pixel structures of an imaging device. Wiring lines 106-1-1 through 106-1-4 are formed in a pixel 100-1, wiring lines 106-2-1 through 106-2-4 are formed in a pixel 100-2, wiring lines 106-3-1 through 106-3-4 are formed in a pixel 100-3, and wiring lines 106-4-1 through 106-4-4 are formed in a pixel 100-4.

Four wiring lines 106 are formed in the each of the pixels 100-1 through 100-4. The respective wiring lines 106 are the same in being designed to have the same shape (quadrangular shape) and the same positions among the pixels 100, but the wiring lines 106 formed in each pixel 100 differ from one another in size.

In the example shown in FIG. 3, the positions at which the wiring lines 106 are formed in different sizes in the pixels 100 differ from one pixel 100 to another. In this case, the distances between the adjacent wiring lines 106 (the distances between the centers of the wiring lines 106) may be the same, or may be different.

For example, the wiring lines 106-1-1 through 106-1-4 in the pixel 100-1 are formed in different sizes from one another. In this manner, in one pixel 100, a plurality of wiring lines formed in the pixel 100 are formed in different sizes from one another.

Further, the wiring line 106-1-1 is disposed at an upper left position in the pixel 100-1, and the wiring line 106-2-1 is disposed at the upper left position in the pixel 100-2, for example. Although the wiring line 106-1-1 and the wiring line 106-1-2 are disposed in different pixels 100, these wiring lines are located at the same position (the upper left position) in the respective pixels 100. The wiring line 106-1-1 and the wiring line 106-1-2 differ in size. As described above, when pixels 100 are compared with each other, wiring lines 106 of different sizes are formed at the same position in the pixels 100.

As the sizes of the wiring lines 106 are designed to be irregular (without having any predetermined pattern) as described above, it becomes possible to eliminate periodicity in the layouts of the wiring lines 106, and reduce luminance unevenness.

Figure 4:
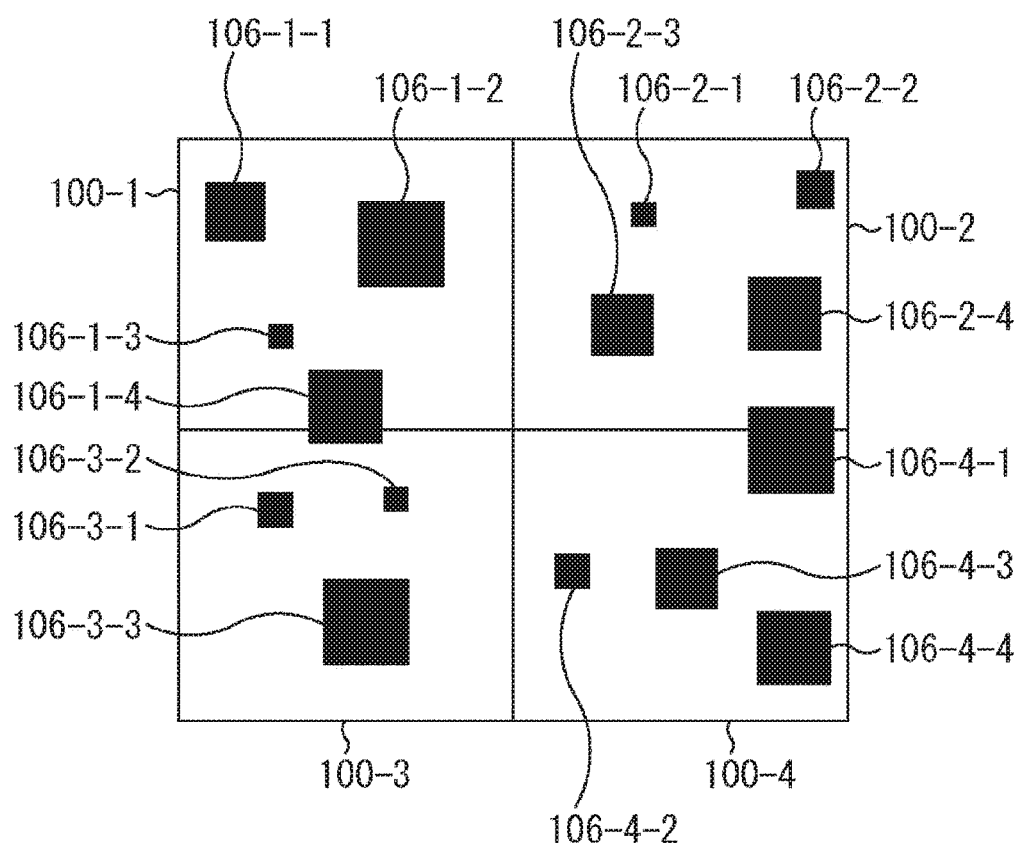
FIG. 4 is a diagram for explaining a wiring pattern.

FIG. 4 is a plan view showing pixel structures of an imaging device. Wiring lines 106-1-1 through 106-1-4 are formed in a pixel 100-1, wiring lines 106-2-1 through 106-2-4 are formed in a pixel 100-2, wiring lines 106-3-1 through 106-3-3 are formed in a pixel 100-3, and wiring lines 106-4-1 through 106-4-4 are formed in a pixel 100-4.

Three or four wiring lines 106 are formed in the each of the pixels 100-1 through 100-4. The respective wiring lines 106 are the same in being designed to have the same shape (quadrangular shape), but differ from one another in position at which the wiring lines 106 are disposed in the pixels 100, and in size.

In the example shown in FIG. 4, the positions and the sizes of the wiring lines 106 in the pixels 100 differ from one pixel 100 to another. In this case, the distances between the adjacent wiring lines 106 (the distances between the centers of the wiring lines 106) are different.

The wiring lines 106 shown in FIG. 4 are formed in positions and sizes that are a combination of a case where the positions of the wiring lines 106 shown in FIG. 2 are irregularly set, and a case where the wiring lines 106 shown in FIG. 3 are formed in irregular sizes.

As the positions and the sizes of the wiring lines 106 are designed to be irregular (without having any predetermined pattern) as described above, it becomes possible to eliminate periodicity in the layouts of the wiring lines 106, and reduce luminance unevenness.

It should be noted that a wiring line 106 may be formed at a position spanning a plurality of pixels 100, like the wiring line 106-1-4 and the wiring line 106-4-1.

Figure 5:
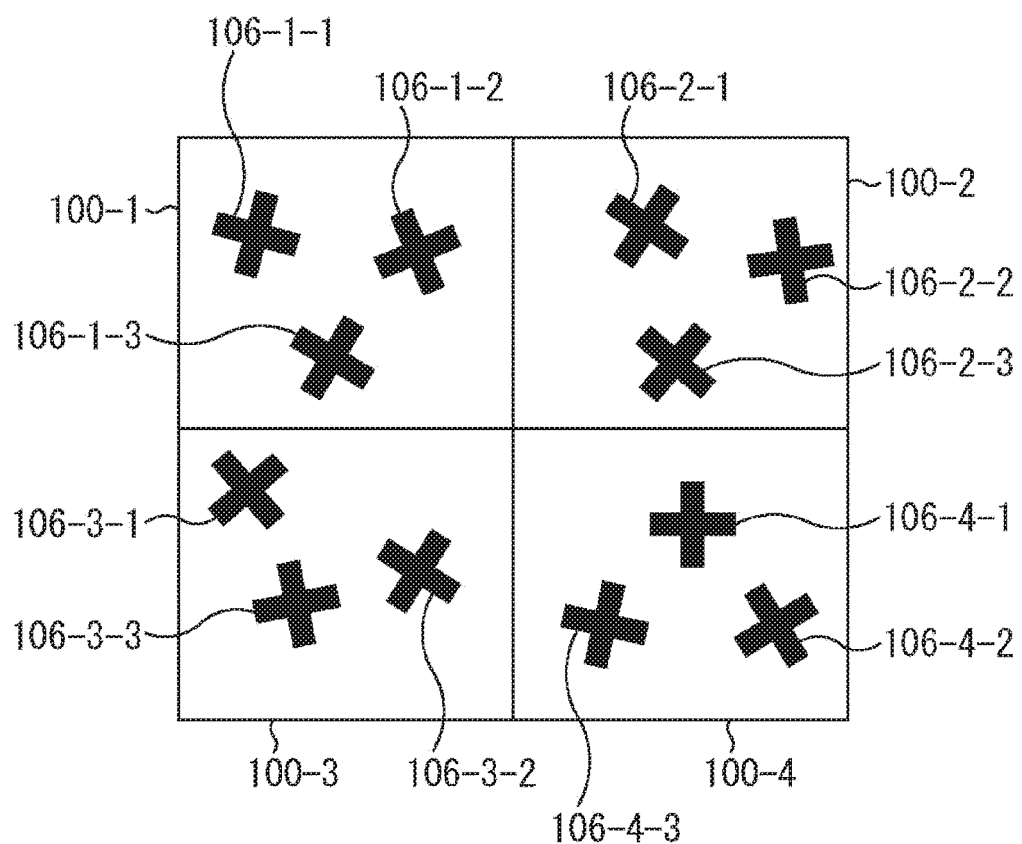
FIG. 5 is a diagram for explaining a wiring pattern.

FIG. 5 is a plan view showing pixel structures of an imaging device. Wiring lines 106-1-1 through 106-1-3 are formed in the pixel 100-1, wiring lines 106-2-1 through 106-2-3 are formed in the pixel 100-2, wiring lines 106-3-1 through 106-3-3 are formed in the pixel 100-3, and wiring lines 106-4-1 through 106-4-3 are formed in the pixel 100-4.

Three wiring lines 106 are formed in the each of the pixels 100-1 through 100-4. The respective wiring lines 106 are the same in being designed to have the same shape and size, but differ from one another in the rotation angles of the wiring lines 106 in the pixels 100.

The wiring lines 106 shown in FIG. 5 are formed in a cross shape. In other words, a wiring line 106 is formed in a shape in which two straight lines cross each other at right angles. The rotation angles of the wiring lines 106 formed in such a shape are set so as to differ from one pixel 100 to another.

It should be noted that, in one pixel 100, the rotation angles of the wiring lines 106 formed in the pixels 100 may be the same or may be different. In the case shown in FIG. 5, the rotation angles of the wiring lines 106 formed in the pixels 100 are different.

Although the wiring lines 106 described with reference to FIGS. 2 through 4 have quadrangular shapes and the same rotation angle, rotation angles may differ from one wiring line 106 to another in each pixel 100, or may differ from one pixel 100 to another, like the wiring lines 106 described above with reference to FIG. 5.

Further, in the example case shown in FIG. 5, the shape of the wiring lines 106 is a cross. However, the shape may be a quadrangular shape as shown in FIGS. 2 through 4, as long as the rotation angles of the wiring lines 106 can be made to vary irregularly. For example, a polygonal shape such as a triangular shape can be adopted.

As the rotation angles of the wiring lines 106 are designed to be irregular (without having any predetermined pattern) as described above, it becomes possible to eliminate periodicity in the layouts of the wiring lines 106, and reduce luminance unevenness.

Figure 6:
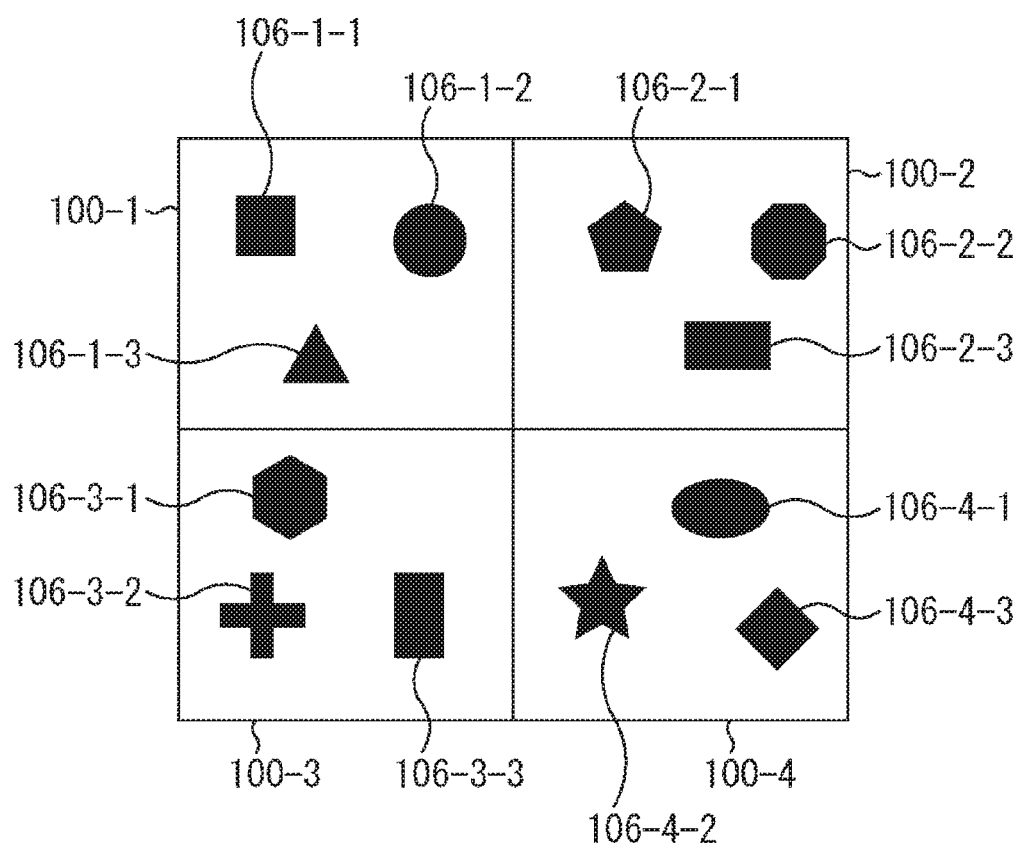
FIG. 6 is a diagram for explaining a wiring pattern.

FIG. 6 is a plan view showing pixel structures of an imaging device. Wiring lines 106-1-1 through 106-1-3 are formed in the pixel 100-1, wiring lines 106-2-1 through 106-2-3 are formed in the pixel 100-2, wiring lines 106-3-1 through 106-3-3 are formed in the pixel 100-3, and wiring lines 106-4-1 through 106-4-3 are formed in the pixel 100-4.

The wiring lines 106-1-1 through 106-1-3, the wiring lines 106-2-1 through 106-2-3, the wiring lines 106-3-1 through 106-3-3, and the wiring lines 106-4-1 through 106-4-3 differ from one another in shape. In the example shown in FIG. 6, twelve wiring lines 106 are formed, and the twelve wiring lines 106 differ from one another in shape.

As the shapes of the wiring lines 106 are designed to be irregular (without having any predetermined pattern) as described above, it becomes possible to eliminate periodicity in the layouts of the wiring lines 106, and reduce luminance unevenness.

It should be noted that, although the wiring lines 106 formed in one pixel 100 also differ from one another in shape in the example case shown in FIG. 6, the wiring lines 106 formed in one pixel 100 may have the same shape, and the wiring lines 106 may differ in shape from one pixel 100 to another.

For example, the wiring lines 106-1-1 through 106-1-3 formed in the pixel 100-1 are formed in the same shape (referred to as the shape A), and the wiring lines 106-2-1 through 106-2-3 formed in the pixel 100-2 are formed in the same shape (referred to as the shape B). In this case, the shapes A and B are designed to be different.

Alternatively, the shapes of the wiring lines 106 formed in one pixel 100 may differ from one another, and the shapes of wiring lines 106 formed in different pixels 100 may be the same.

For example, in a case where the wiring lines 106-1-1 through 106-1-3 formed in the pixel 100-1 are formed in different shapes (referred to as the shape A, the shape B, and the shape C), the wiring lines 106-2-1 through 106-2-3 formed in the pixel 100-2 are also formed in the shapes A, B, and C, respectively.

As the positions, the sizes, the rotation angles, the shapes, and the like of the wiring lines 106 are designed to be irregular as described above, it becomes possible to eliminate periodicity in the layouts of the wiring lines 106, and thus reduce luminance unevenness. Not all the wiring lines 106 are necessarily used as wiring lines, but the wiring lines 106 may include wiring lines not to be used (dummy wiring lines). The positions, the sizes, the rotation angles, the shapes, and the like of the wiring lines 106 including the dummy wiring lines may be designed to be irregular, and the wiring lines 106 may be arranged so that the wiring lines 106 do not have any periodicity.

As described above, in a case where the wiring patterns of the wiring lines 106 are designed to differ from one pixel 100 to another, the FD wiring capacitances may differ from pixel 100 to another. An FD wiring capacitance is a capacitance generated between a floating diffusion (FD) and a wiring line 106. If the FD wiring capacitances differ from one pixel 100 to another, there is a possibility that image quality may be adversely affected.

As described above, even in a case where the wiring patterns of the wiring lines 106 are designed to differ from one pixel 100 to another, the wiring lines 106 are formed so that the FD wiring capacitance of each pixel 100 becomes as constant as possible, and image quality is not adversely affected.

Figure 7:
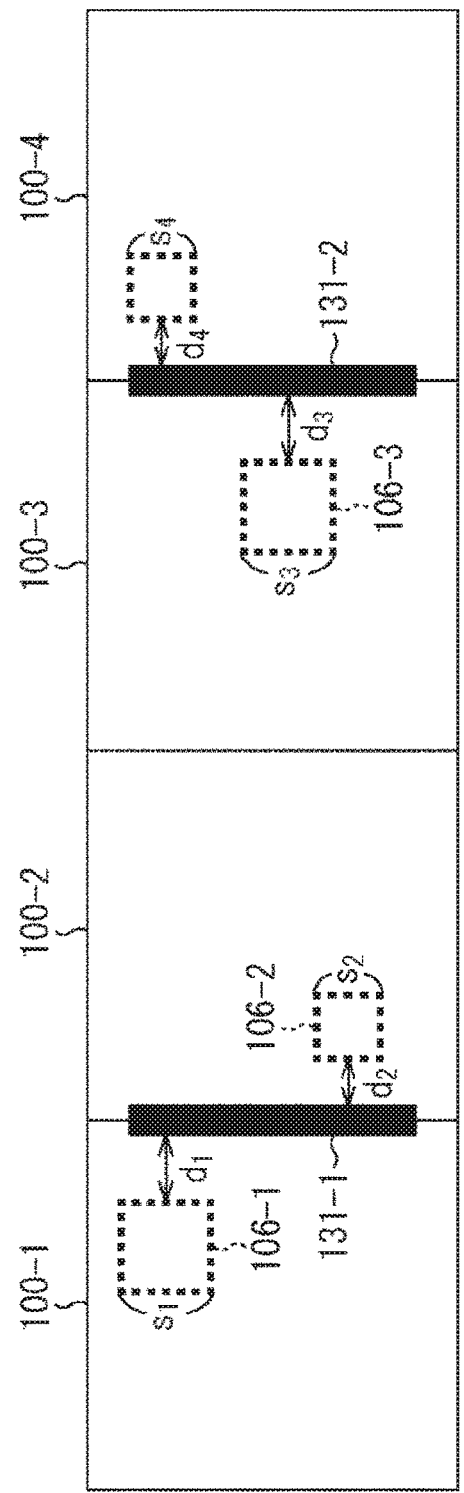
FIG. 7 is a diagram for explaining FD wiring capacitances.

FIG. 7 shows an example in which pixels 100-1 through 100-4 are arranged side by side, an FD wiring line 131-1 is disposed on the boundary between the pixel 100-1 and the pixel 100-2, and an FD wiring line 131-2 is disposed on the boundary between the pixel 100-3 and the pixel 100-4.

In the pixel 100-1, a wiring line 106-1 having a side length s1 is formed at a position at a distance d1 from the FD wiring line 131-1. In the pixel 100-2, a wiring line 106-2 having a side length s2 is formed at a position at a distance d2 from the FD wiring line 131-1.

In the pixel 100-3, a wiring line 106-3 having a side length s3 is formed at a position at a distance d3 from the FD wiring line 131-2. In the pixel 100-4, a wiring line 106-4 having a side length s4 is formed at a position at a distance d4 from the FD wiring line 131-2.

In the example shown in FIG. 7, the relationship, length s1>length s2, is maintained between the side length s1 of the wiring line 106-1 and the side length s2 of the wiring line 106-2. Also, the relationship, distance d1>distance d2, is maintained between the distance d1 between the wiring line 106-1 and the FD wiring line 131-1 and the distance d2 between the wiring line 106-2 and the FD wiring line 131-1.

Likewise, the relationship, length s3>length s4, is maintained between the side length s3 of the wiring line 106-3 and the side length s4 of the wiring line 106-4. Further, the relationship, distance d3>distance d4, is maintained between the distance d3 between the wiring line 106-3 and the FD wiring line 131-2 and the distance d4 between the wiring line 106-4 and the FD wiring line 131-2.

Also, in this example, the area of the surface of the wiring line 106-1 of the pixel 100-1 located on the side of the FD wiring line 131-1 is set as an area S1, and the area of the wiring line 106-2 of the pixel 100-2 located on the side of the FD wiring line 131-1 is set as an area S2. The area S1 and the area S2 are in the relationship, area S1>area S2.

Likewise, the area of the surface of the wiring line 106-3 of the pixel 100-3 located on the side of the FD wiring line 131-2 is set as an area S3, and the area of the wiring line 106-3 of the pixel 100-4 located on the side of the FD wiring line 131-2 is set as an area S4. The area S3 and the area S4 are in the relationship, area S3>area S4.

An FD wiring capacitance is calculated from the area of the surface of the wiring line 106 located on the side of the FD wiring line 131, and the distance between the wiring line 106 and the FD wiring line 131.

That is, in a case where the dielectric constant of the dielectric between the wiring line 106 and the FD wiring line 131 is represented by e, the FD capacitance (represented by C1) of the pixel 100-1 is determined according to the following expression (1).

$$\text{FD capacitance } C1 = e \times (S1/d1) \qquad (1)$$

Likewise, the FD capacitance (represented by C2) of the pixel 100-2 is determined according to the following equation (2).

$$\text{FD capacitance } C2 = e \times (S2/d2) \qquad (2)$$

Likewise, the FD capacitance (represented by C3) of the pixel 100-3 is determined according to the following equation (3).

$$\text{FD capacitance } C3 = e \times (S3/d3) \qquad (3)$$

Likewise, the FD capacitance (represented by C4) of the pixel 100-4 is determined according to the following equation (4).

$$\text{FD capacitance } C4 = e \times (S4/d4) \qquad (4)$$

The FD capacitance in the FD wiring line 131-1 is a value obtained by adding the FD capacitance C1 and the FD capacitance C2, and the FD capacitance in the FD wiring line 131-2 is a value obtained by adding the FD capacitance C3 and the FD capacitance C4.

As described above, the wiring lines 106 should be designed so that the FD capacitance in the FD wiring line 131-1 and the FD capacitance in the FD wiring line 131-2 become constant. That is, in a case where FD capacitance C1+FD capacitance C2=FD capacitance C3+FD capacitance C4 is satisfied, (S1/d1)+(S2/d2)=(S3/d3)+(S4/d4) should be satisfied.

In a case where such a condition is satisfied, and the wiring lines 106 are arranged as shown in FIG. 7, area S1=area S3, and area S2=area S4 should be satisfied, and distance d1=distance d3, and distance d2=distance d4 should be satisfied.

In other words, in a case where the wiring lines 106 are irregularly arranged so that the FD wiring capacitances become constant, the wiring lines 106 of the same size should be irregularly arranged while being restricted to positions at the same distance from the FD wiring line 131 in the wiring pattern in the vicinity of the FD wiring line 131.

It should be noted that the wiring lines 106 are limited to those in "the vicinity of the FD wiring line 131", or the wiring lines 106 located far away from the FD wiring line 131 are excluded from the current targets, because it is considered that the wiring lines 106 located far away from the FD wiring line 131 do not have significant influence on the FD wiring capacitance. That is, referring again to the expression (1), for example, the FD capacitance C1 decreases as the distance d1 becomes longer according to the expression (1), and therefore, it is considered that the FD wiring capacitance is not affected (or the capacitance is ignorable).

Therefore, in this description, the wiring patterns in the vicinity of the FD wiring lines 131 are the current targets, and the wiring lines 106 of the same size are arranged irregularly while being restricted to positions at the same distances from the FD wiring lines 131. However, not only the wiring lines 106 in the vicinities of the FD wiring lines 131 but all the wiring lines 106 may be the current targets.

<Regarding Irregular Patterns Using Periodic Patterns>

In the above described embodiment, examples in which the wiring lines 106 are arranged irregularly have been described. In other words, in the above example cases, the distances between adjacent wiring lines 106 are different, the sizes of adjacent wiring lines 106 are different, or the shapes of adjacent wiring lines 106 are different, for example.

As will be described below with reference to FIGS. 8 through 12, luminance unevenness can be reduced even in a case where the distances, the sizes, and the shapes of adjacent wiring lines 106 are the same, but the patterns of wiring lines 106 are different when compared in the pixels 100.

Figure 8:
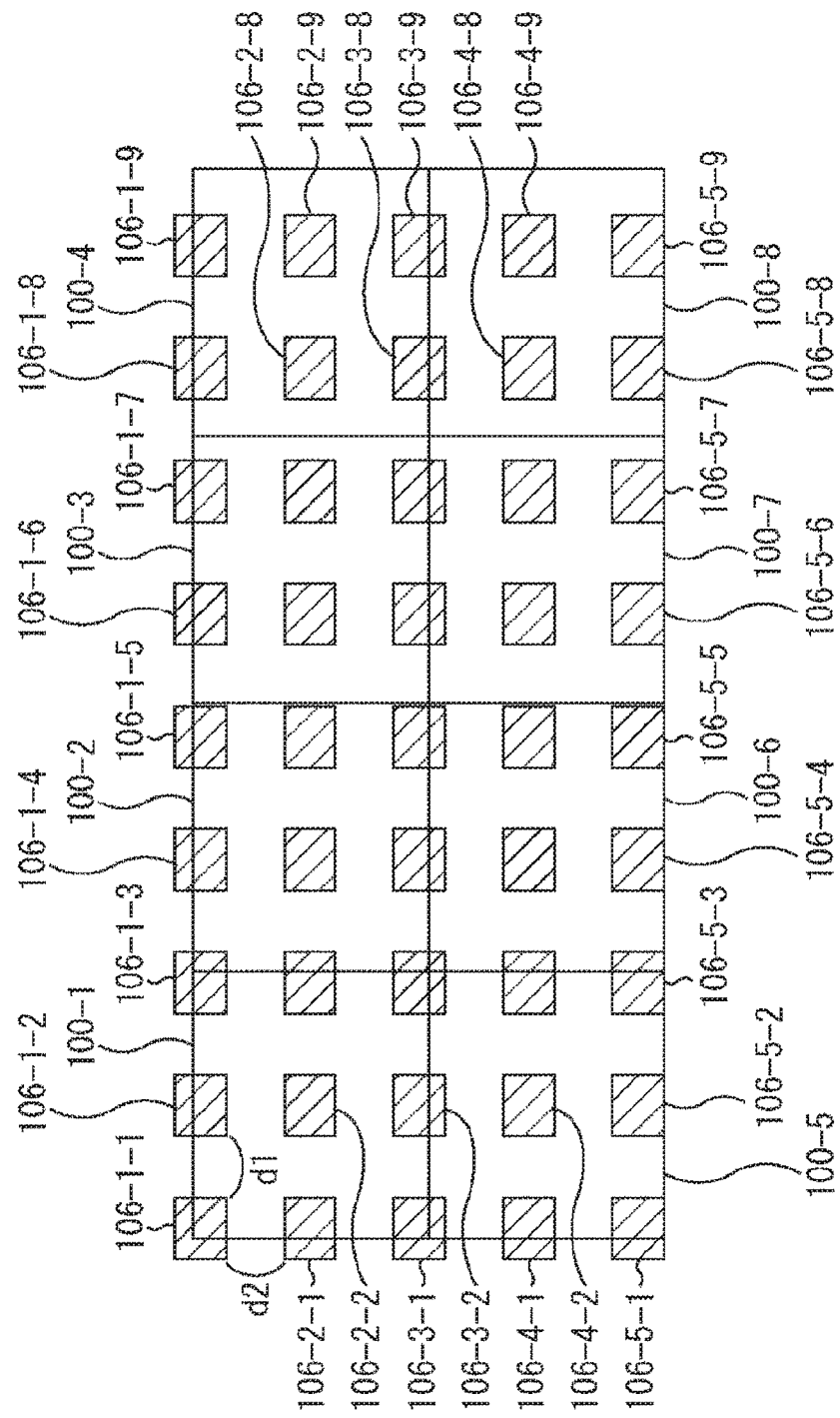
FIG. 8 is a diagram for explaining a wiring pattern.

Referring to FIG. 8, wiring lines 106 are formed in a quadrangular shape and in the same size. Also, the distance between the wiring lines 106 is set at a distance d1. For example, the distance between a wiring line 106-1-1 and a wiring line 106-1-2 adjacent to the wiring line 106-1-1 in a lateral direction is the distance d1. In this manner, the distance between the wiring lines 106 arranged in the lateral direction is set at the distance d1, and are arranged at regular intervals.

Also, the distance between the wiring line 106-1-1 and a wiring line 106-2-1 adjacent to the wiring line 106-1-1 in a longitudinal direction is a distance d2, for example. In this manner, the distance between the wiring lines 106 arranged in the longitudinal direction are set at the distance d2, and are arranged at regular intervals.

The distance d1 and the distance d2 may be either the same distances or different distances. In the description below, the distance d1 and the distance d2 are the same.

The layout of the wiring lines 106 shown in FIG. 8 is a pattern in which the wiring lines 106 are periodically arranged at intervals of the distance d1 (distance d2). However, the patterns of the wiring lines 106 arranged in the pixels 100 are designed to differ from one pixel 100 to another.

For example, a pixel 100-1 and a pixel 100-4 are described herein. In the pixel 100-1, wiring lines 106-1-1 through 106-1-3, wiring lines 106-2-1 through 106-2-3, and wiring lines 106-3-1 through 106-3-3 are formed. In this case, nine wiring lines 106 are formed in the pixel 100-1.

In the pixel 100-4, wiring lines 106-1-8 and 106-1-9, wiring lines 106-2-8 and 106-2-9, and wiring lines 106-3-8 and 106-3-9 are formed. In this case, six wiring lines 106 are formed in the pixel 100-4.

In this manner, the pattern of the wiring lines 106 formed in the pixel 100-1 and the pattern of the wiring lines 106 formed in the pixel 100-4 are different patterns. The patterns of the wiring lines 106 in the other pixels 100 are also different patterns.

As described above, the periods of the wiring lines 106 and the periods of the pixels 100 are designed to be indivisible by each other even if the wiring lines 106 are periodically arranged. Thus, the patterns of the positions of the wiring lines 106 can be made to differ from one pixel 100 to another (become irregular).

Not all the periodically arranged wiring lines 106 are necessarily used as wiring lines, but the periodically arranged wiring lines 106 may include wiring lines not to be used (dummy wiring lines). Dummy wiring lines may be periodically arranged so that the period of the dummy wiring lines and the period of the pixels 100 are indivisible by each other, and the wiring patterns of the dummy wiring pattern become irregular among the pixels 100.

Figure 9:
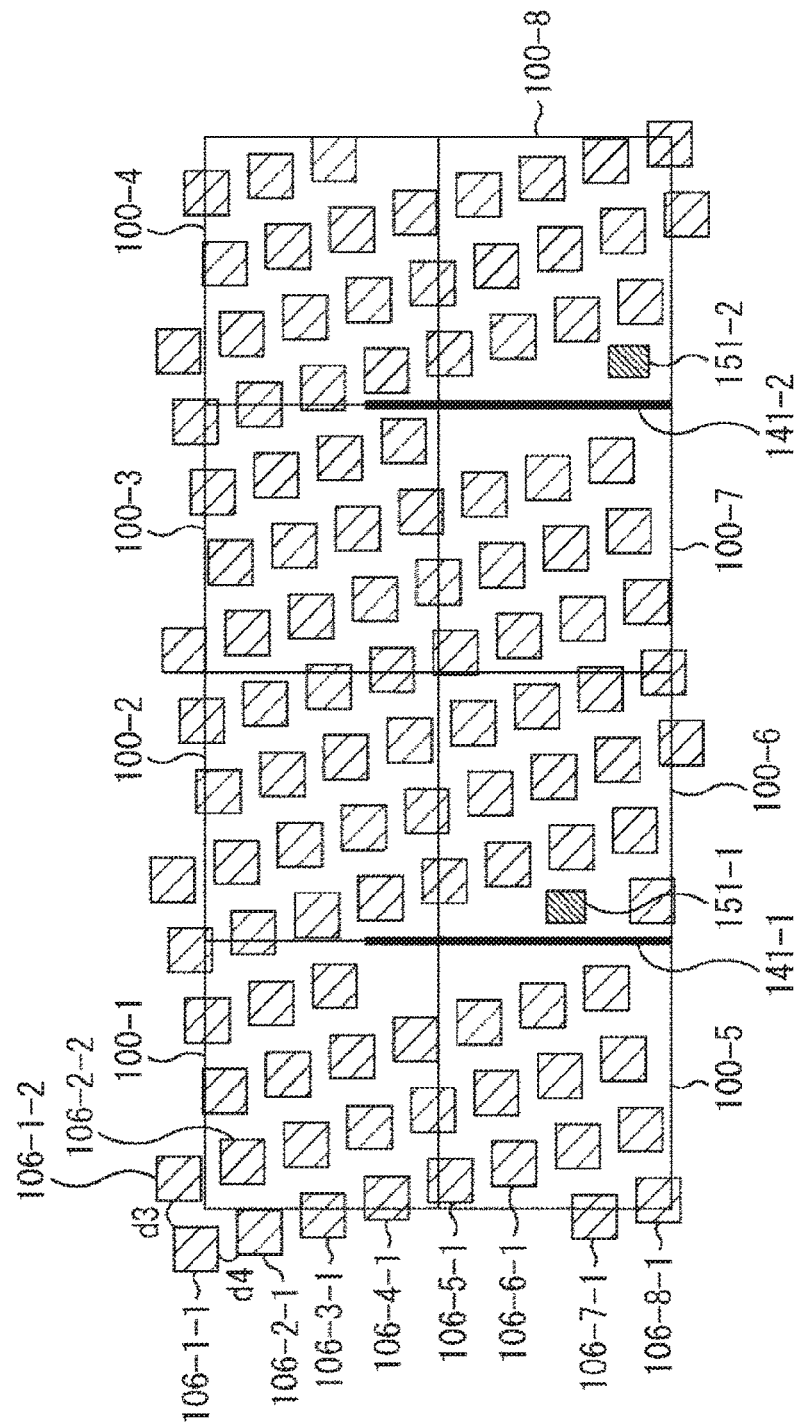
FIG. 9 is a diagram for explaining a wiring pattern.

Like the wiring lines 106 shown in FIG. 8, quadrangular wiring lines 106 are periodically arranged, but the layout may be as shown in FIG. 9. Referring to FIG. 9, the wiring lines 106 are linearly arranged in oblique directions.

The respective wiring lines 106 are formed in a quadrangular shape and in the same size. Also, the distance between the wiring lines 106 is set at a distance d3. For example, the distance between a wiring line 106-1-1 and a wiring line 106-1-2 adjacent to the wiring line 106-1-1 in a lateral direction is the distance d3. In this manner, the distance between the wiring lines 106 arranged in the lateral direction is set at the distance d3, and are arranged at regular intervals.

Also, the distance between the wiring line 106-1-1 and a wiring line 106-2-1 adjacent to the wiring line 106-1-1 in a longitudinal direction is a distance d4, for example. In this manner, the distance between the wiring lines 106 arranged in the longitudinal direction are set at the distance d4, and are arranged at regular intervals.

The distance d3 and the distance d4 may be either the same distances or different distances. In the description below, the distance d3 and the distance d4 are the same.

Since the wiring lines 106-1-1 through 106-8-1 shown in FIG. 9 are linearly arranged in a right obliquely downward direction, for example, the wiring line 106-2-1 is disposed at a position shifted rightward from the wiring line 106-1-1.

Also, the wiring line 106-1-2 disposed adjacent to the wiring line 106-1-1 in the lateral direction is disposed at a position shifted upward with respect to the wiring line 106-1-1. In this manner, the wiring lines 106 are disposed at positions shifted in the longitudinal direction or the lateral direction, and are arranged in a pattern in which the wiring lines 106 are periodically arranged at predetermined intervals.

However, the patterns of the wiring lines 106 arranged in the pixels 100 are designed to differ from one pixel 100 to another.

The periods of the wiring lines 106 and the periods of the pixels 100 are designed to be indivisible by each other even if the wiring lines 106 are periodically arranged. Thus, the patterns of the positions of the wiring lines 106 can be made to differ from one pixel 100 to another (become irregular).

FIG. 9 also shows an example in which the wiring lines 106 are not disposed in wiring portions 141 in the same layer. The wiring portions 141 in the same layer are FD wiring lines 131, for example. Rules are made so that the periodically arranged wiring lines 106 are not disposed in the wiring portions 141 in the same layer, as exceptions. Thus, the patterns of the positions of the wiring lines 106 can be made to differ from one pixel 100 to another (become irregular).

As described above with reference to FIG. 7, it is also possible to provide the wiring lines 106 to keep the FD wiring capacitances constant. For example, to keep the FD capacitances constant, a wiring line 151-1 is disposed in the pixel 100-6, and a wiring line 151-2 is disposed in the pixel 100-8.

As described above, rules are made so that the wiring lines 151 for keeping constant FD wiring capacitances are provided as an exception where necessary, even if the wiring lines 106 are periodically arranged. Thus, the patterns of the positions of the wiring lines 106 can be made to differ from one pixel 100 to another (become irregular).

It should be noted that, in some pattern, the wiring lines 106 may also be disposed in the wiring portions 141 in the same layer. It is also possible to adopt a pattern in which the wiring lines 151 are not provided. That is, only patterns in which the wiring lines 106 are arranged in oblique directions may be used.

As described above, the wiring lines 106 may be arranged in a pattern in which the cell pitch and the array direction of the wiring lines 106 are shifted from the pixels. Further, a pattern for capacitance adjustment (the wiring lines 151) may be added.

For example, the pitch of the wiring lines 106 is set at ⅔ of the size of the pixel cells or smaller. Further, the least common multiple of the pitch of the wiring lines 106 and the pixel pitch is set at a value three times or more larger than the pixel pitch.

Figure 10:
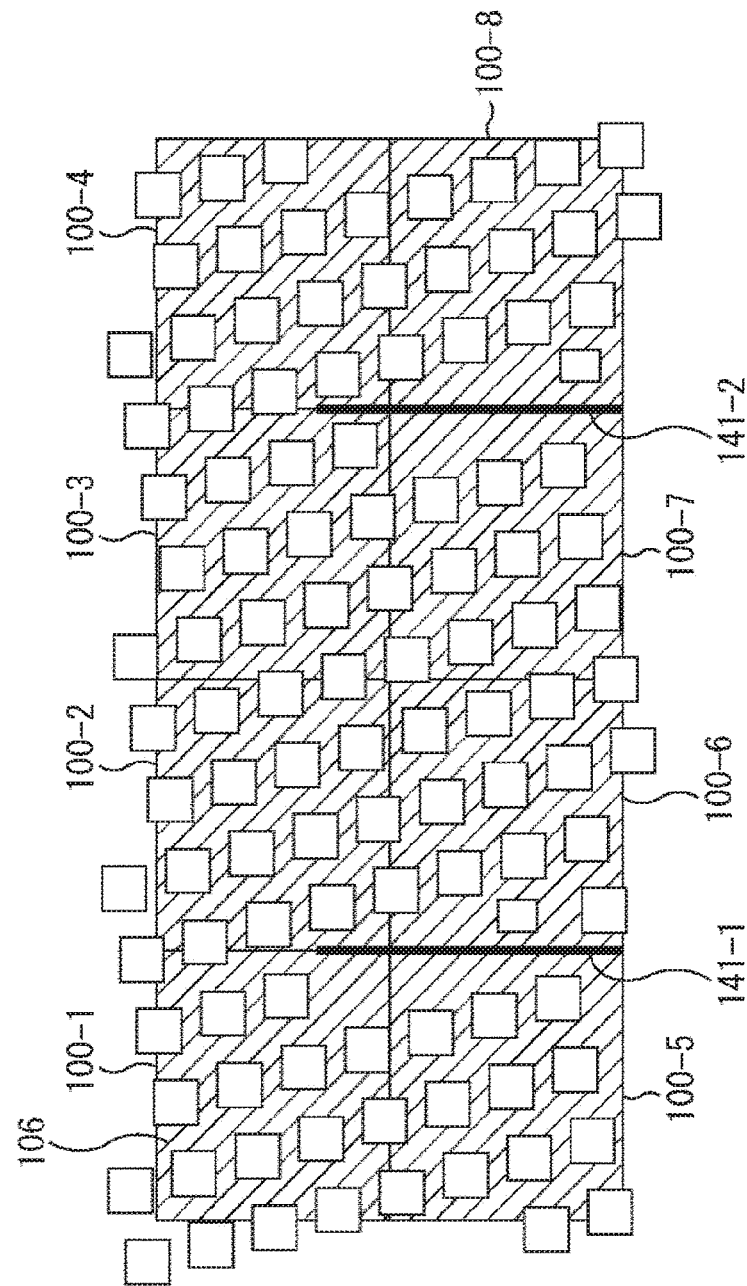
FIG. 10 is a diagram for explaining a wiring pattern.

Alternatively, as shown in FIG. 10, the portions in which the wiring lines 106 shown in FIG. 9 are disposed and the portions in which the wiring lines 106 are not disposed may be reversed. In FIG. 10, the wiring lines 106 have a shape from which quadrangular portions are cut out, and are joined to one another.

In a case where the wiring lines 106 are arranged as shown in FIG. 10, the patterns of the positions of the wiring lines 106 can be made differ from one pixel 100 to another (become irregular).

Not all the periodically arranged wiring lines 106 shown in FIG. 9 or 10 are necessarily used as wiring lines, but the periodically arranged wiring lines 106 may include wiring lines not to be used (dummy wiring lines). Dummy wiring lines may be periodically arranged so that the period of the dummy wiring lines and the period of the pixels 100 are indivisible by each other, and the wiring patterns of the dummy wiring pattern become irregular among the pixels 100.

FIGS. 8 through 10 show examples in which wiring lines 106 of the same shape are arranged in predetermined patterns. However, wiring lines 106 of different shapes may be arranged in respective predetermined patterns. An example of such a layout is shown in FIG. 11.

Figure 11:
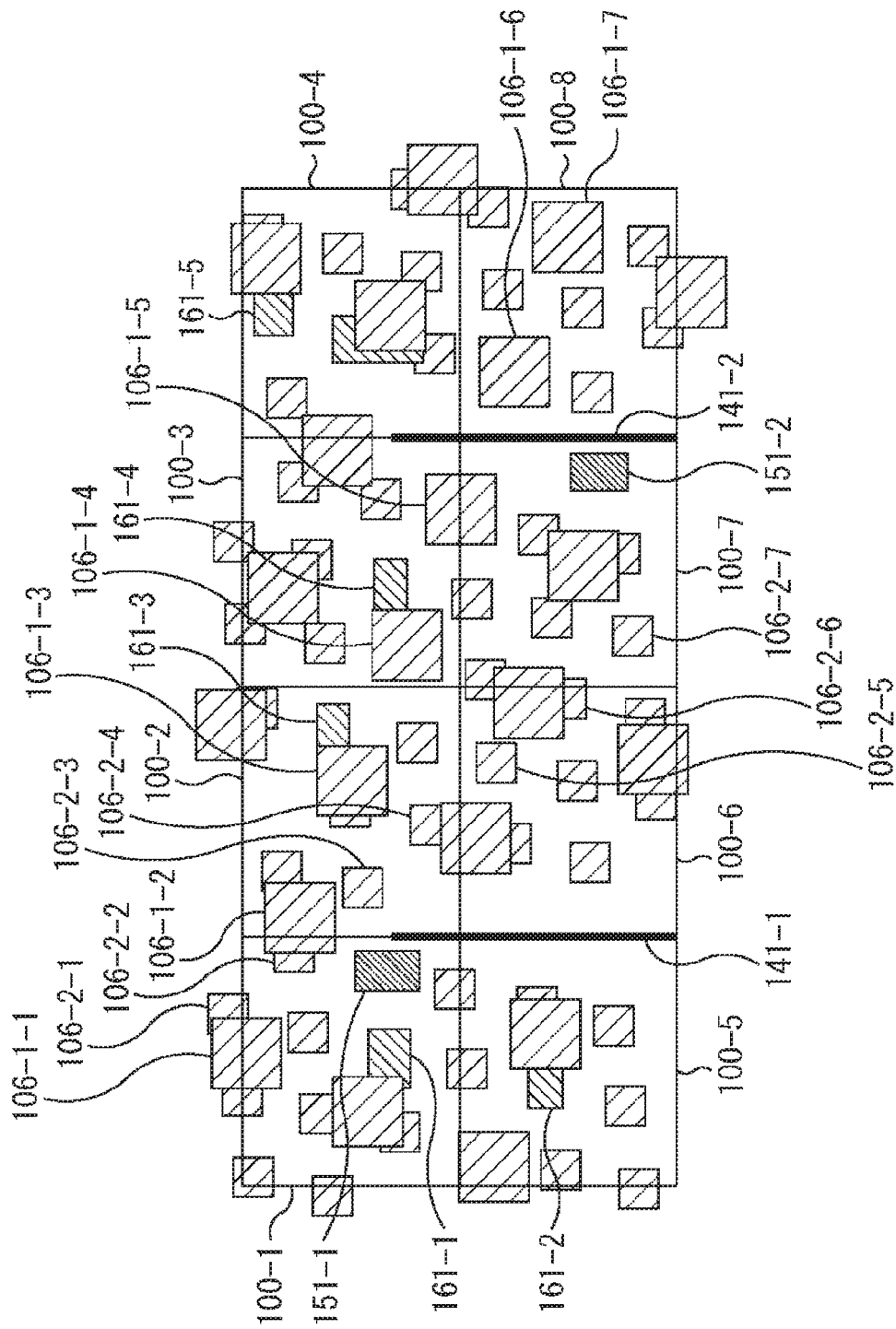
FIG. 11 is a diagram for explaining a wiring pattern.

The wiring lines 106 shown in FIG. 11 are large quadrangular wiring lines 106-1 and small quadrangular wiring lines 106-2 that are arranged in respective predetermined patterns.

Large quadrangular wiring lines 106-1-1 through 106-1-7 are linearly arranged in a right obliquely downward direction. Likewise, small quadrangular wiring lines 106-2-1 through 106-2-7 are also linearly arranged in a right obliquely downward direction.

Like the wiring lines 106 shown in FIG. 9, the large quadrangular wiring lines 106-1 and the small quadrangular wiring lines 106-2 are linearly arranged in the respective right obliquely downward directions. Patterns relating to the layouts of the large quadrangular wiring lines 106-1 and the small quadrangular wiring lines 106-2 may be either the same patterns or different patterns. For example, one of the patterns may be a pattern in which the wiring lines are arranged in a right obliquely downward direction, and the other one may be a pattern in which the wiring lines are arranged at predetermined intervals in a lateral direction (or in a longitudinal direction) (this pattern is shown in FIG. 8).

It should be noted that, although quadrangular shapes of different sizes have been described as examples of the shapes of wiring lines 106, some other shapes may also be adopted. Further, the wiring lines 106 may have different shapes. For example, some of the wiring lines 106 have a quadrangular shape, and the other have a different shape such as a circular shape. Further, in the above description, two types of shapes are arranged in respective predetermined patterns. However, the shapes are not limited to two types, and may be a plurality of shapes such as three types of shapes.

As described above, in a case where the wiring lines 106 of different shapes are arranged in respective predetermined patterns, the patterns of the wiring lines 106 disposed in the pixels 100 are designed to differ from one pixel 100 to another. Thus, the patterns of the positions of the wiring lines 106 can be made to differ from one pixel 100 to another (become irregular).

In the patterns of the wiring lines 106 shown in FIG. 11, the wiring lines 106 are not disposed in the wiring portions 141 in the same layer, as in the patterns of the wiring lines 106 shown in FIG. 9. Rules are made so that the periodically arranged wiring lines 106 are not disposed in the wiring portions 141 in the same layer, as exceptions. Thus, the patterns of the positions of the wiring lines 106 can be made to differ from one pixel 100 to another (become irregular).

As described above with reference to FIG. 7, it is also possible to provide the wiring lines 106 to keep the FD wiring capacitances constant. For example, to keep the FD capacitances constant, a wiring line 151-1 is disposed in the pixel 100-1, and a wiring line 151-2 is disposed in the pixel 100-7.

As described above, rules are made so that the wiring lines 151 for keeping constant FD wiring capacitances are provided as an exception where necessary, even if the wiring lines 106 are periodically arranged. Thus, the patterns of the positions of the wiring lines 106 can be made to differ from one pixel 100 to another (become irregular).

Further, in the patterns of the wiring lines 106 shown in FIG. 11, as a result of the arrangement of the large quadrangular wiring lines 106-1 and the small quadrangular wiring lines 106-2 in the respective predetermined patterns, minute gaps might be formed between the large quadrangular wiring lines 106-1 and the small quadrangular wiring lines 106-2, for example.

Where such minute gaps are formed, the large quadrangular wiring lines 106-1 or the small quadrangular wiring lines 106-2 are deformed, to fill the gaps and connect the wiring lines 106-1 to the wiring lines 106-2. In FIG. 11, such wiring lines are shown as wiring lines 161-1 through 161-6.

In this manner, it is possible to arrange the wiring lines 106 of different shapes in predetermined patterns, and add the wiring lines 161 formed by deforming wiring lines 106 of a predetermined shape. As described above, rules are made so that the deformed wiring lines 161 are provided as an exception where necessary, even if the wiring lines 106 are periodically arranged. Thus, the patterns of the positions of the wiring lines 106 can be made to differ from one pixel 100 to another (become irregular).

It should be noted that, in some pattern, the wiring lines 106 may also be disposed in the wiring portions 141 in the same layer. It is also possible to adopt a pattern in which the wiring lines 151 are not provided. Further, it is also possible to adopt a pattern in which the deformed wiring lines 161 are not provided. That is, only patterns (predetermined patterns) in which the wiring lines 106 of different shapes are arranged in oblique directions may be used.

As in the layout patterns of the wiring lines 106 shown in FIG. 9, the respective pitches of the wiring lines 106 are set at values that are equal to or smaller than ⅔ of the size of the pixel cells. Further, the least common multiple of each pitch of the wiring lines 106 and the pixel pitch is set at a value three times or more larger than the pixel pitch.

Further, although not shown in any drawing, the portions in which the wiring lines 106 shown in FIG. 1 are disposed and the portions in which the wiring lines 106 are not disposed may be reversed. In such a case, the wiring lines 106 have a shape from which quadrangular portions are cut out, and are joined to one another.

Not all the periodically arranged wiring lines 106 shown in FIG. 11 are necessarily used as wiring lines, but the periodically arranged wiring lines 106 may include wiring lines not to be used (dummy wiring lines). Dummy wiring lines may be periodically arranged so that the period of the dummy wiring lines and the period of the pixels 100 are indivisible by each other, and the wiring patterns of the dummy wiring pattern become irregular among the pixels 100.

Figure 12:
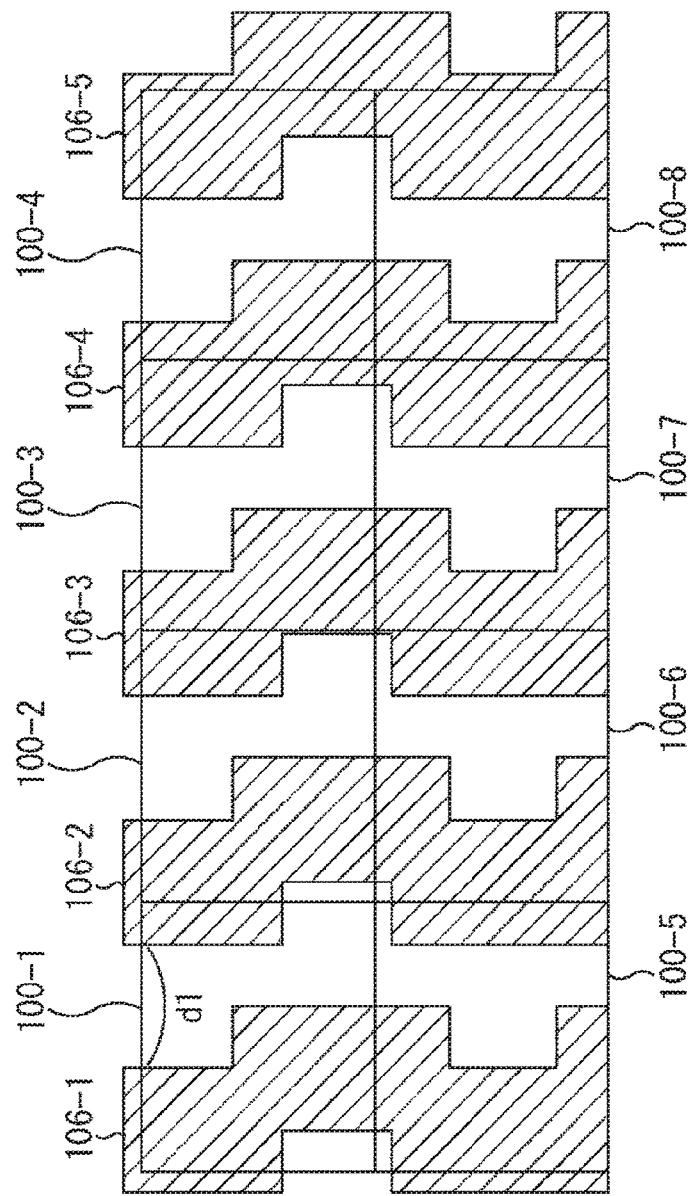
FIG. 12 is a diagram for explaining a wiring pattern.

Although the above described wiring lines 106 have a quadrangular shape, for example, and the respective wiring lines 106 are disposed at positions separated from one another, each wiring line 106 may be in a continuous form as shown in FIG. 12.

Referring to FIG. 12, each wiring line 106 is a single wiring line having bends. FIG. 12 shows five wiring lines 106-1 through 106-5, and these wiring lines 106-1 through 106-5 have the same shape. Each of the wiring lines 106-1 through 106-5 does not have a linear shape, but has a shape with bends formed at predetermined portions.

In addition, the wiring lines 106 having bends are periodically arranged at predetermined intervals d1. That is, the layout of the wiring lines 106 shown in FIG. 12 is a pattern in which the wiring lines 106 are periodically arranged at intervals of a distance d1. However, the patterns of the wiring lines 106 arranged in the pixels 100 are designed to differ from one pixel 100 to another.

For example, as can be seen from a comparison between the upper left side in the pixel 100-1 and the upper left side in the pixel 100-4, a large portion of the wiring line 106-1 is included at the upper left side in the pixel 100-1, but only a small portion of the wiring line 106-4 is included at the upper left side in the pixel 100-4. Also, for example, as can be seen from a comparison between the lower right side in the pixel 100-1 and the lower right side in the pixel 100-4, any wiring line 106 is not formed at the lower right side in the pixel 100-1, but the wiring line 106-5 is formed at the lower right side in the pixel 100-4.

As described above, although the wiring lines 106 are periodically arranged, the bending periods of the wiring lines 106 and the periods of the pixels 100 are designed to be indivisible by each other. Thus, the patterns of the positions of the wiring lines 106 in the respective pixels 100 can be made irregular.

As such patterns of the wiring lines 106 are adopted, the patterns of the positions of the wiring lines 106 in the respective pixels 100 can also be made irregular. Thus, luminance unevenness can be reduced. Not all the wiring lines 106 are necessarily used as wiring lines, but the wiring lines 106 may include wiring lines not to be used (dummy wiring lines). The wiring lines 106 including the dummy wiring lines may be arranged so that the layout patterns of the wiring lines 106 do not have any periodicity.

It should be noted that the shape of the wiring lines 106 may be a linear shape having bends shown in FIG. 12, but may be a curved shape such as a corrugated shape, or a shape with varying thickness or the like, for example.

Figure 13:
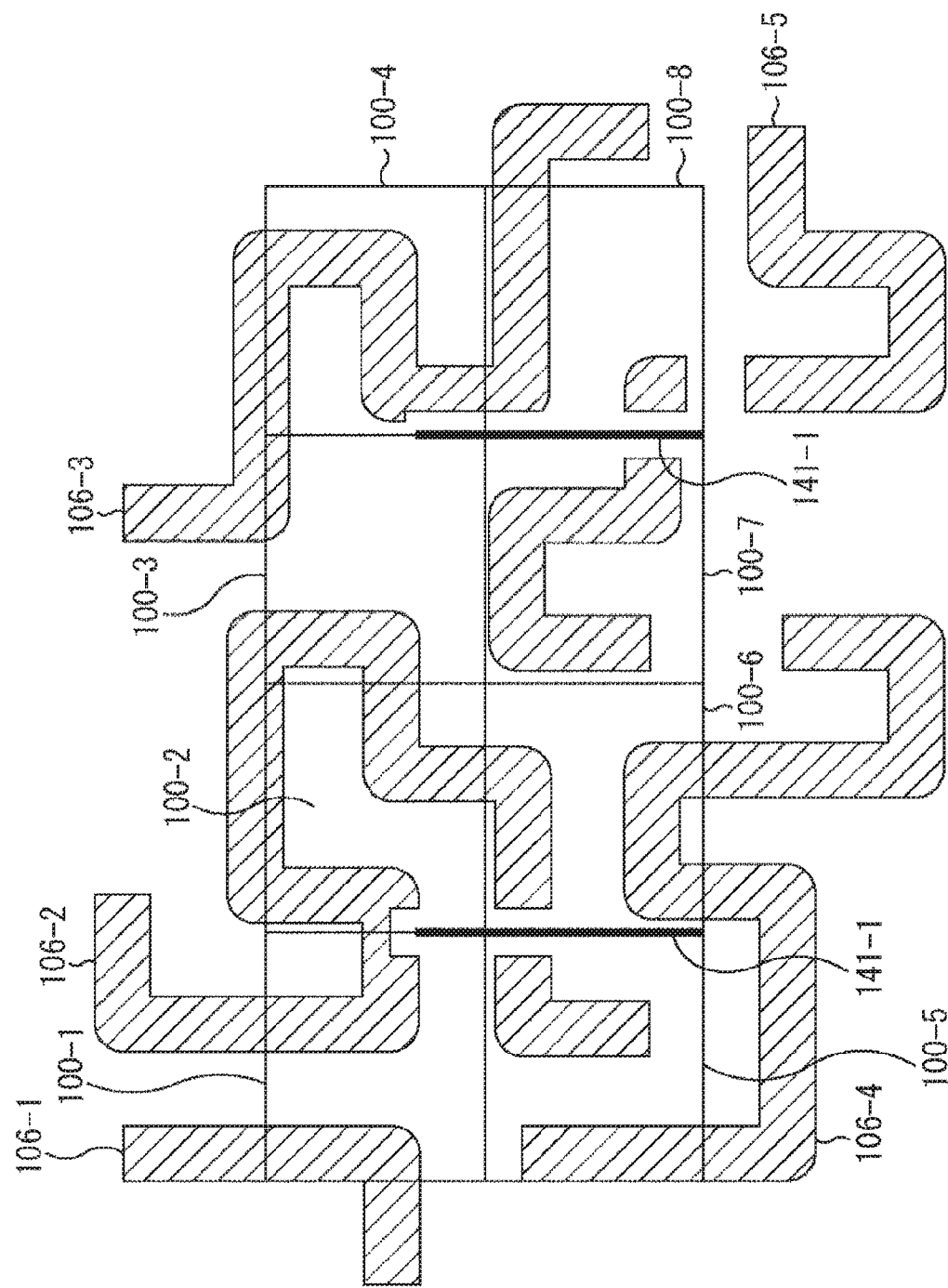
FIG. 13 is a diagram for explaining a wiring pattern.

Although the patterns shown in FIG. 12 having periodicity in the longitudinal direction and the lateral direction, patterns that have no periodicity in the longitudinal direction and the lateral direction may be used as shown in FIG. 13. In the patterns shown in FIG. 13, a wiring line 106-2 and a wiring line 106-3 are adjacent wiring lines 106, but have different shapes, for example. The wiring line 106-2 and a wiring line 106-4 are also adjacent wiring lines 106, but have different shapes, for example.

As for the pattern of the wiring lines 106, the wiring lines 106-1 through 106-5 shown in FIG. 13 form one pattern. In a case where this pattern is referred to as a dummy wiring pattern, the dummy wiring pattern is formed with the wiring lines 106-1 through 106-5. In addition, as shown in FIG. 14, wiring lines 106 are arranged as the dummy wiring pattern is repeated.

Figure 14:
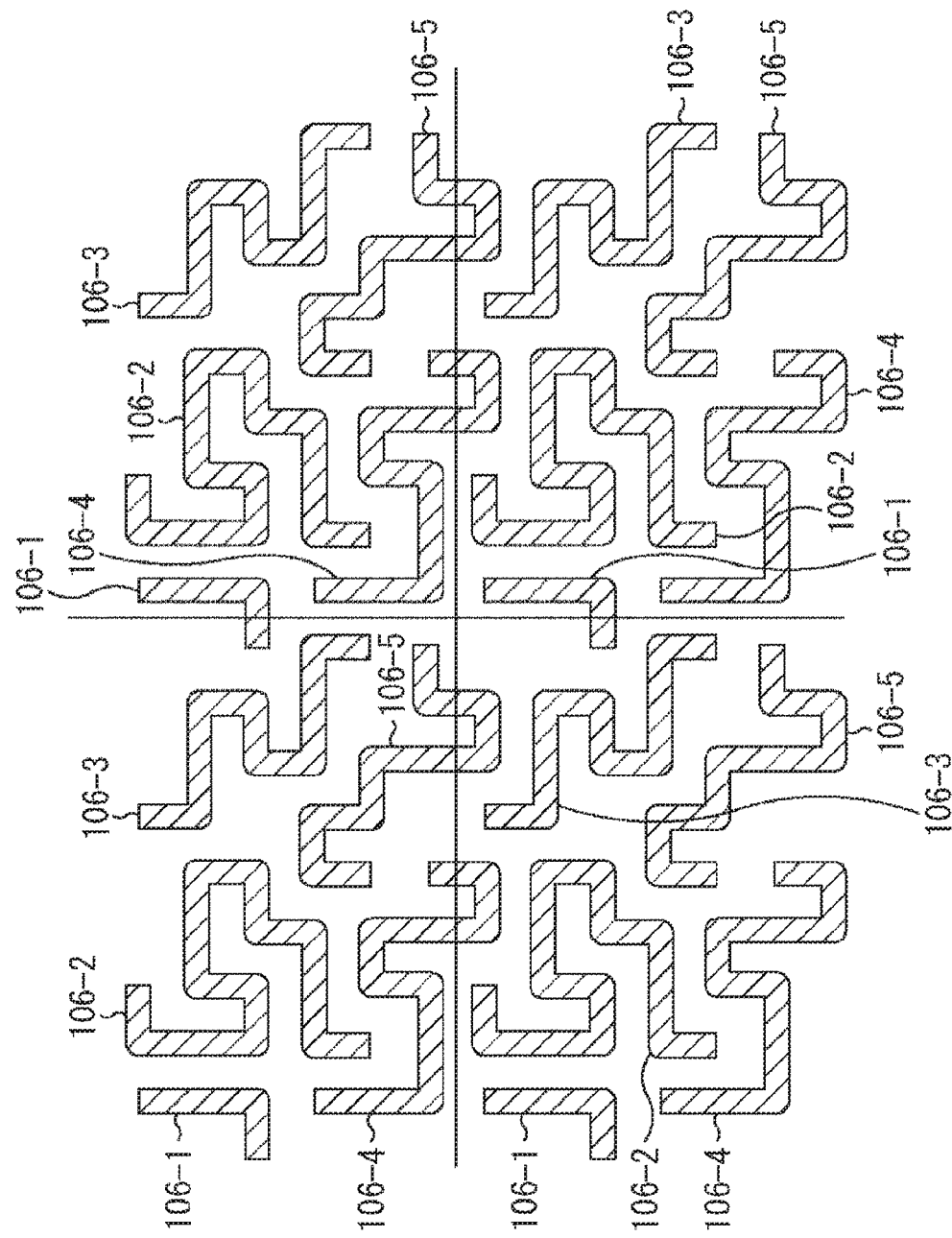
FIG. 14 is a diagram for explaining a wiring pattern.

FIG. 14 shows an example in which the dummy wiring pattern is repeated four times, and wiring lines 106 are formed in longitudinal and lateral directions. The dummy wiring patterns are designed to have a larger size than the pixel pitch, such as a size two or more times larger than the pixel pitch, for example. Further, the thickness of each wiring line 106 in the dummy wiring patterns is formed to have a thickness equal to or smaller than one third of the pixel pitch, for example.

Meanwhile, the boundary portions of the dummy wiring patterns are formed so as not to become the rectangles of the repetition pitch, and each pattern has a protruding portion toward an adjacent side. For example, the wiring line 106-1 is formed in a shape that partially protrudes toward an adjacent dummy wiring pattern at a boundary portion.

Further, in a case where the wiring lines 106 overlap the wiring portions 141 in the same layer as shown in FIG. 13, the wiring lines 106 are formed, with the overlapping portions eliminated. For example, since the wiring line 106-2 has a portion overlapping the wiring portion 141-1 in the same layer, the portion is eliminated from the wiring line 106-2.

As such patterns of the wiring lines 106 are adopted, the patterns of the positions of the wiring lines 106 in the respective pixels 100 can also be made irregular. Thus, luminance unevenness can be reduced. Not all the wiring lines 106 are necessarily used as wiring lines, but the wiring lines 106 may include wiring lines not to be used (dummy wiring lines). The wiring lines 106 including the dummy wiring lines may be arranged so that the layout patterns of the wiring lines 106 do not have any periodicity.

It should be noted that the shape of the wiring lines 106 may be a linear shape having bends shown in FIG. 13, but may be a curved shape such as a corrugated shape, or a shape with varying thickness or the like, for example.

<Regarding Irregular Layouts Using Periodic and Three-Dimensional Patterns>

In the example cases in the above described embodiment, the wiring lines 106 are formed in a single layer. However, the wiring lines 106 may be formed in a plurality of layers, such as two layers or three layers.

Figure 15:
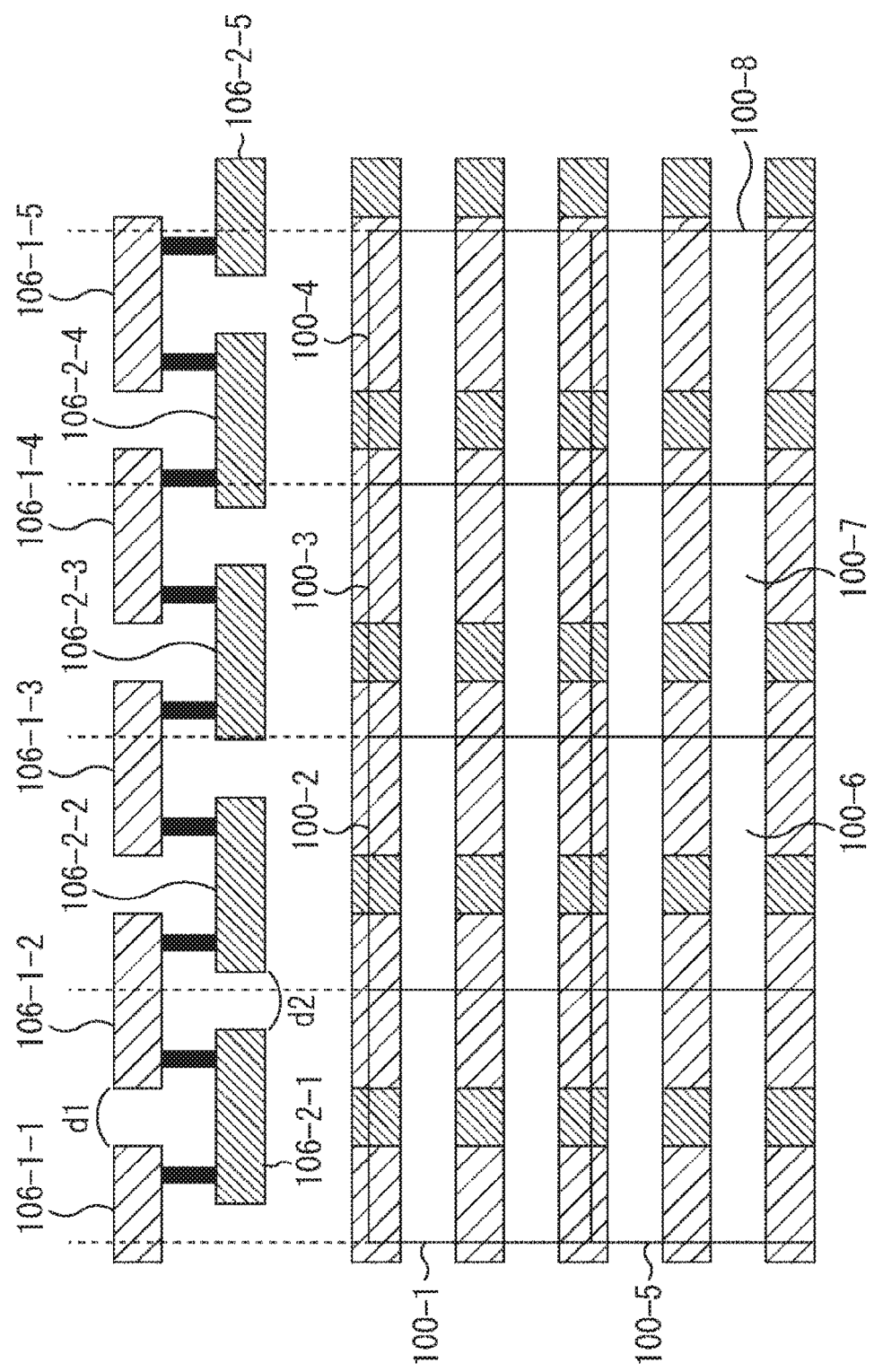
FIG. 15 is a diagram for explaining a wiring pattern.

Referring now to FIG. 15, an irregular layout of wiring lines 106 using periodic and three-dimensional patterns is described. In the example shown in FIG. 15, as shown in the upper portion of FIG. 15, the wiring lines 106 are formed in two layers. Wiring lines 106-1-1 through 106-1-6 are formed in a first layer, and wiring lines 106-2-1 through 106-2-6 are formed in a second layer. The wiring lines 106-1 of the first layer and the wiring lines 106-2 of the second layer are connected.

The wiring lines 106-1-1 through 106-1-6 of the first layer are formed at intervals of a distance d1. The wiring lines 106-2-1 through 106-2-6 of the second layer are formed at intervals of a distance d2. The distance d1 and the distance d2 may be either the same or different.

In this manner, the wiring lines 106-1-1 through 106-1-6 of the first layer and the wiring lines 106-2-1 through 106-2-6 of the second layer are wiring lines 106 that are periodically formed at respective predetermined intervals.

The lower portion of FIG. 15 shows a plan view of the pixels 100 including the wiring lines 106 formed as above. The distance between the wiring lines 106 disposed in the same layer are set at the distance d1 (d2), and are arranged at regular intervals. However, the patterns of the wiring lines 106 arranged in the pixels 100 are designed to differ from one pixel 100 to another.

For example, a pixel 100-1 and a pixel 100-4 are described herein. When the pixel 100-1 is viewed from above (the incident surface side), the wiring line 106-2-1 of the second layer is located between the wiring line 106-1 and the wiring line 106-2 of the first layer at the central portion in the pixel 100-1. Likewise, when the pixel 100-4 is viewed from above (the incident surface side), there is the wiring line 106-5 of the first layer at the central portion in the pixel 100-4.

As described above, the wiring line 106 formed at the central portion of the pixel 100-1 is different from the wiring line 106 formed at the central portion of the pixel 100-4. That is, the pattern of the wiring lines 106 formed in the pixel 100-1 and the pattern of the wiring lines 106 formed in the pixel 100-4 are different patterns. The patterns of the wiring lines 106 in the other pixels 100 are also different patterns.

As described above, the periods of the wiring lines 106 and the periods of the pixels 100 are designed to be indivisible by each other even if the wiring lines 106 are periodically arranged alternately in the upper and lower layers. Thus, the proportions of the wiring lines 106 in each layer can be made to differ from one pixel 100 to another (become irregular). Accordingly, luminance unevenness can be reduced.

Not all the wiring lines 106 are necessarily used as wiring lines, but the wiring lines 106 may include wiring lines not to be used (dummy wiring lines). The wiring lines 106 including the dummy wiring lines may be arranged so that the layout patterns of the wiring lines 106 do not have any periodicity.

It should be noted that, in the above described example, the wiring lines are formed alternately in two (upper and lower) layers. However, the present technology can be applied to wiring lines that are disposed not in two layers but in a plurality of layers, such as three layers or four layers.

It should be noted that the wiring lines 106 described above with reference to FIGS. 8 through 10 can also be formed so that the FD wiring capacitances described above with reference to FIG. 7 become constant. Further, in a case where the wiring lines 106 are formed in a plurality of layers as shown in FIG. 15, the FD wiring capacitances for the wiring lines 106 arranged in the layers closer to the FD wiring lines can be made constant.

Embodiment in which Air Gaps are Provided

In the above described embodiment, the layout patterns of the wiring lines 106 are made to differ from one pixel 100 to another, so that luminance unevenness is reduced. Next, luminance unevenness reduction with air gaps formed in the wiring layer 105 is described.

Figure 16:
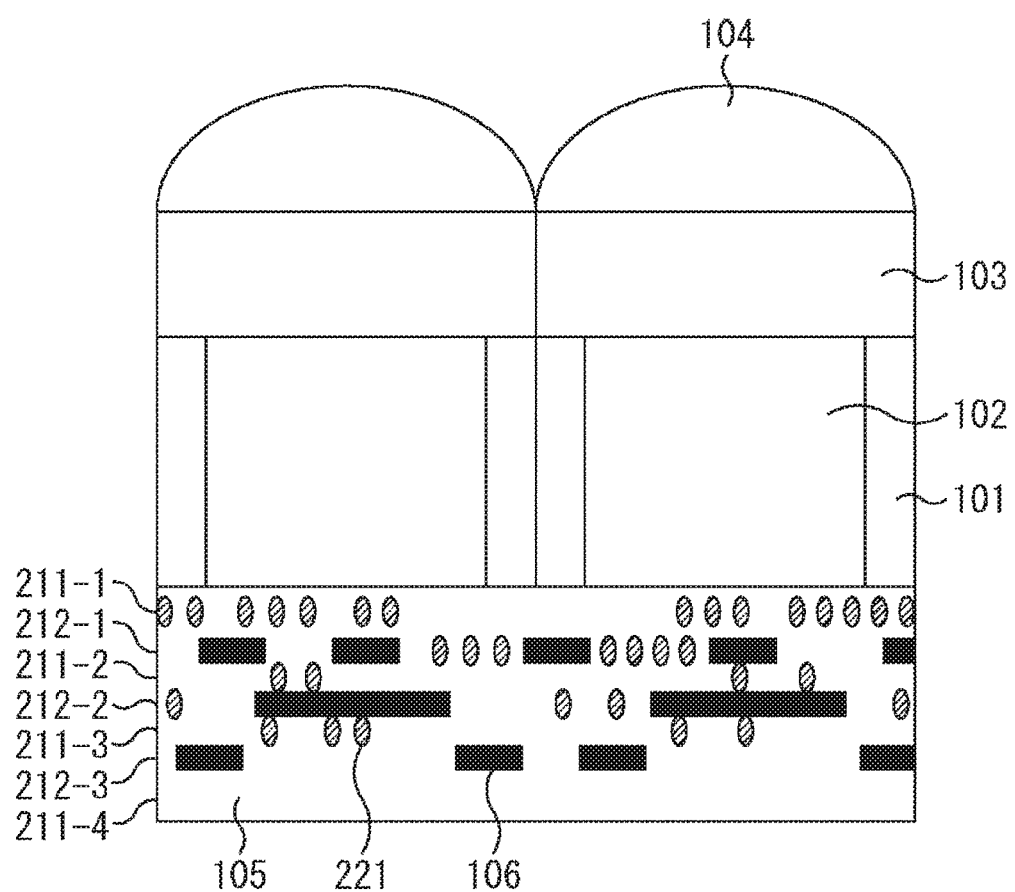
FIG. 16 is a diagram for explaining an air gap pattern.

FIG. 16 shows pixel structures having a wiring layer 105 in which air gaps are formed. The wiring layer 105 shown in FIG. 16 is formed with layers in which wiring lines 106 are formed, and layers in which no wiring lines 106 are formed. Here, the layers in which wiring lines 106 are formed are referred to as the wiring formation layers 212, and the layers (layers in which no wiring lines 106 are formed) between the wiring formation layers 212 are referred to as the wiring formation interlayers 211.

In the example shown in FIG. 16, in the wiring layer 105, a wiring formation interlayer 211-1, a wiring formation layer 212-1, a wiring formation interlayer 211-2, a wiring formation layer 212-2, a wiring formation interlayer 211-3, a wiring formation layer 212-3, and a wiring formation interlayer 211-4 are stacked in this order from the side closer to photodiodes 102.

In the drawing, the circular portions are air gaps 221. The positions at which the air gaps 221 are formed, and the like are described below. It should be noted that, in a case where the wiring layer 105 has the air gaps 221, the wiring lines 106 formed in the wiring layer 105 may be arranged in predetermined patterns (with periodicity), or may be arranged irregularly as described above.

As the air gaps 221 are formed in the wiring layer 105, the light that is reflected by the wiring lines 106 and reenters the photodiodes 102 can have different optical path lengths between the portions with the air gaps 221 and the portions without the air gaps 221. If the wiring lines 106 are periodically arranged, the reflected light has periodicity, and luminance unevenness might be caused. However, with the air gaps 221, the reflected light passing through the air gaps 221, and the reflected light not passing through the air gaps 221 can have different optical path lengths. Thus, reflected light can be prevented from having periodicity.

That is, as the air gaps 221 are formed in the wiring layer 105, the dielectric constants in the wiring layer 105 can be prevented from having periodicity. Where dielectric constants vary, the optical path lengths also vary. Accordingly, even if the wiring lines 106 are periodically arranged, the optical interference to be caused by the wiring lines 106 can be reduced. Thus, luminance unevenness can be reduced.

The description of examples in which the air gaps 221 are formed is continued herein. However, gaps may be formed with a material other than air, as long as the wiring layer 105 can be formed so that the dielectric constants in the wiring layer 105 do not have periodicity.

For example, gaps equivalent to the air gaps 221 may be formed with insulators (insulators having different dielectric constants) that are different from the insulators forming (the portions other than the wiring lines 106 in) the wiring layer 105. Further, gaps equivalent to the air gaps 221 can be formed with conductors, such as semiconductors.

Figure 17:
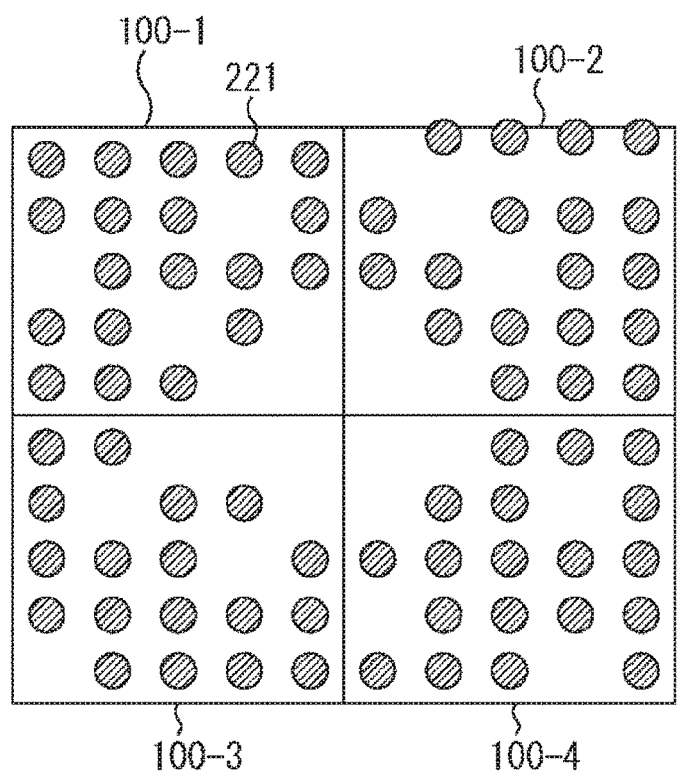
FIG. 17 is a diagram for explaining an air gap pattern.

As shown in FIG. 16, the air gaps 221 are formed in the wiring layer 105, and are formed at positions that satisfy conditions as described later. Further, as shown in FIG. 17, when the pixels 100 are viewed from above, and in a case where the air gaps 221 have a circular shape, the air gaps 221 are formed in a predetermined plane (layer) in the wiring layer 105, and are formed at positions that satisfy the conditions as described later.

In the example shown in FIG. 16, the air gaps 221 are formed in the wiring formation interlayers 211-1 through 211-3. The air gaps 221 are also formed in the wiring formation layers 212-1 and 212-2.

The air gaps 221 are formed so as not to have periodicity. For example, the air gaps 221 formed in the pixel 100-1 have a different pattern from the air gaps 221 formed in the pixel 100-2. As for the pattern that forms the air gaps 221, any of the patterns of the positions of the wiring lines 106 described above with reference to FIGS. 2 through 10 (except for FIG. 7) can be adopted.

That is, as described above with reference to FIG. 2, the positions of the air gaps 221 should be positions that are not in the same patterns when compared in the pixels 100. That is, the air gaps 221 are formed so that the positions of the air gaps 221 become irregular.

Also, as described above with reference to FIG. 3, the sizes of the air gaps 221 should be sizes that are not in the same patterns when compared in the pixels 100. That is, the air gaps 221 are formed so that the sizes of the air gaps 221 become irregular.

Also, as described above with reference to FIG. 4, the positions and the sizes of the air gaps 221 should be positions and sizes that are not in the same patterns when compared in the pixels 100. That is, the air gaps 221 are formed so that the positions and the sizes of the air gaps 221 become irregular.

Also, as described above with reference to FIG. 5, the rotation angles of the air gaps 221 should be rotation angles that are not in the same patterns when compared in the pixels 100. That is, the air gaps 221 are formed so that the rotation angles of the air gaps 221 become irregular.

Also, as described above with reference to FIG. 6, the shapes of the air gaps 221 should be shapes that are not in the same patterns when compared in the pixels 100. That is, the air gaps 221 are formed so that the shapes of the air gaps 221 become irregular.

Also, as described above with reference to FIG. 8, the positions (intervals) and the shapes of the air gaps 221 are in predetermined patterns, but should be positions and shapes that are not in the same patterns when compared in the pixels 100. That is, although the air gaps 221 have positions and shapes in predetermined patterns, the air gaps 221 are formed so that the positions and shapes in which the air gaps 221 are formed become irregular when compared in the pixels 100.

Figure 18:
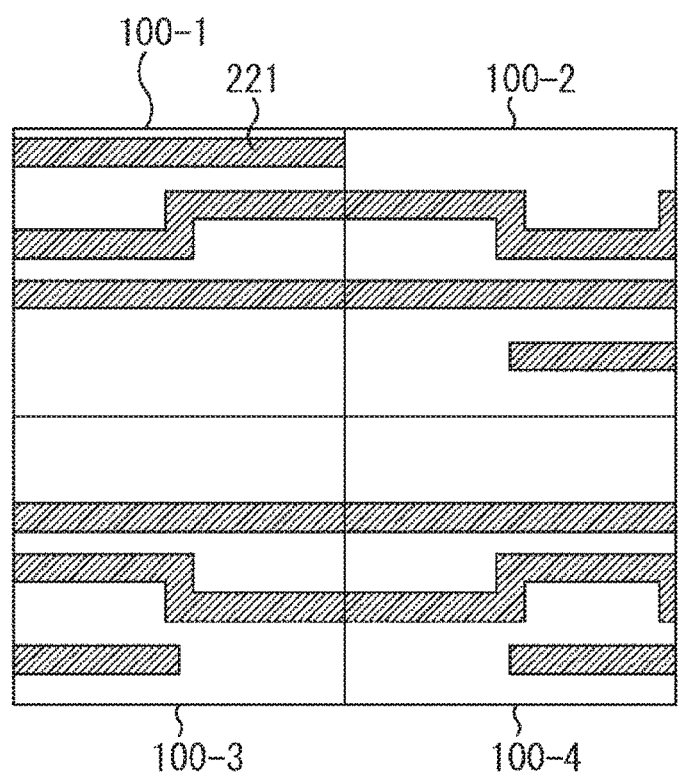
FIG. 18 is a diagram for explaining an air gap pattern.

Also, the air gaps 221 may be formed in line shapes as shown in FIG. 18, and may be formed in shapes that span a plurality of pixels 100. In this case, as described above with reference to FIG. 12, the positions and the shapes of the air gaps 221 are in predetermined patterns, but should be positions and shapes that are not in the same patterns when compared in the pixels 100. That is, although the air gaps 221 have shapes in predetermined patterns and are arranged at predetermined intervals, the air gaps 221 are formed so that the shapes and the positions in which the air gaps 221 are formed become irregular when compared in the pixels 100.

Further, the air gaps 221 shown in FIG. 18 are formed in linear shapes or linear shapes having bends. In this manner, the air gaps 221 are not formed in a patterned single shape but are formed in a plurality of patterned shapes. The air gaps 221 may be formed so that the patterned air gaps 221 are in different patterns (irregular patterns) when compared in the pixels 100.

Also, in a case where the air gaps 221 are formed in a plurality of layers as shown in FIG. 16, the air gaps 221 formed in the respective layers are in predetermined patterns as described above with reference to FIG. 15. However, the positions and the shapes of the air gaps 221 are not in the same pattern when compared in the pixels 100. That is, although the air gaps 221 have shapes in predetermined patterns, the air gaps 221 are formed so that the shapes and the positions in which the air gaps 221 are formed become irregular in the pixels 100.

The air gaps 221 may be formed in a plurality of layers in the wiring layer 105 as shown in FIG. 16. However, the air gaps 221 may be formed only in the layer closer to the photodiodes 102, as shown in FIG. 19.

Figure 19:
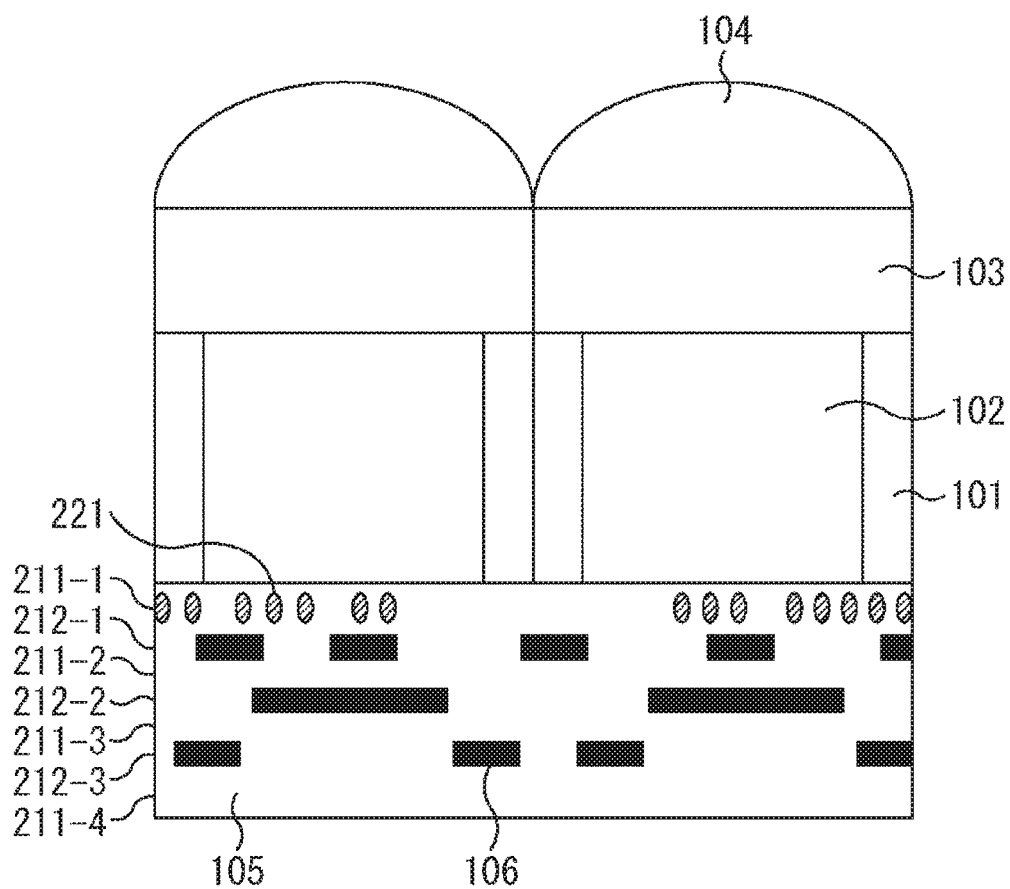
FIG. 19 is a diagram for explaining an air gap pattern.

In the example shown in FIG. 19, the air gaps 221 are formed only in the wiring formation interlayer 211-1. As the light reflected by the wiring lines 106 in the wiring formation layer 212-1 reenters the photodiodes 102, periodic luminance unevenness is caused. To prevent this, the air gaps 221 are formed in the wiring formation interlayer 211-1 located between the wiring formation layer 212-1 and the photodiode 102.

As the air gaps 221 are formed in the wiring formation interlayer 211-1, not only the light reflected by the wiring lines 106 in the wiring formation layer 212-1, but also the light reflected by the wiring lines 106 in the wiring formation layer 212-2 and the light reflected by the wiring lines 106 in the wiring formation layer 212-3 have varying optical path lengths, and periodic luminance unevenness can be prevented.

The air gaps 221 formed in the wiring formation interlayer 211-1 are formed so as not to have the same patterns when compared with the air gaps 221 formed in the pixel 100 as described above.

Figure 20:
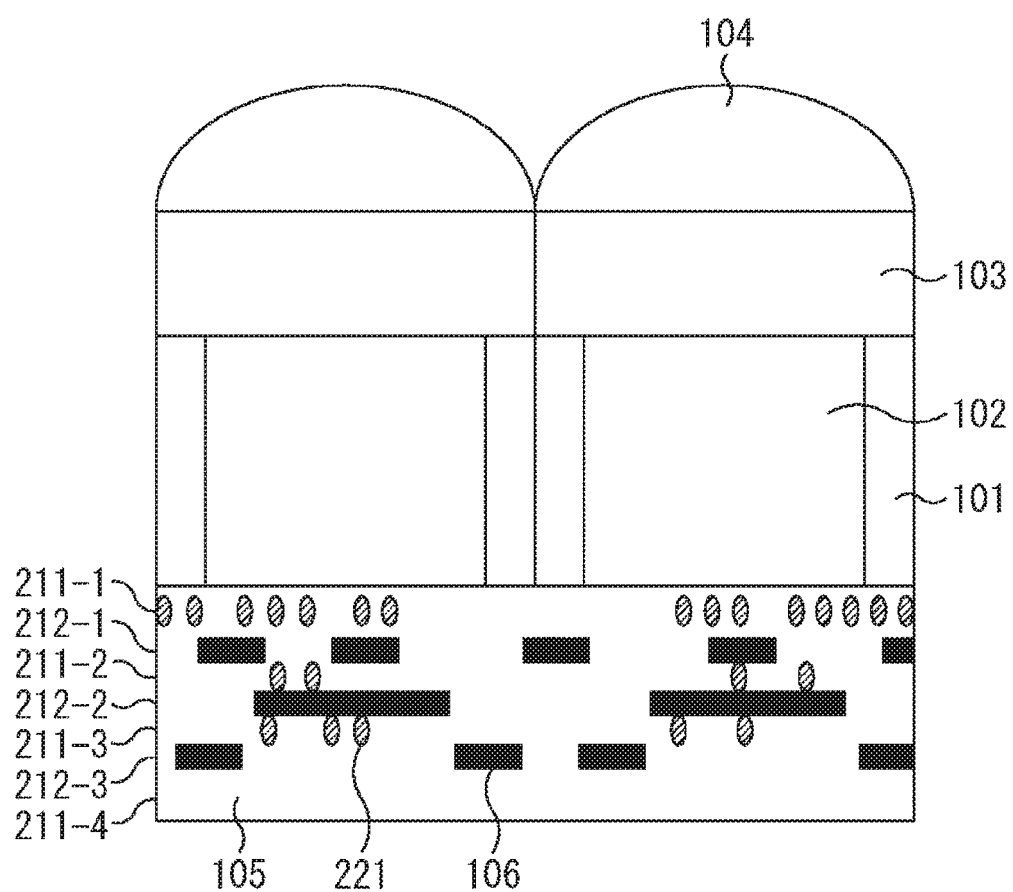
FIG. 20 is a diagram for explaining an air gap pattern.

Further, as shown in FIG. 20, the air gaps 221 may be formed only in the wiring formation interlayers 211. In the example shown in FIG. 20, the air gaps 221 are formed in each of the wiring formation interlayer 211-1, the wiring formation interlayer 211-2, and the wiring formation interlayer 211-3.

In this case, the air gaps 221 formed in the wiring formation interlayer 211-1, the wiring formation interlayer 211-2, and the wiring formation interlayer 211-3 are also formed so as not to have the same patterns when compared with the air gaps 221 formed in the pixel 100 as described above.

Figure 21:
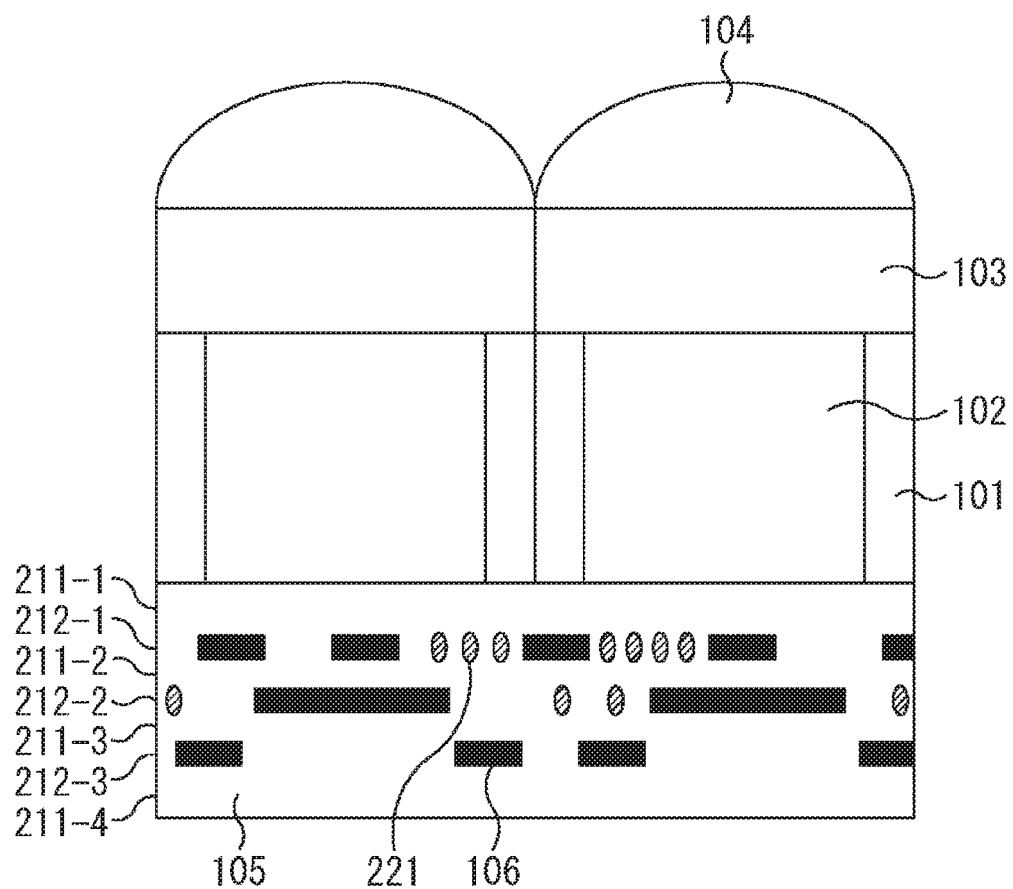
FIG. 21 is a diagram for explaining an air gap pattern.

Alternatively, as shown in FIG. 21, the air gaps 221 may be formed only in the wiring formation layers 212. In the example shown in FIG. 21, the air gaps 221 are formed in each of the wiring formation layer 212-1 and the wiring formation layer 212-2.

In this case, the air gaps 221 formed in the wiring formation layer 212-1 and the wiring formation layer 212-2 are also formed so as not to have the same patterns when compared with the air gaps 221 formed in the pixel 100 as described above.

Figure 22:
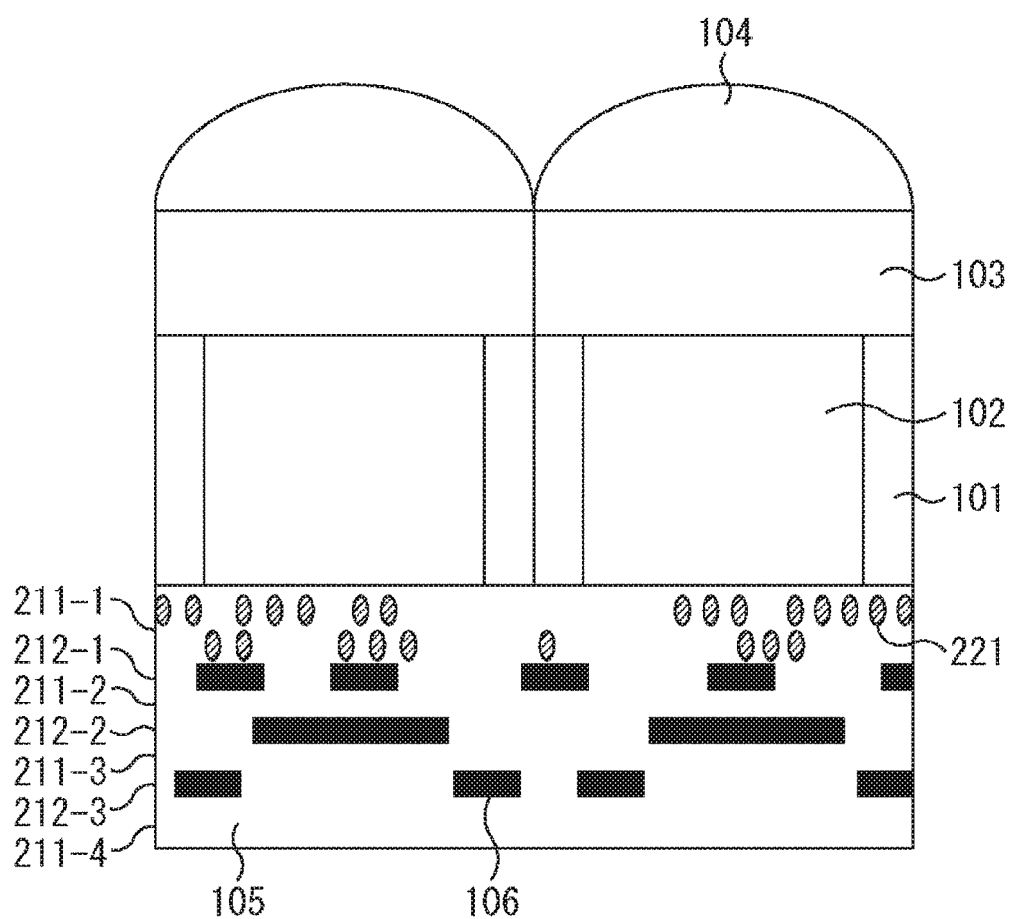
FIG. 22 is a diagram for explaining an air gap pattern.

Further, as shown in FIG. 22, a plurality of layers of air gaps 221 may be formed in the same layer. The pixels 100 shown in FIG. 22 are the same as the pixels 100 shown in FIG. 19 in that the air gaps 221 are formed only in the wiring formation interlayer 211-1 formed on the side closer to the photodiode 102, but differ from the pixels 100 shown in FIG. 19 in that the air gaps 221 are formed in two layers.

In the above described examples of the embodiment, in a case where the air gaps 221 are formed in the wiring formation interlayers 211 or the wiring formation layers 212, the air gaps 221 are formed in one layer. However, the air gaps 221 may be formed in two layers, as shown in FIG. 22. Although FIG. 22 shows an example in which the air gaps 221 are provided only in the wiring formation interlayer 211-1, the air gaps 221 may also be formed in other layers in the wiring layer 105.

Also, in the example shown in FIG. 22, the air gaps 221 are formed in two layers. However, the air gaps 221 may be formed in a plurality of layers, such as three layers or four layers.

In a case where the air gaps 221 are formed as shown in FIG. 22, the air gaps 221 are also formed so as not to have the same patterns when compared with the air gaps 221 formed in the pixel 100 as described above.

Figure 23:
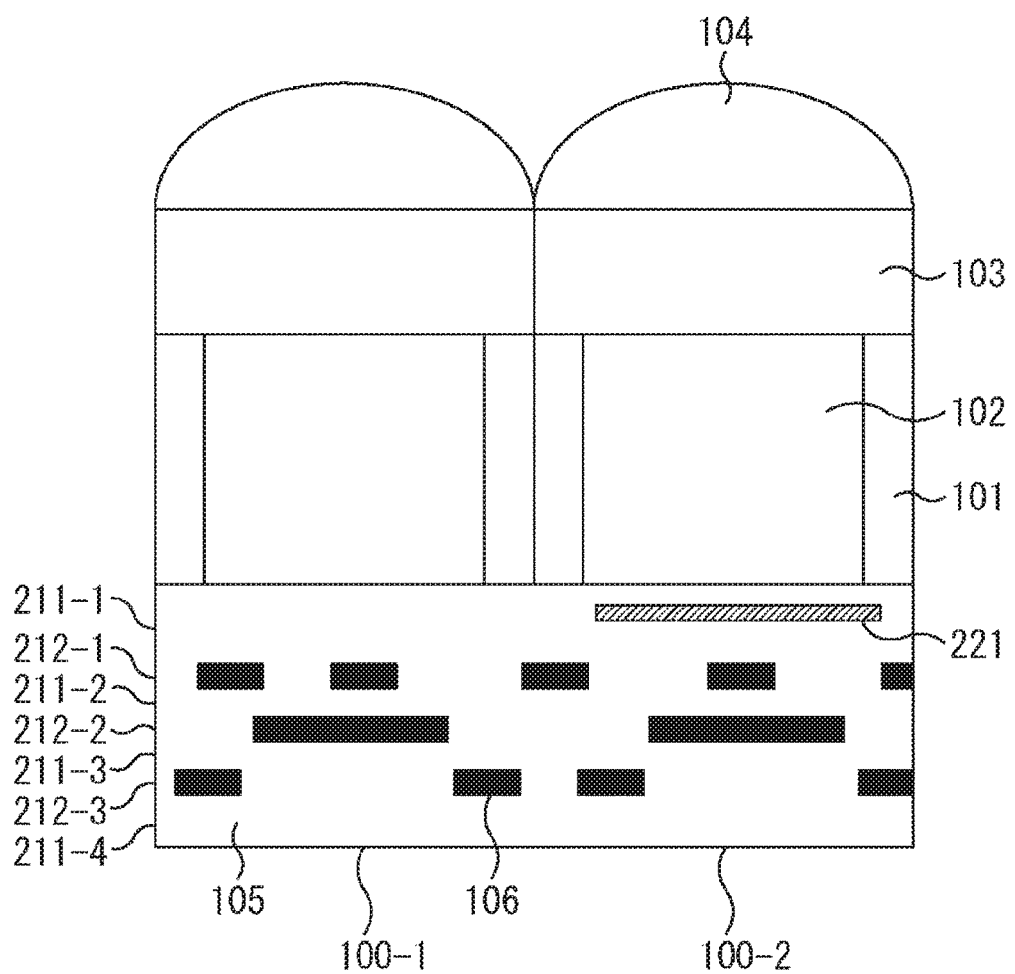
FIG. 23 is a diagram for explaining an air gap pattern.

Further, as shown in FIG. 23, portions with air gaps 221 and portions without air gaps 221 may be formed in the same layer. The pixels 100 shown in FIG. 23 are the same as the pixels 100 shown in FIG. 14 in that the air gaps 221 are formed only in the wiring formation interlayer 211-1 formed on the side closer to the photodiode 102.

The air gap 221 shown in FIG. 23 is formed in a film-like shape. Also, in the example shown in FIG. 23, a film-like air gap 221 is formed in the pixel 100-2, but any air gap 221 is not formed in the pixel 100-1. That is, in the configuration shown in FIG. 23, different film configurations are formed in the respective pixels 100, so that the same patterns are not found when the air gaps 221 formed in the pixels 100 are compared with one another. For example, the wiring formation interlayer 211-1 of the pixel 100-1 has no film, while the wiring formation interlayer 211-1 of the pixel 100-2 has a film, as described above. In this manner, it is possible to adopt a configuration in which film configurations vary.

In a case where the air gaps 221 are formed as shown in FIG. 23, the air gaps 221 are also formed so as not to have the same patterns when compared with the air gaps 221 formed in the pixel 100 as described above.

As shown in FIG. 23, in a case where the air gaps 221 are formed in a film-like shape, the air gaps 221 may be formed with insulators (insulators having different dielectric constants) that are different from the insulators forming (the portions other than the wiring lines 106 in) the wiring layer 105, like the above described air gaps 221. Further, gaps equivalent to the air gaps 221 can be formed with conductors, such as semiconductors.

FIG. 23 shows an example in which one layer of an air gap 221 is formed in the wiring formation interlayer 211-1 of the pixel 100-2. However, a plurality of air gaps 221 may be formed in the same layer. An air gap 221 may also be formed in another wiring formation interlayer 211.

Also, as described above with reference to FIG. 2, the positions of the air gaps 221 should be positions that are not in the same patterns when compared in the pixels 100. For example, in the pixel 100-1, an air gap 221 may be formed on the side closer to the photodiode 102, and in the pixel 100-2, an air gap 221 may be formed on the side closer to the wiring lines 106. In this manner, the air gaps 221 may be formed at different heights in the same wiring formation interlayer 211-1. That is, the air gaps 221 are formed so that the positions of the air gaps 221 become irregular.

Also, as described above with reference to FIG. 3, the sizes of the air gaps 221 should be sizes that are not in the same patterns when compared in the pixels 100. That is, the air gaps 221 are formed so that the sizes of the air gaps 221 become irregular.

Also, as described above with reference to FIG. 4, the positions and the sizes of the air gaps 221 should be positions and sizes that are not in the same patterns when compared in the pixels 100. That is, the air gaps 221 are formed so that the positions and the sizes of the air gaps 221 become irregular.

Also, as described above with reference to FIG. 5, the rotation angles of the air gaps 221 should be rotation angles that are not in the same patterns when compared in the pixels 100. That is, the air gaps 221 are formed so that the rotation angles of the air gaps 221 become irregular.

Also, as described above with reference to FIG. 6, the shapes of the air gaps 221 should be shapes that are not in the same patterns when compared in the pixels 100. That is, the air gaps 221 are formed so that the shapes of the air gaps 221 become irregular.

<Regarding Color Layouts>

As described above, the present technology is designed so that the same patterns are not found when the wiring lines 106 or the air gaps 221 formed in the pixels 100 are compared with one another. However, it is difficult to form the wiring lines 106 or the air gaps 221 so that the same patterns do not exist in all the pixels 100.

Therefore, in the description below, the conditions for varying the patterns of the positions of the wiring lines 106 or the air gaps 221 are explained. Since the conditions vary depending on color layouts, explanation is added for each color layout.

Figure 24A:
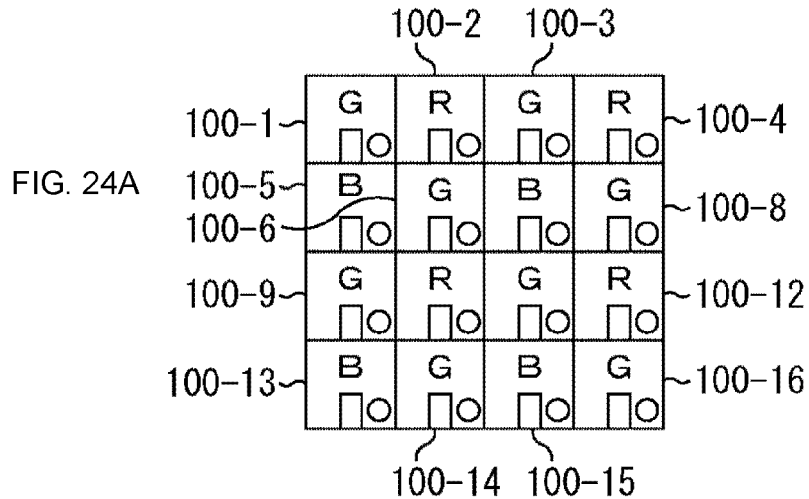
FIGS. 24A, 24B, and 24C are diagrams for explaining a color layout.
Figure 24B:
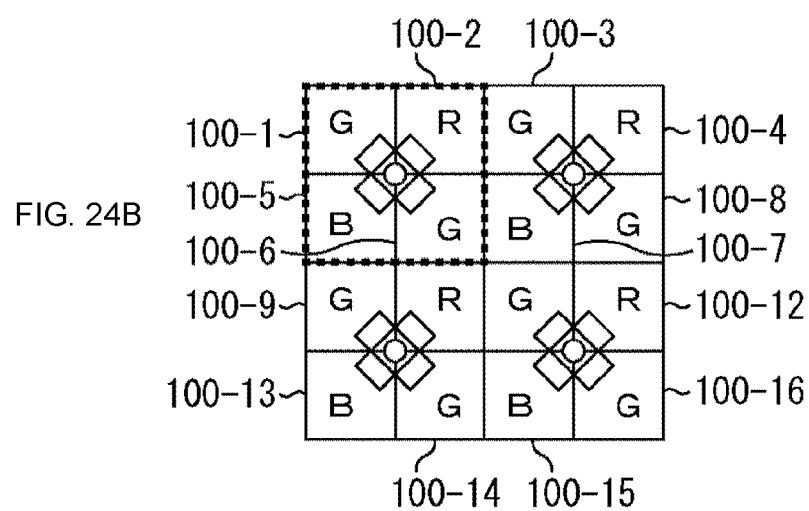
Figure 24C:
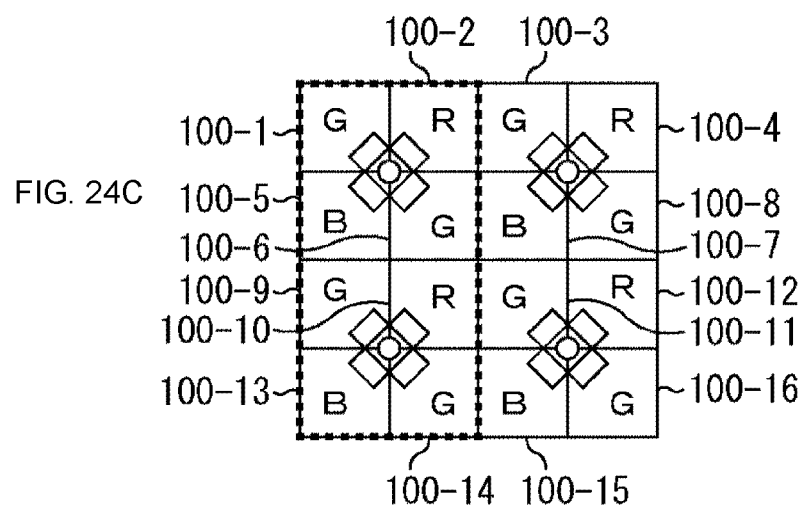

The color layout shown in FIGS. 24A, 24B, and 24C is a Bayer array. In FIGS. 24A, 24B, and 24C (FIGS. 24A, 24B, 24C, 25, 26, and 27), quadrangles (squares) represent pixels 100, quadrangles (rectangles) represent trans gates, and circles represent floating diffusions (FDs). Also, in the drawings, R represents red, G represents green, and B represents blue.

The Bayer array is an array in which R pixels, G pixels, and B pixels are regularly arranged. For example, in the first row, pixels 100-1 through 100-4 are arranged, and a G pixel, an R pixel, a G pixel, and an R pixel are arranged in a repetitive manner. Likewise, in the second row, pixels 100-5 through 100-8 are arranged, and a B pixel, a G pixel, a B pixel, and a G pixel are arranged in a repetitive manner.

FIG. 24A shows a case where there is no pixel sharing. That is, each pixel 100 is provided with a floating diffusion, and transistors such as an amplification transistor, a reset transistor, and a selection transistor (not shown) are provided in each pixel 100.

In a case where such a configuration without pixel sharing is adopted, and the present technology is not applied, wiring lines are provided in the same pattern for all the pixels. As the wiring lines are provided in the same pattern for all the pixels, there is a possibility of luminance unevenness unless the present technology is applied.

In view of this, the patterns of the wiring lines 106 of the wiring layer 105 are made asynchronous, or the patterns of the air gaps 221 are made asynchronous, as described above. In this manner, luminance unevenness can be reduced.

Also, the wiring lines 106 and the air gaps 221 should be formed so that at least adjacent pixels 100, or more specifically, adjacent pixels 100 of the same colors are in different patterns.

For example, since the G pixel of the pixel 100-1 and the G pixel of the pixel 100-6 shown in FIG. 24A are adjacent pixels of the same color, the pattern of the wiring lines 106 (air gaps 221) in the pixel 100-1 and the pattern of the wiring lines 106 (air gap 221) in the pixel 100-6 are different.

FIG. 24B shows a case where 2×2 or four pixels share transistors such as an amplification transistor, a reset transistor, and a selection transistor. In FIG. 24B, the four pixels surrounded by a dotted line are regarded as one sharing unit. That is, the 2×2 or four pixels consisting of a G pixel on the upper left, an R pixel on the upper right, a B pixel on the lower left, and a G pixel on the lower right are regarded as one sharing unit that shares transistors and the like.

In the case of the 2×2 pixel sharing shown in FIG. 24B, the pattern of the wiring lines 106 differs between the pixel 100-1 as a G pixel and the pixel 100-6 as a G pixel in the sharing unit, for example. For example, the transfer transistor of the pixel 100-1 is formed on the lower right in the pixel 100-1, but the transfer transistor of the pixel 100-5 is formed on the upper left in the pixel 100-6. Thus, the layouts of the wiring lines 106 are different.

In other words, the pixel 100-1 as a G pixel and the pixel 100-6 as a G pixel are adjacent pixels of the same color, but signal processing differs between these pixels. The same color having different signal processing as above is not necessarily regarded as the same color when the above described patterns of the wiring lines 106 and the patterns of the air gaps 221 are taken into consideration.

That is, in this case, the pattern of the air gaps 221 in the pixel 100-1 as a G pixel and the pattern of the air gaps 221 in the pixel 100-6 as a G pixel may be the same. The pattern of the wiring lines 106 in the pixel 100-1 as a G pixel is not the same as the pattern of the wiring lines 106 in the pixel 100-6 as a G pixel, but these patterns may be further made different as described above.

As described above, the same color of pixels having different wiring lines 106 (or differing in signal processing) due to pixel sharing or the like may not necessarily have different patterns for the wiring lines 106 (air gaps 221) as described above, but may have the same pattern.

In terms of sharing units, adjacent sharing units preferably have different patterns. For example, in FIG. 24B, the pattern of the wiring lines 106 (air gaps 221) in the sharing unit formed with the four pixels (pixels 100-1, 100-2, 100-5, and 100-6) located on the upper left, and the pattern of the wiring lines 106 (air gaps 221) in the sharing unit formed with the four pixels (pixels 100-3, 100-4, 100-7, and 100-8) located to the right are different patterns.

FIG. 24C shows a case where 2×4 or eight pixels share transistors such as an amplification transistor, a reset transistor, and a selection transistor. In FIG. 24C, the eight pixels surrounded by a dotted line are regarded as one sharing unit. That is, the eight pixels formed with two upper and lower pixel units of the 2×2 or four pixels consisting of a G pixel on the upper left, an R pixel on the upper right, a B pixel on the lower left, and a G pixel on the lower right are regarded as one sharing unit that shares transistors and the like.

In the case of the 2×4 or eight-pixel sharing, the signal processing by the pixels in the sharing unit varies, as in the case of the 2×2 or four-pixel sharing. Accordingly, the patterns of the air gaps 221 in the pixels (the pixels of the same color) in the sharing unit can be the same patterns. It should be noted that the signal processing by the pixels in a sharing unit varies, and therefore, the patterns of the wiring lines 106 are also different. The different patterns may be further made different as described above.

In terms of sharing units, adjacent sharing units preferably have different patterns. For example, in FIG. 24C, the pattern of the wiring lines 106 (air gaps 221) in the sharing unit formed with the eight pixels (pixels 100-1, 100-2, 100-5, 100-6, 100-9, 100-10, 100-13, and 100-14) located on the upper left, and the pattern of the wiring lines 106 (air gaps 221) in the sharing unit formed with the eight pixels (pixels 100-3, 100-4, 100-7, 100-8, 100-11, 100-12, 100-15, and 100-16) located to the right are different patterns.

As shown in FIGS. 24A, 24B, and 24C, in the case of an RGB array, the above described present technology is applied, and all the pixels of R pixels, G pixels, and B pixels can be the current targets for the pixels having different patterns for the wiring lines 106 (air gaps 221).

Meanwhile, the silicon substrate 101 in which the photodiodes 102 are formed tends to transmit long-wavelength light. That is, there is a high possibility that light passing through the silicon substrate 101 and being reflected by the wiring lines 106 is long-wavelength light. With this being taken into consideration, the above described present technology may be applied, and only the R pixels that handle the red color having a long wavelength may be the current targets for the pixels having different patterns for the wiring lines 106 (air gaps 221).

Alternatively, the above described present technology may be applied, and the R pixels and the G pixels may be the current targets for the pixels having different patterns for the wiring lines 106 (air gaps 221).

Figures 25, 26:
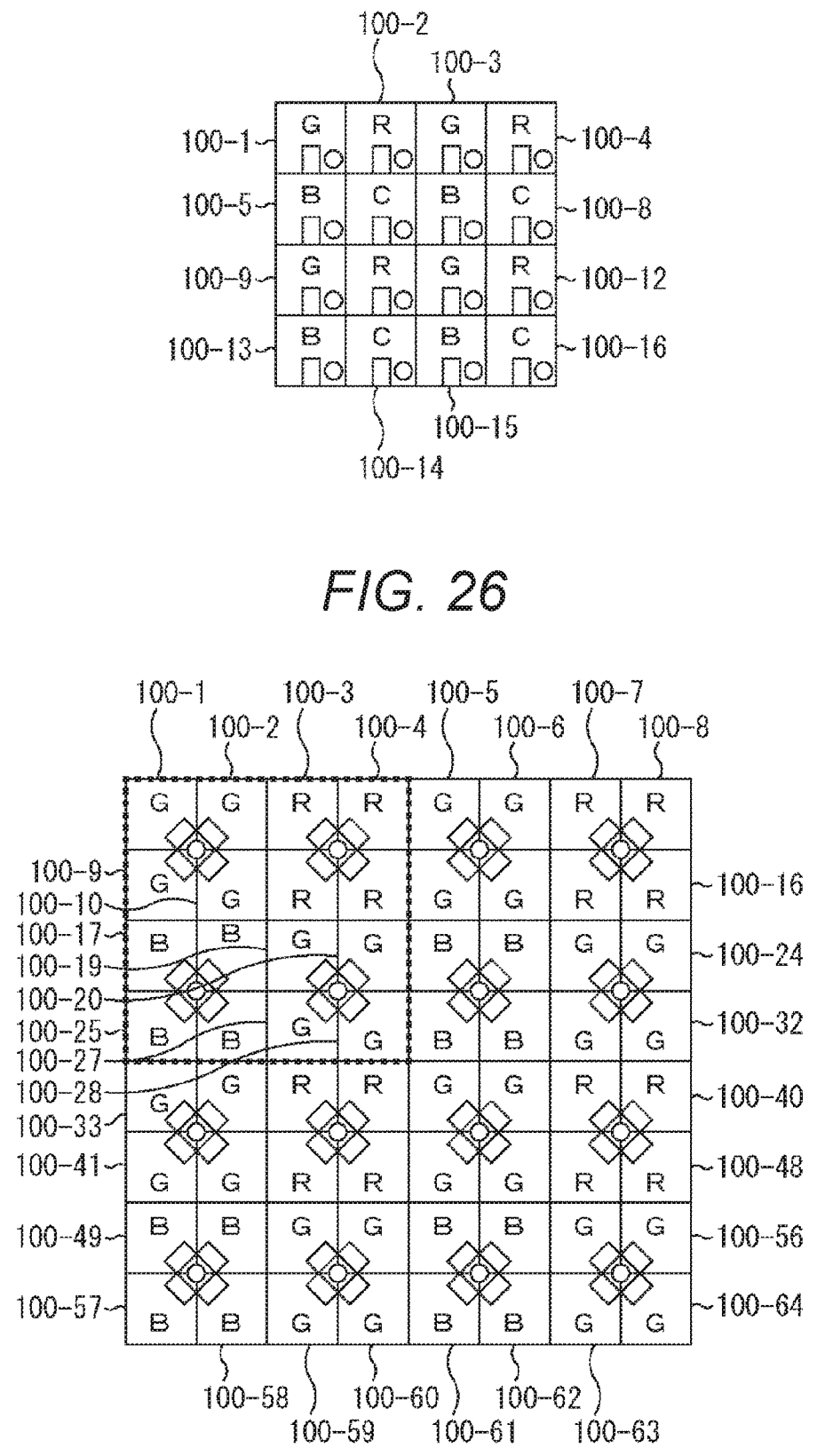

Although example cases of RGB arrays are shown in FIGS. 24A, 24B, and 24C, clear (C) pixels may be further added. FIG. 25 shows an RGBC array. The RGBC array is an array in which R pixels, G pixels, B pixels, and C pixels are regularly arranged. For example, in the first row, pixels 100-1 through 100-4 are arranged, and a G pixel, an R pixel, a G pixel, and an R pixel are arranged in a repetitive manner. Likewise, in the second row, pixels 100-5 through 100-8 are arranged, and a B pixel, a C pixel, a B pixel, and a C pixel are arranged in a repetitive manner.

In the case of the RGBC array, no pixel sharing, 2×2 or four-pixel sharing, and 2×4 or eight-pixel sharing can be considered, as in the cases of the RGB arrays described above with reference to FIGS. 24A, 24B, and 24C. In each case, the patterns of the wiring lines 106 (air gaps 221) can be set in a manner similar to that in an RGB array.

That is, the wiring lines 106 (air gaps 221) have different patterns for pixels 100 in which the same signal processing is performed. Also, in terms of sharing units, adjacent sharing units are made to have different patterns.

In the case of an RGBC array, the above described present technology is applied, and all the pixels of R pixels, G pixels, B pixels, and C pixels can be the current targets for the pixels having different patterns for the wiring lines 106 (air gaps 221), as in the cases of the RGB arrays shown in FIGS. 24A, 24B, and 24C.

The above described present technology may also be applied, and the R pixels that handle the red color having a long wavelength and the C pixels that handle the clear color may be the current targets for the pixels having different patterns for the wiring lines 106 (air gaps 221).

Alternatively, the above described present technology may be applied, and the R pixels, the G pixels, and the C pixels may be the current targets for the pixels having different patterns for the wiring lines 106 (air gaps 221).

FIG. 26 is an RGB array, and shows an array with four pixels of the same color. Like the arrays shown in FIGS. 24A, 24B, and 24C, the array shown in FIG. 26 is an array in which R pixels, G pixels, and B pixels are regularly arranged. However, the array shown in FIG. 26 differs from the arrays shown in FIGS. 24A, 24B, and 24C in that the four pixels as a unit are of the same color. For example, in FIG. 26, the 2×2 or four pixels located on the upper left are G pixels, the 2×2 or four pixels located on the upper right are R pixels, the 2×2 or four pixels located on the lower left are B pixels, and the 2×2 or four pixels located on the lower right are G pixels.

In the case of such a pixel array of four pixels of the same color, there are readout modes for four respective modes (readout modes for all the pixels) and a four-pixel adding readout mode.

In the case of the readout modes for the respective four pixels (for all pixels), reading is considered the same as reading in a case where there is no pixel sharing as shown in FIG. 24A, and adjacent pixels (adjacent pixels of the same color) are formed so that the patterns of the wiring lines 106 (air gaps 221) are different patterns according to the present technology, as in the case described above with reference to FIG. 24A.

In the case of the four-pixel-adding readout mode, the four pixels of a pixel 100-1, a pixel 100-2, a pixel 100-9, and a pixel 100-10 as G pixels are combined, and are then read out, for example. This case is considered similar to the case of the 2×2 or four-pixel sharing shown in FIG. 24B, for example, and the patterns of the wiring lines 106 (air gaps 221) of the adjacent pixels of the same color in the sharing units are different patterns, as in the case shown in FIG. 24B.

For example, a sharing unit in the case of the four pixels of the same color shown in FIG. 26 is formed with the 4×4 or 16 pixels surrounded by a dotted line in the drawing. Examples of the pixels of the same color adjacent to each other in the sharing unit include the G pixels located on the upper left in the sharing unit and the G pixels located on the lower right in the sharing unit.

The G pixels located on the upper left in the sharing unit consist of the pixel 100-1, the pixel 100-2, the pixel 100-9, and the pixel 100-10 (these G pixels are referred to as the sharing G pixels 1). The G pixels located on the lower right in the sharing unit consist of a pixel 100-19, a pixel 100-20, a pixel 100-27, and a pixel 100-28 (these G pixels are referred to as the sharing G pixels 2).

Since the sharing G pixels 1 and the sharing G pixels 2 are pixels of the same color to be subjected to the same signal processing, the pattern of the wiring lines 106 (air gaps 221) in the sharing G pixels 1 and the pattern of the wiring lines 106 (air gaps 221) in the sharing G pixels 2 are different patterns.

In the case of four pixels of the same color, the pixel 100-1, the pixel 100-2, the pixel 100-9, and the pixel 100-10, which are four pixels of the same color, such as G pixels, are subjected to different signal processing from one another. Therefore, the pattern of the air gaps 221 in the pixel 100-1, the pattern of the air gaps 221 in the pixel 100-2, the pattern of the air gaps 221 in the pixel 100-9, and the pattern of the air gaps 221 in the pixel 100-10 may be the same patterns, for example.

It should be noted that, in the case of four pixels of the same color, the pixel 100-1, the pixel 100-2, the pixel 100-9, and the pixel 100-10, which are four pixels of the same color, such as G pixels, have different patterns for the wiring lines 106, for example. The different patterns may be further made different as described above.

Figure 27:
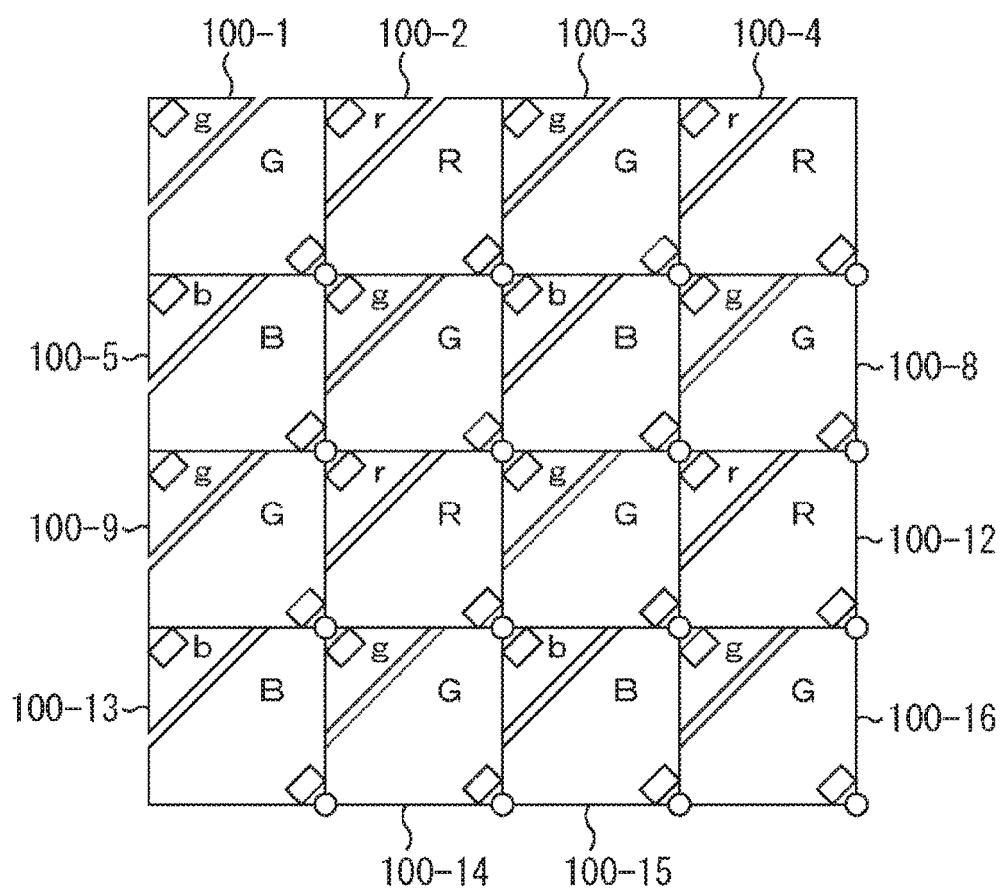
FIG. 27 is a diagram for explaining a color layout.

FIG. 27 shows an array that is an RGB array and is formed with large pixels and small pixels. The large pixels is pixels designed to have high sensitivity, and the small pixels is pixels designed to have low sensitivity. FIG. 27 shows an example in which the large pixels are pixels having photodiodes with a large opening area, the small pixels are pixels having photodiodes with a small opening area, and accordingly, there is a difference in sensitivity.

In the example shown in FIG. 27, a pixel 100 is formed with a large pixel and a small pixel. For example, a pixel 100-1 is formed with a large pixel 100-1 (G pixel) and a small pixel 100-1 (g pixel).

This RGB array is the same as the RGB array shown in FIGS. 24A, 24B, and 24C, except that each pixel is formed with a large pixel and a small pixel, and R pixels, G pixels, and B pixels are regularly arranged. In a case where one pixel is formed with a large pixel and a small pixel, and the pixel array is an RGB array, no pixel sharing, 2×2 or four-pixel sharing, and 2×4 or eight-pixel sharing can be considered, as in the cases of the RGB arrays described above with reference to FIGS. 24A, 24B, and 24C. In each case, the patterns of the wiring lines 106 (air gaps 221) can be set in a manner similar to that in an RGB array.

That is, the wiring lines 106 (air gaps 221) have different patterns for pixels 100 in which the same signal processing is performed. Also, in terms of sharing units, adjacent sharing units are made to have different patterns.

For example, the large pixel 100-1 of the pixel 100-1 and the large pixel 100-1 of the pixel 100-6 are pixels 100 to be subjected to the same signal processing, and the patterns of the wiring lines 106 (air gaps 221) are different patterns. Also, the small pixel 100-1 of the pixel 100-1 and the small pixel 100-1 of the pixel 100-6 are pixels 100 to be subjected to the same signal processing, and the patterns of the wiring lines 106 (air gaps 221) are different patterns.

Further, since the large pixels and the small pixels are subjected to different signal processing from one another, the patterns of the air gaps 221 in the large pixels and the patterns of the air gaps 221 in the small pixels can be the same patterns. In this case, the wiring lines 106 in the large pixels and the wiring lines 106 in the small pixels have different patterns. The different patterns may be further made different as described above.

<Applications to Pixels of a Vertical Spectroscopic Type>

Figure 29:
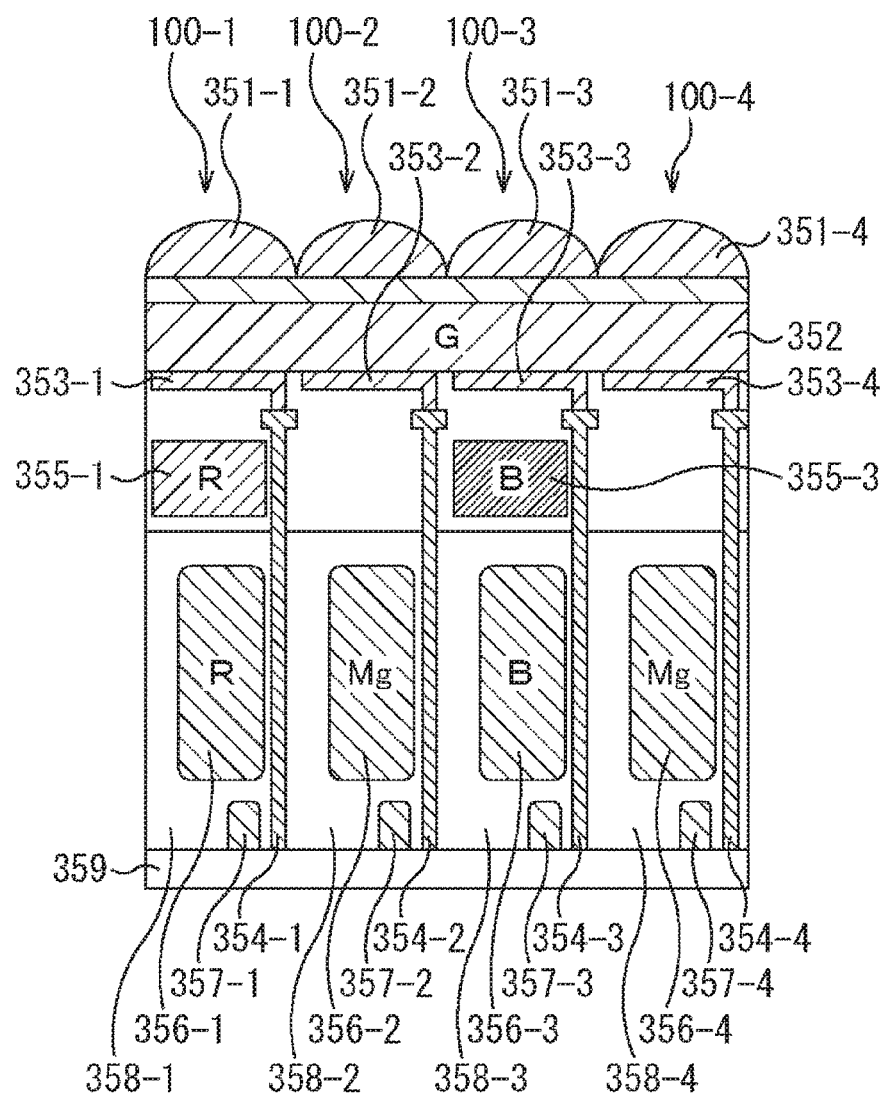
FIG. 29 is a diagram for explaining the configurations of vertical spectroscopic pixels.
Figure 30:
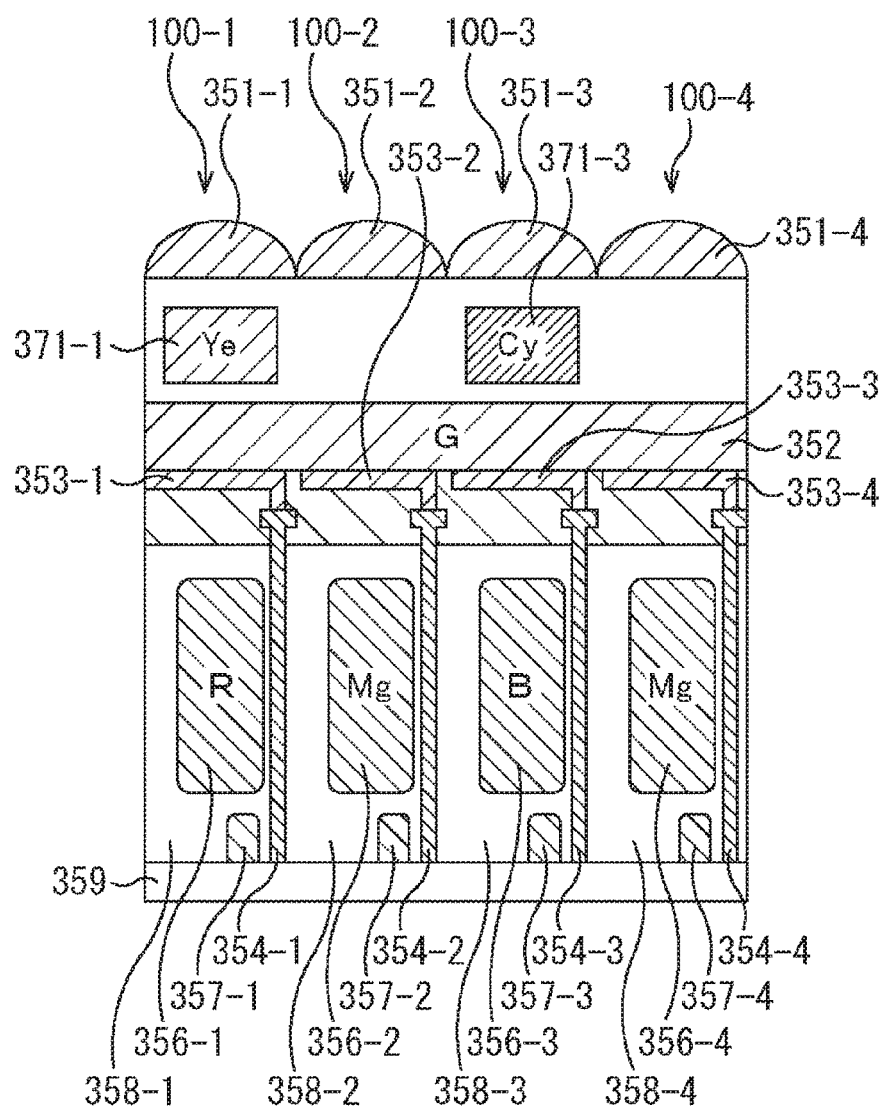
FIG. 30 is a diagram for explaining the configurations of vertical spectroscopic pixels.

As described above, the present technology can be applied to back-illuminated imaging devices. However, the present technology can be applied not only to back-illuminated imaging devices, but also to imaging devices having structures other than back-illuminated structures. For example, the present technology can also be applied to vertical spectroscopic imaging devices as shown in FIGS. 28 through 30.

Figure 28:
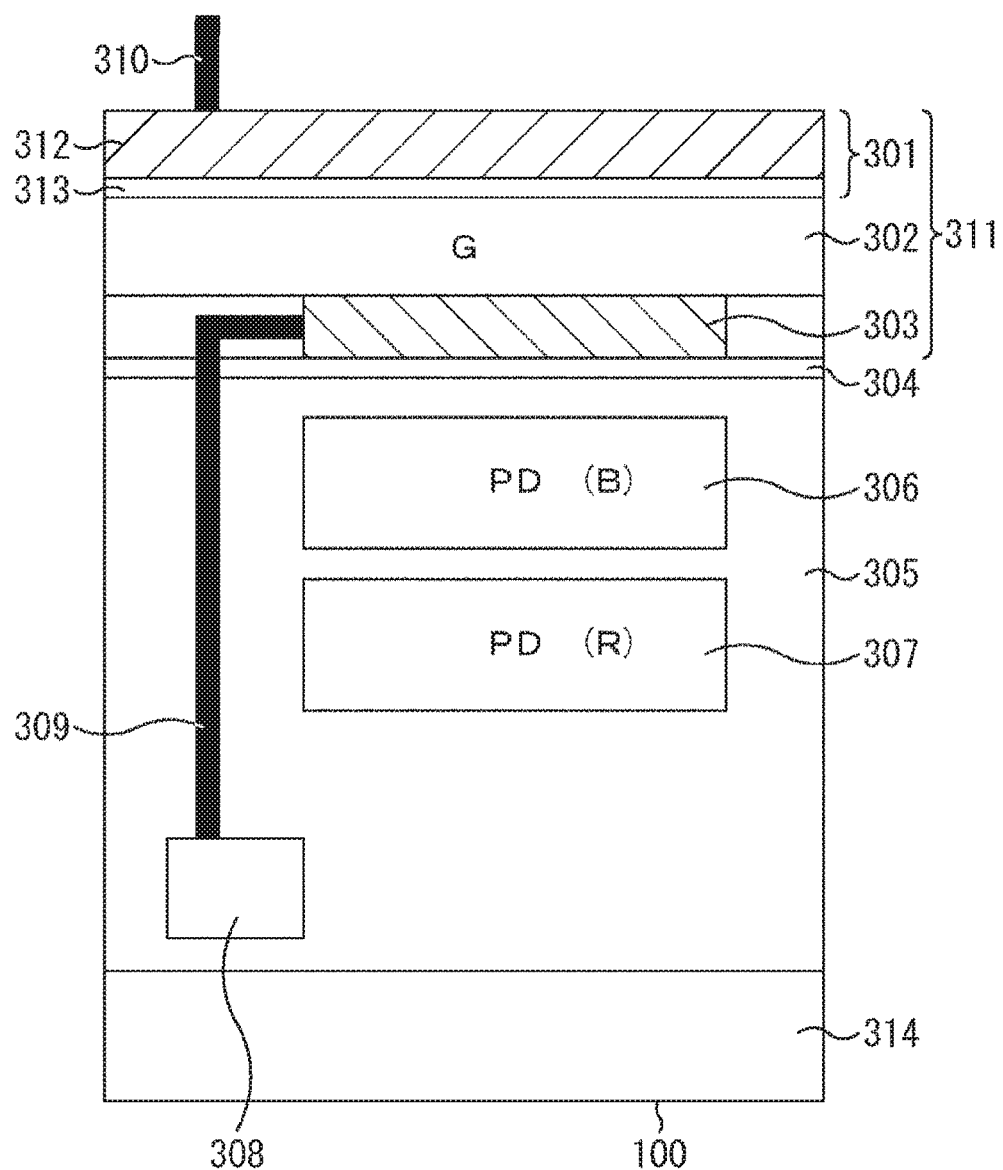
FIG. 28 is a diagram for explaining the configuration of a vertical spectroscopic pixel.

FIG. 28 is a cross-sectional view of a vertical spectroscopic pixel 100.

The pixel 100 is designed to have one organic photoelectric conversion film 311 and two inorganic photoelectric conversion portions PD (photodiode) 306 and PD 307 having pn junctions. The film and the PDs are stacked in the depth direction in the same pixel or one pixel.

More specifically, the pixel 100 includes a semiconductor substrate (silicon substrate) 305 in which the inorganic photoelectric conversion portions are formed. The light receiving surface through which light enters is formed on the back surface side of the substrate 305 (the upper side of the substrate 305 in the drawing), and circuits including a readout circuit and the like are formed on the front surface side of the substrate 305. That is, the pixel 100 has the light receiving surface on the back surface side of the substrate 305, and the circuit formation surface formed on the substrate front surface side, which is the opposite side from the light receiving surface. The semiconductor substrate 305 is formed with a semiconductor substrate of a first conductivity type such as the n type, for example.

In the semiconductor substrate 305, two inorganic photoelectric conversion portions having pn junctions, which are the first photodiode PD 306 and the second photodiode PD 307, are formed so as to be stacked in the depth direction from the back surface side. In the semiconductor substrate 305, the first photodiode PD 306 is formed in the depth direction (downward in the drawing) from the back surface side, and the second photodiode PD 307 is formed.

In this example, the first photodiode PD 306 is for blue (B), and the second photodiode PD 307 is for red (R).

Meanwhile, the organic photoelectric conversion film 311 is stacked on the upper layer of the back surface of the substrate in the region where the first photodiode PD 306 and the second photodiode PD 307 are formed. The organic photoelectric conversion film 311 is formed with an organic photoelectric conversion film 302 having its upper and lower surfaces sandwiched by an upper electrode 301 and a lower electrode 303. In this example, the organic photoelectric conversion film 306 is for green (G). The upper electrode 301 and the lower electrode 303 are formed with a transparent electrode film, such as an indium tin oxide film or an indium zinc oxide film, for example.

In the description that will be continued below, the upper electrode 301 is formed with an oxide semiconductor (ITO) 312 and an aluminum oxide (AlO) thin film 313. Also, in the description that will be continued below, the lower electrode 303 is an oxide semiconductor (ITO).

In this example, the color combination is such that the organic photoelectric conversion film 311 is for green, the first photodiode PD 306 is for blue, and the second photodiode PD 307 is for red. However, some other color combination may be adopted. For example, the organic photoelectric conversion film 311 may be for red or blue, and the first photodiode PD 306 and the second photodiode PD 307 may be for the other corresponding colors. In this case, the positions of the first and second photodiodes PD 306 and PD 307 in the depth direction are set in accordance with the colors.

In the organic photoelectric conversion film 311, the transparent lower electrode 303 is formed, and an insulating film 304 for insulating and isolating the lower electrode 303 is formed. In addition, the organic photoelectric conversion film 302 is formed on the lower electrode 303, and the transparent upper electrode 301 is formed on the organic photoelectric conversion film 302.

In the semiconductor substrate 305 in the one pixel 100, a pair of wiring lines 309 and 310 are formed. The lower electrode 303 of the organic photoelectric conversion film 311 is connected to the wiring line 309, and the upper electrode 301 is connected to the wiring line 310.

In this example, an n-type region 308 for charge accumulation is formed on the front surface side of the substrate 305. The n-type region 308 functions as the floating diffusion portion of the organic photoelectric conversion film 311.

On the circuit formation surface on the front surface side of the substrate 305, a plurality of pixel transistors (not shown) corresponding to the organic photoelectric conversion film 306, the first photodiode PD 306, and the second photodiode PD 307 are formed.

On the front surface side of the semiconductor substrate 305, the pixel transistor in the pixel portion is formed. In the peripheral circuit portion, peripheral circuits such as a logic circuit are formed. The layer including the peripheral circuits and the like is referred to as the wiring layer 314. As shown in FIG. 28, the wiring layer 314 is provided on the lower side of the substrate 305 in the drawing.

The back surface side of the semiconductor substrate 305, or more specifically, the surface of the upper electrode 301 of the organic photoelectric conversion film 311 serves as the light receiving surface. An on-chip lens (not shown) is then formed on the organic photoelectric conversion film 311 via a planarization film (not shown). In this example, no color filters are formed.

FIG. 29 is a cross-sectional diagram showing another configuration of vertical spectroscopic pixels 100, and is a cross-sectional diagram showing the structure of the pixels 100 in which a G organic photoelectric conversion film and R and B color filters are provided. In pixels 100-1 through 100-4, photodiodes 356-1 through 356-4 and charge retention units 357-1 through 357-4 are formed on a semiconductor substrate (a silicon substrate), and are buried in silicon (Si) layers 358-1 through 358-4.

Also, above the semiconductor substrate, a G organic photoelectric conversion film 352 is also stacked, and lenses 351-1 through 351-4 are further formed. Also, of the pixels 100-1 through 100-4, the pixel 100-1 has an R color filter 355-1 formed below the G organic photoelectric conversion film 352 on the light incident side, and the pixel 100-3 has a B color filter 355-3 formed below the G organic photoelectric conversion film 352 on the light incident side. However, the pixel 100-2 and the pixel 100-4 do not have color filters formed therein.

In the pixel 100-1, light gathered by the lens 351-1 enters the G organic photoelectric conversion film 352. The G organic photoelectric conversion film 352 absorbs the light of the green (G) component from the incident light from the lens 351-1, and generates a signal charge corresponding to the light of the green (G) component. The signal charge generated by the G organic photoelectric conversion film 352 is extracted by a transparent electrode 353-1 provided in accordance with the pixel pitch, and is stored into the charge retention unit 357-1 via an electrode 354-1.

Meanwhile, of the incident light from the lens 351-1, the light that has passed through the G organic photoelectric conversion film 352 enters the R color filter 355-1. Here, the light to pass through the G organic photoelectric conversion film 352 is the light of the red (R) component and the light of the blue (B) component. Therefore, the light of the red (R) component is passed (the light of the blue (B) component is cut) by the R color filter 355-1, and enters the photodiode 356-1. The photodiode 356-1 generates a signal charge corresponding to the light of the red (R) component from the R color filter 355-1.

That is, in the pixel 100-1, the signal charges corresponding to the light of the green (G) component and the light of the red (R) component are generated.

In the pixel 100-2, light gathered by the lens 351-2 enters the G organic photoelectric conversion film 352. The G organic photoelectric conversion film 352 absorbs the light of the green (G) component from the incident light from the lens 351-2, and generates a signal charge corresponding to the light of the green (G) component. The signal charge generated by the G organic photoelectric conversion film 352 is extracted by a transparent electrode 353-2 provided in accordance with the pixel pitch, and is stored into the charge retention unit 357-2 via an electrode 354-2.

Here, the pixel 100-2 does not have any color filter formed therein, and therefore, the light that has passed through the G organic photoelectric conversion film 352 directly enters the photodiode 356-2. Also, the light to pass through the G organic photoelectric conversion film 352 is the light of the red (R) component and the light of the blue (B) component, and accordingly, the photodiode 356-2 generates a signal charge corresponding to the light of the component of magenta (Mg), which is a mixture of red (R) and blue (B).

That is, in the pixel 100-2, the signal charges corresponding to the light of the green (G) component and the light of the magenta (Mg) component are generated.

In the pixel 100-3, light gathered by the lens 351-3 enters the G organic photoelectric conversion film 352. The G organic photoelectric conversion film 352 absorbs the light of the green (G) component from the incident light from the lens 351-3, and generates a signal charge corresponding to the light of the green (G) component. The signal charge generated by the G organic photoelectric conversion film 352 is extracted by a transparent electrode 353-3 provided in accordance with the pixel pitch, and is stored into the charge retention unit 357-3 via an electrode 354-3.

Meanwhile, of the incident light from the lens 351-3, the light that has passed through the G organic photoelectric conversion film 352 enters the B color filter 355-3. Here, the light to pass through the G organic photoelectric conversion film 352 is the light of the red (R) component and the light of the blue (B) component. Therefore, the light of the blue (B) component is passed (the light of the red (R) component is cut) by the B color filter 355-3, and enters the photodiode 356-3. The photodiode 356-3 generates a signal charge corresponding to the light of the blue (B) component from the B color filter 355-3.

That is, in the pixel 100-3, the signal charges corresponding to the light of the green (G) component and the light of the blue (B) component are generated.

Like the pixel 100-2, the pixel 100-4 does not have any color filter formed therein. Therefore, the G organic photoelectric conversion film 352 absorbs the light of the green (G) component from the incident light from the lens 351-4, and generates a signal charge corresponding to the light of the green (G) component. Also, the photodiode 356-4 generates a signal charge corresponding to the light of the magenta (Mg) component, which is a mixture of the light of the red (R) component and the light of the blue (B) component that have passed through the G organic photoelectric conversion film 352.

That is, in the pixel 100-4, the signal charges corresponding to the light of the green (G) component and the light of the magenta (Mg) component are generated.

In the above manner, the signal charges generated by the pixels 100-1 through 100-4 are readout by a readout unit formed with a plurality of pixel transistors, and are processed by a signal processing unit in a later stage. As a result, the signal charges are output as image data. Here, the signal processing unit in the later stage processes an RGB signal formed with signals corresponding to the green (G) component and the red (R) component in the output from the pixel 100-1, and signals corresponding to the green (G) component and the blue (B) component in the output from the pixel 100-3.

The signal processing unit in the later stage also processes a W signal corresponding to the white (W) component, as the signals corresponding to the green (G) component and the magenta (Mg) component obtained from the output from the pixel 100-2 are combined (added up). Likewise, a W signal corresponding to the white (W) component is processed, as the signals corresponding to the green (G) component and the magenta (Mg) component obtained from the output from the pixel 100-4 are combined (added up).

Transistors and signal processing units can be formed in a wiring layer 359 provided on the lower side of the silicon (Si) layers 358 in the drawing.

FIG. 30 is a cross-sectional diagram showing yet another configuration of vertical spectroscopic pixels 100, and is a cross-sectional diagram showing the structure of the pixels 100 in which a G organic photoelectric conversion film and Ye and Cy color filters are provided. In pixels 100-1 through 100-4, photodiodes 356-1 through 356-4 and charge retention units 357-1 through 357-4 are formed on a semiconductor substrate (a silicon substrate), and are buried in silicon (Si) layers 358-1 through 358-4. Also, above the semiconductor substrate, a G organic photoelectric conversion film 352 is also stacked, and lenses 351-1 through 351-4 are further formed.

Also, of the pixels 100-1 through 100-4, the pixel 100-1 has a Ye color filter 91-1 formed above the G organic photoelectric conversion film 352 on the light incident side, and the pixel 100-3 has a Cy color filter 91-3 formed above the G organic photoelectric conversion film 352 on the light incident side. However, the pixel 100-2 and the pixel 100-4 do not have color filters formed therein.

In the pixel 100-1, light gathered by the lens 351-1 enters the Ye color filter 91-1. Here, the light to pass through the Ye color filter 91-1 is the light of the yellow (Ye) component, or the light of a mixture of red (R) and green (G). Accordingly, the light of a mixture of red (R) and green (G) is passed by the Ye color filter 91-1, and enters the G organic photoelectric conversion film 352.

The G organic photoelectric conversion film 352 absorbs the light of the green (G) component from the incident light from the Ye color filter 91-1, and generates a signal charge corresponding to the light of the green (G) component. The signal charge generated by the G organic photoelectric conversion film 352 is extracted by a transparent electrode 353-1 provided in accordance with the pixel pitch, and is stored into the charge retention unit 357-1 via an electrode 354-1.

Meanwhile, the light that has passed through the G organic photoelectric conversion film 352 enters the photodiode 356-1. Here, the light to pass through the G organic photoelectric conversion film 352 is the light of the red (R) component, and accordingly, the photodiode 356-1 generates a signal charge corresponding to the light of the red (R) component that has passed through the G organic photoelectric conversion film 352.

That is, in the pixel 100-1, the signal charges corresponding to the light of the green (G) component and the light of the red (R) component are generated.

In the pixel 100-2, light gathered by the lens 351-2 enters the G organic photoelectric conversion film 352. The G organic photoelectric conversion film 352 absorbs the light of the green (G) component from the incident light from the lens 351-2, and generates a signal charge corresponding to the light of the green (G) component. The signal charge generated by the G organic photoelectric conversion film 352 is extracted by a transparent electrode 353-2 provided in accordance with the pixel pitch, and is stored into the charge retention unit 357-2 via an electrode 354-2.

Here, the pixel 100-2 does not have any color filter formed therein, and therefore, the light gathered by the lens 351-2 directly enters the G organic photoelectric conversion film 352, and the light that has passed through the G organic photoelectric conversion film 352 enters the photodiode 356-2. Also, the light to pass through the G organic photoelectric conversion film 352 is the light of the red (R) component and the light of the blue (B) component, and accordingly, the photodiode 356-2 generates a signal charge corresponding to the light of the component of magenta (Mg), which is a mixture of red (R) and blue (B).

That is, in the pixel 100-2, the signal charges corresponding to the light of the green (G) component and the light of the magenta (Mg) component are generated.

In the pixel 100-3, light gathered by the lens 351-3 enters the Cy color filter 91-3. Here, the light to pass through the Cy color filter 91-3 is the light of the cyan (Cy) component, or the light of a mixture of green (G) and blue (B). Accordingly, the Cy color filter 91-3 guides the light of a mixture of green (G) and blue (B) into the G organic photoelectric conversion film 352.

The G organic photoelectric conversion film 352 absorbs the light of the green (G) component from the incident light from the Cy color filter 91-3, and generates a signal charge corresponding to the light of the green (G) component. The signal charge generated by the G organic photoelectric conversion film 352 is extracted by a transparent electrode 353-3 provided in accordance with the pixel pitch, and is stored into the charge retention unit 357-3 via an electrode 354-3.

Meanwhile, the light that has passed through the G organic photoelectric conversion film 352 enters the photodiode 356-3. Here, the light to pass through the G organic photoelectric conversion film 352 is the light of the blue (B) component, and accordingly, the photodiode 356-3 generates a signal charge corresponding to the light of the blue (B) component that has passed through the G organic photoelectric conversion film 352.

That is, in the pixel 100-3, the signal charges corresponding to the light of the green (G) component and the light of the blue (B) component are generated.

Like the pixel 100-2, the pixel 100-4 does not have any color filter formed therein. Therefore, the G organic photoelectric conversion film 352 absorbs the light of the green (G) component from the incident light from the lens 351-4, and generates a signal charge corresponding to the light of the green (G) component. Also, the photodiode 356-4 generates a signal charge corresponding to the light of the magenta (Mg) component, which is a mixture of the light of the red (R) component and the light of the blue (B) component that have passed through the G organic photoelectric conversion film 352.

That is, in the pixel 100-4, the signal charges corresponding to the light of the green (G) component and the light of the magenta (Mg) component are generated.

In the above manner, the signal charges generated by the pixels 100-1 through 100-4 are readout by a readout unit formed with a plurality of pixel transistors, and are processed by a signal processing unit in a later stage. As a result, the signal charges are output as image data. Here, the signal processing unit in the later stage processes an RGB signal formed with signals corresponding to the green (G) component and the red (R) component in the output from the pixel 100-1, and signals corresponding to the green (G) component and the blue (B) component in the output from the pixel 100-3.

The signal processing unit in the later stage also processes a W signal corresponding to the white (W) component, as the signals corresponding to the green (G) component and the magenta (Mg) component obtained from the output from the pixel 100-2 are combined (added up). Likewise, a W signal corresponding to the white (W) component is processed, as the signals corresponding to the green (G) component and the magenta (Mg) component obtained from the output from the pixel 100-4 are combined (added up).

Transistors and signal processing units can be formed in a wiring layer 359 provided on the lower side of the silicon (Si) layers 358 in the drawing.

The present technology can also be applied to the vertical spectroscopic pixels 100 shown in FIGS. 28 through 30. In the case of a vertical spectroscopic pixel, most incident light is photoelectrically converted. Accordingly, visible light use efficiency is high, and color signals of a plurality of colors can be obtained with one pixel.

In the vertical spectroscopic pixels 100 shown in FIGS. 28 through 30, the present technology can also be applied, so that the patterns of the above-described wiring lines 106 (air gaps 221) are made asynchronous to the wiring layer 314 (the wiring layer 359).

That is, when the patterns of the wiring lines 106 formed in the wiring layer 314 (the wiring layer 359) are compared between different pixels 100, the wiring lines 106 can be formed so as to have different patterns. Also, when the patterns of the air gaps 221 formed in the wiring layer 314 (the wiring layer 359) are compared between different pixels 100, the air gaps 221 can be formed so as to have different patterns.

Further, reading in the vertical spectroscopic pixels 100 shown in FIG. 28 through FIG. 30 can be considered equivalent to reading in the case where there is no pixel sharing as shown in FIG. 24A. That is, in the vertical spectroscopic pixels 100 shown in FIGS. 28 through 30, the same signal processing is performed in all the pixels, and adjacent pixels (adjacent pixels of the same color) are formed so that the patterns of the wiring lines 106 (air gaps 221) are different patterns according to the present technology, as in the case described above with reference to FIG. 24A.

In the case of the vertical spectroscopic pixels 100 shown in FIGS. 29 and 30, the above described present technology is applied, and all the pixels having different patterns for the wiring lines 106 (air gaps 221) can be the current targets.

The above described present technology may also be applied, and the R pixels that handle the red color having a long wavelength and the Mg pixels that handle the magenta color may be the current targets for the pixels having different patterns for the wiring lines 106 (air gaps 221). Alternatively, the above described present technology may be applied, and only the Mg pixels may be the current targets for the pixels having different patterns for the wiring lines 106 (air gaps 221).

<Manufacturing of Pixels>

Next, a method of manufacturing the above described pixels 100 is described. In this description, an example case where the pixels 100 having the air gaps 221 formed in the wiring formation interlayer 211-1 and the wiring formation layer 212-1 are manufactured is described, with reference to FIGS. 31 and 32.

In step S1, the photodiodes 102 are formed in the silicon substrate 101, and an insulating film to be part of the wiring layer 105 (the wiring formation interlayer 211-1) is formed. It should be noted that, although not shown in the drawings, floating diffusions are formed in the silicon substrate 101, and transfer transistors are formed in the insulating film (the wiring layer 105).

In step S2, with the use of a photoresist pattern 401, etching is performed on the insulating film (the wiring formation interlayer 211-1) formed on the silicon substrate 101. The photoresist pattern 401 is a pattern for etching the portions in which the air gaps 221 are to be formed. Also, the patterns in which the air gaps 221 are formed are designed to be asynchronous in the pixels 100 as described above, and therefore, the photoresist pattern 401 is a pattern with which such a pattern can be formed.

In step S3, the photoresist pattern 401 applied onto the insulating film (the wiring formation interlayer 211-1) is removed, and another insulating film (the wiring formation layer 212-1) is formed by a film forming method with poor coverage. As a film forming method with poor coverage is used, the material forming the insulating film can be prevented from flowing into the formed air gaps 221 (or the material forming the insulating film can be prevented from filling the formed air gaps 221).

In step S4, the wiring lines 106 of the first layer are formed by a damascene process. Through the steps so far, the wiring formation interlayer 211-1 and the wiring formation layer 212-1 are formed, and the air gaps 221 are formed in the wiring formation interlayer 211-1. Further, the wiring lines 106 are formed in the wiring formation layer 212-1 by a damascene process.

In step S5, to form the air gaps 221 in the wiring formation layer 212-1, a photoresist pattern 402 is formed on the wiring formation layer 212-1, and etching is performed on the wiring formation layer 212-1 (an insulating film). As for this photoresist pattern 402 and the etching, the photoresist pattern 402 for forming the air gaps 221 in asynchronous patterns in the pixels 100 is formed, and is then subjected to the etching, as in step S2.

In step S6 (FIG. 32), the photoresist pattern 402 applied onto the insulating film (the wiring formation layer 212-1) is removed, and insulating films (the wiring formation interlayer 211-2 and the wiring formation layer 212-2) are formed by a film forming method with poor coverage. In this manner, the air gaps 221 are formed in the wiring formation layer 212-1.

It should be noted that, in a case where the air gaps 221 are also to be formed in the wiring formation interlayer 211-2, the wiring formation interlayer 211-2 is formed in step S6. After that, processing similar to step S2 (photoresist pattern formation and etching) is performed, and processing similar to step S3 (photoresist pattern removal and film formation of the wiring formation layer 212-2) is performed.

In step S7, the wiring lines 106 are formed in the wiring formation layer 212-2 by a damascene process. In step S8, the wiring formation interlayer 211-3 is formed on the wiring formation layer 212-2. In this manner, the air gaps 221 are formed.

It should be noted that, in a case where the air gaps 221 are also to be formed in the wiring formation layer 212-2, after step S7, processing similar to step S5 (photoresist pattern formation and etching) is performed, and the photoresist pattern removal and the film formation of the wiring formation interlayer 211-3 in step S8 are then performed.

Next, the manufacturing of the pixels 100 in a case where the air gaps 221 are formed with an insulating film, a conductor, or a semiconductor having a different dielectric constant from the dielectric constant of the insulating film forming the wiring layer 105 is described with reference to FIGS. 33 through 35.

Figure 33:
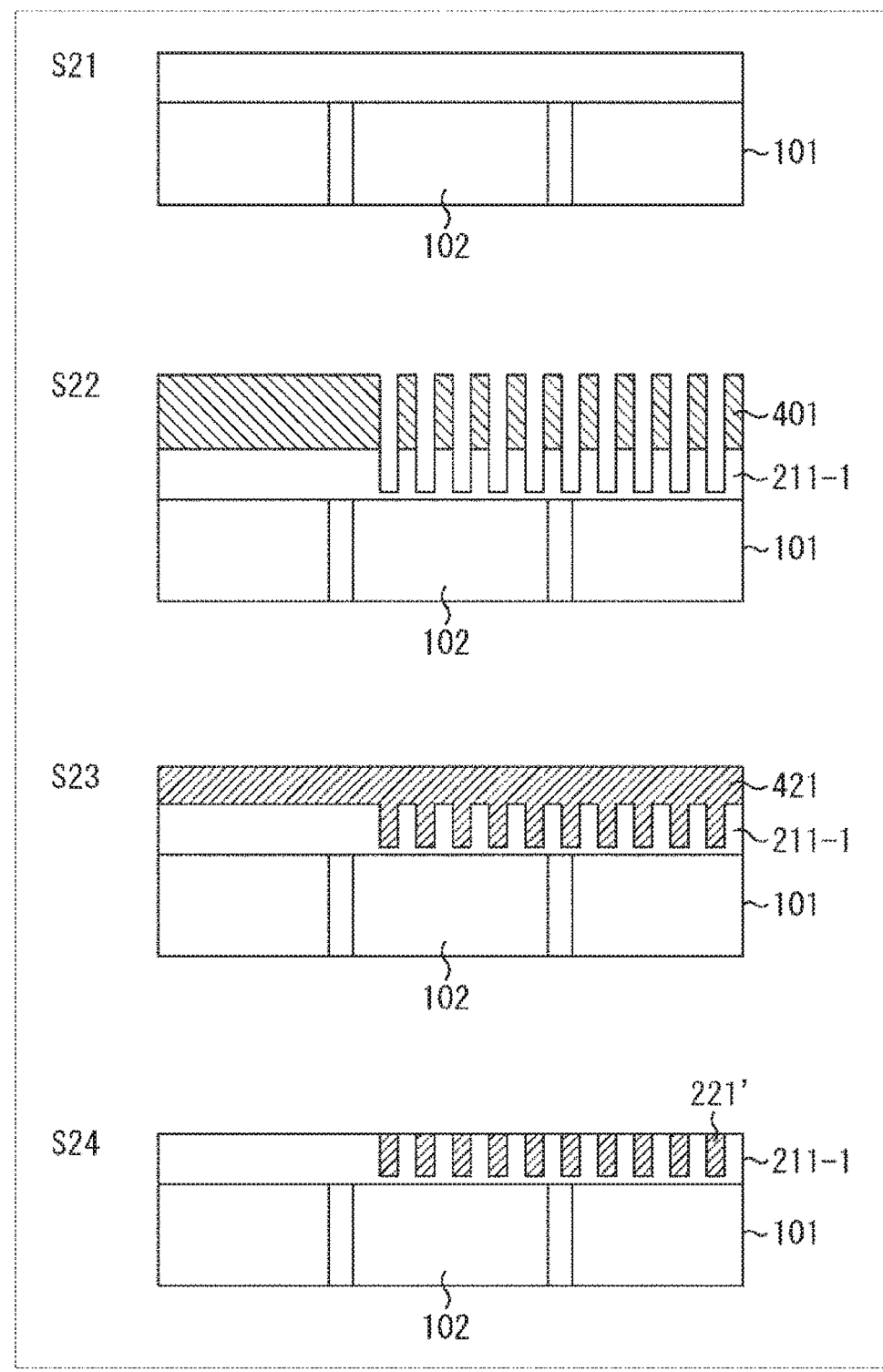
FIG. 33 is a diagram for explaining formation of semiconductor gaps.
Figure 34:
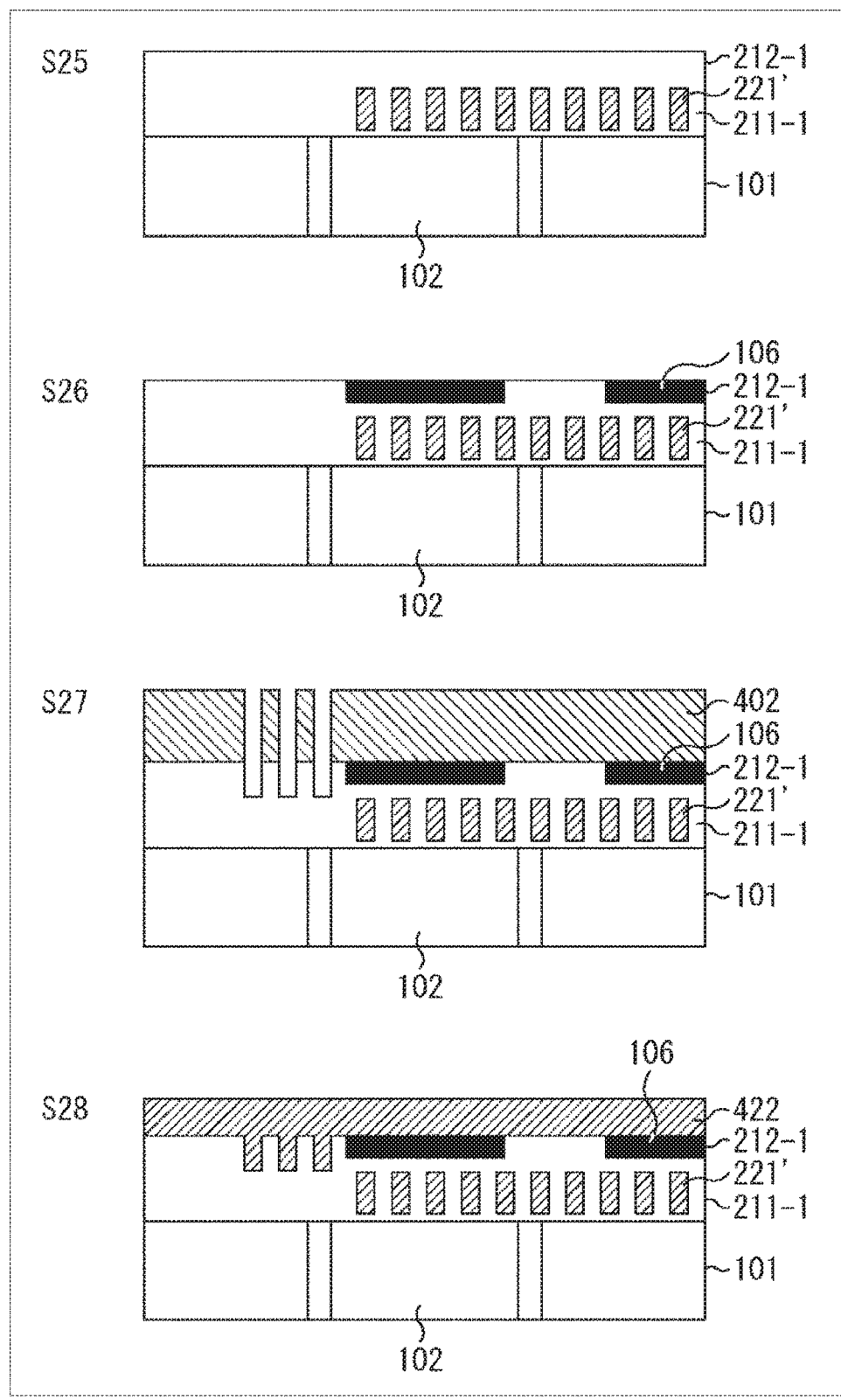
FIG. 34 is a diagram for explaining formation of semiconductor gaps.
Figure 35:
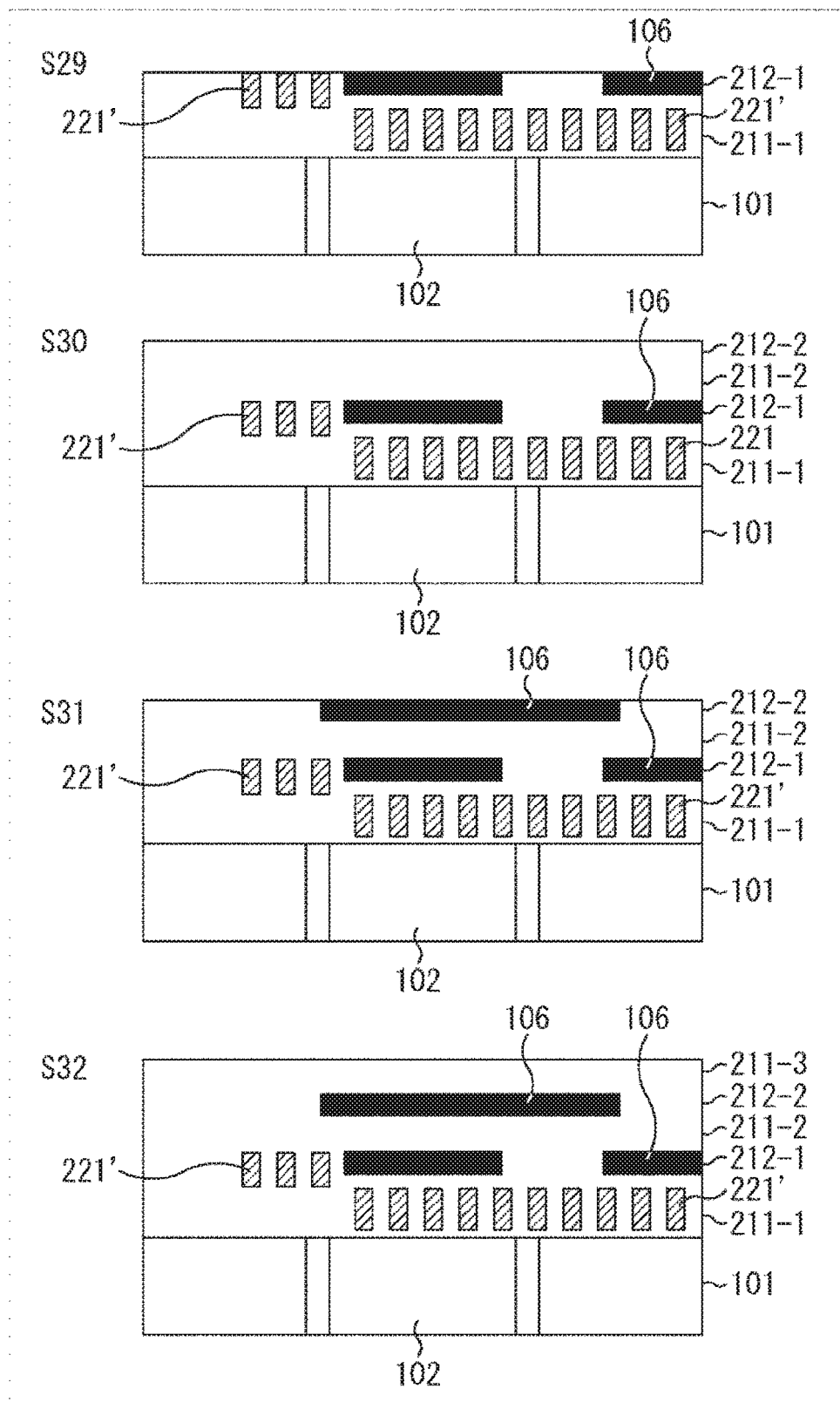
FIG. 35 is a diagram for explaining formation of semiconductor gape.

In the description with reference to FIGS. 33 through 35, an example case where the air gaps 221 are formed with a semiconductor is explained. However, air gaps 221 formed with an insulating film or a conductor having a different dielectric constant from the dielectric constant of the insulating film forming the wiring layer 105 can also be formed through steps similar to those described below. Further, the air gaps 221 formed with a semiconductor are referred to as semiconductor gaps 221' in FIGS. 33 through 35.

Figure 31:
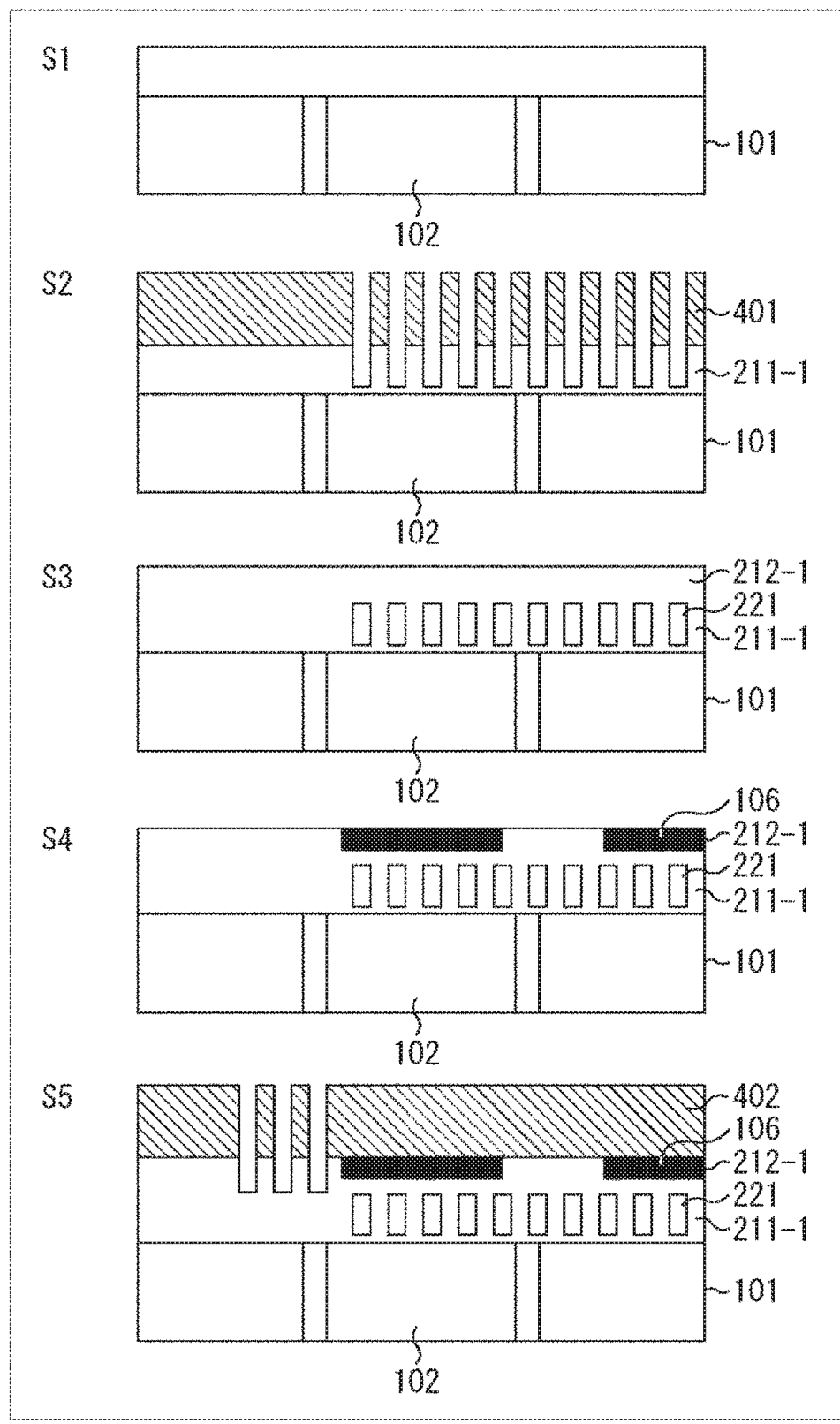
FIG. 31 is a diagram for explaining formation of air gaps.

Steps S21 and S22 are similar to steps S1 and S2 in FIG. 31, and therefore, explanation thereof is not made herein. In step S23, the photoresist pattern 401 applied onto the insulating film (the wiring formation interlayer 211-1) is removed, and a film of a semiconductor 421 for forming the semiconductor gaps 221' is formed.

In step S24, the semiconductor 421 (extra semiconductor 421) other than the semiconductor 421 filling the grooves in the wiring formation interlayer 211-1 is removed by a method such as chemical mechanical polishing (CMP) or etchback.

In step S25 (FIG. 34), the wiring formation layer 212-1 is formed on the wiring formation interlayer 211-1. Through the steps so far, the wiring formation interlayer 211-1, the wiring formation layer 212-1, and the semiconductor gaps 221' are formed.

In step S26, the wiring lines 106 are formed in the wiring formation layer 212-1 by a damascene process. After the wiring lines 106 are formed, to form the semiconductor gaps 221' in the wiring formation layer 212-1, a photoresist pattern 402 is formed on the wiring formation layer 212-1, and etching is performed on the wiring formation layer 212-1 (an insulating film) in step S27. As for this photoresist pattern 402 and the etching, the photoresist pattern 402 for forming the semiconductor gaps 221' in asynchronous patterns in the pixels 100 is formed, and is then subjected to the etching, as in step S22 (or S2 in FIG. 31).

In step S28, the photoresist pattern 402 applied onto the insulating film (the wiring formation layer 212-1) is removed, and a film of a semiconductor 422 for forming the semiconductor gaps 221' is formed.

In step S29 (FIG. 35), the extra semiconductor 422 on the wiring formation layer 212-1 is removed by a method such as CMP or etchback.

Figure 32:
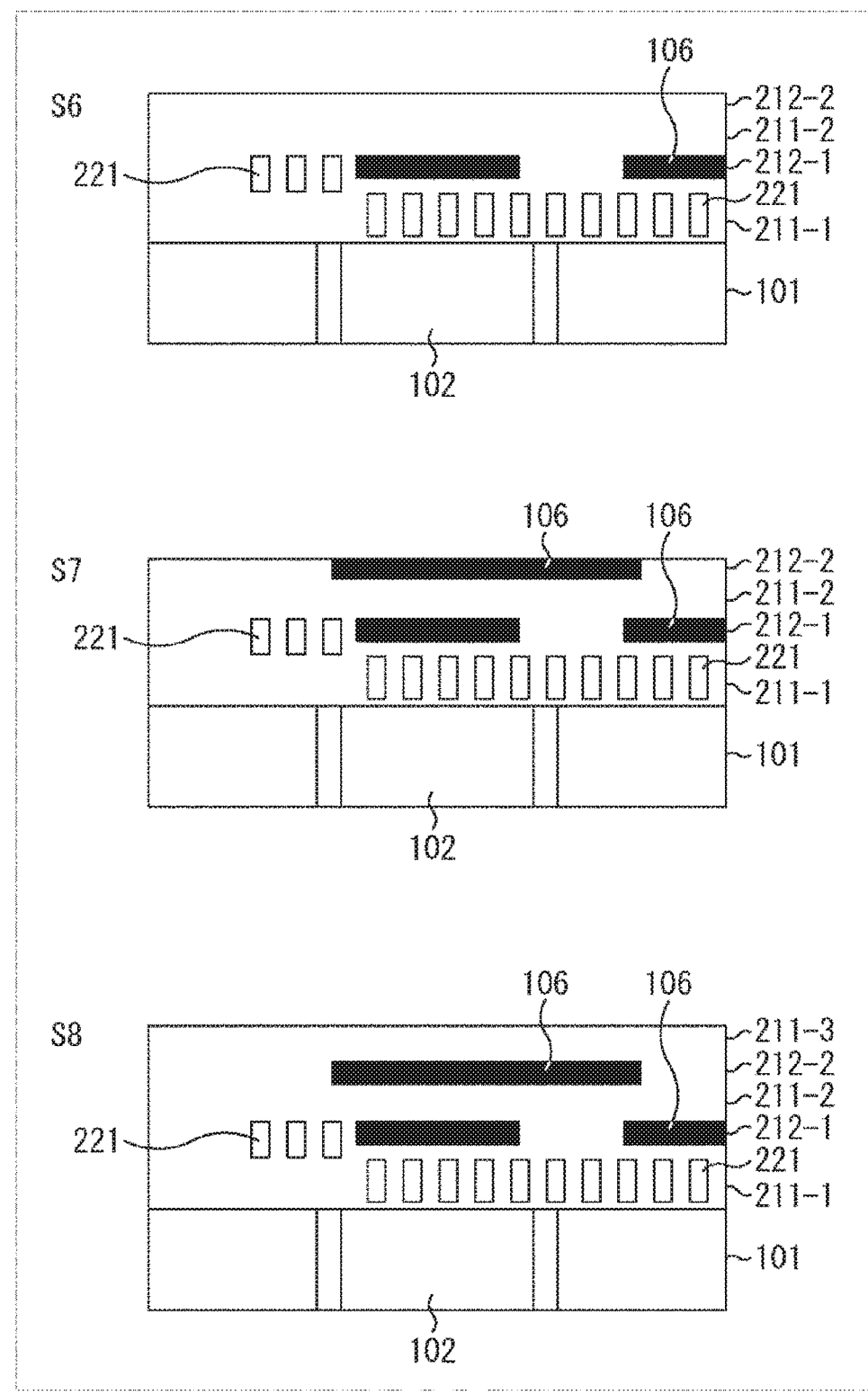
FIG. 32 is a diagram for explaining formation of air gaps.

In step S30, the wiring formation interlayer 211-2 and the wiring formation layer 212-2 are formed. In step S31, the wiring lines 106 are formed in the wiring formation layer 212-2 by a damascene process. In step S32, the wiring formation interlayer 211-3 is formed. Steps S30 through S32 can be carried out in a manner similar to steps S6 through S8 (FIG. 32).

It should be noted that, in a case where the semiconductor gaps 221' are also to be formed in the wiring formation interlayer 211-2, the wiring formation interlayer 211-2 is formed in step S30. After that, processing similar to step S22 (photoresist pattern formation and etching) is performed, processing similar to step S23 (photoresist pattern removal and film formation of the semiconductor 421) is performed, and processing similar to step S24 (removal of the extra semiconductor 421) is performed.

It should be noted that, in a case where the semiconductor gaps 221' are also to be formed in the wiring formation layer 212-2, after step S31, processing similar to step S27 (photoresist pattern formation and etching) is performed, processing similar to step S28 (photoresist pattern removal and film formation of the semiconductor 422) is performed, and processing similar to step S29 (removal of the extra semiconductor 422) is performed.

In this manner, the semiconductor gaps 221' are formed.

According to the present technology, it is possible to reduce luminance unevenness to be caused by reflected light that has passed through the silicon substrate 101 and been reflected by the wiring lines 106 in the wiring layer 105. It is also possible to manufacture pixels that can reduce luminance unevenness.

<Configuration of a Camera Module>

The present technology is not necessarily applied to an imaging device. Specifically, the present technology can be applied not only to imaging devices but also to any electronic apparatuses having imaging devices therein, such as camera modules having optical lens systems or the like, imaging apparatuses such as digital still cameras and video cameras, mobile terminal devices (smartphones and tablets, for example) having imaging functions, or copying machines that use imaging devices as the image reading units.

Figure 36:
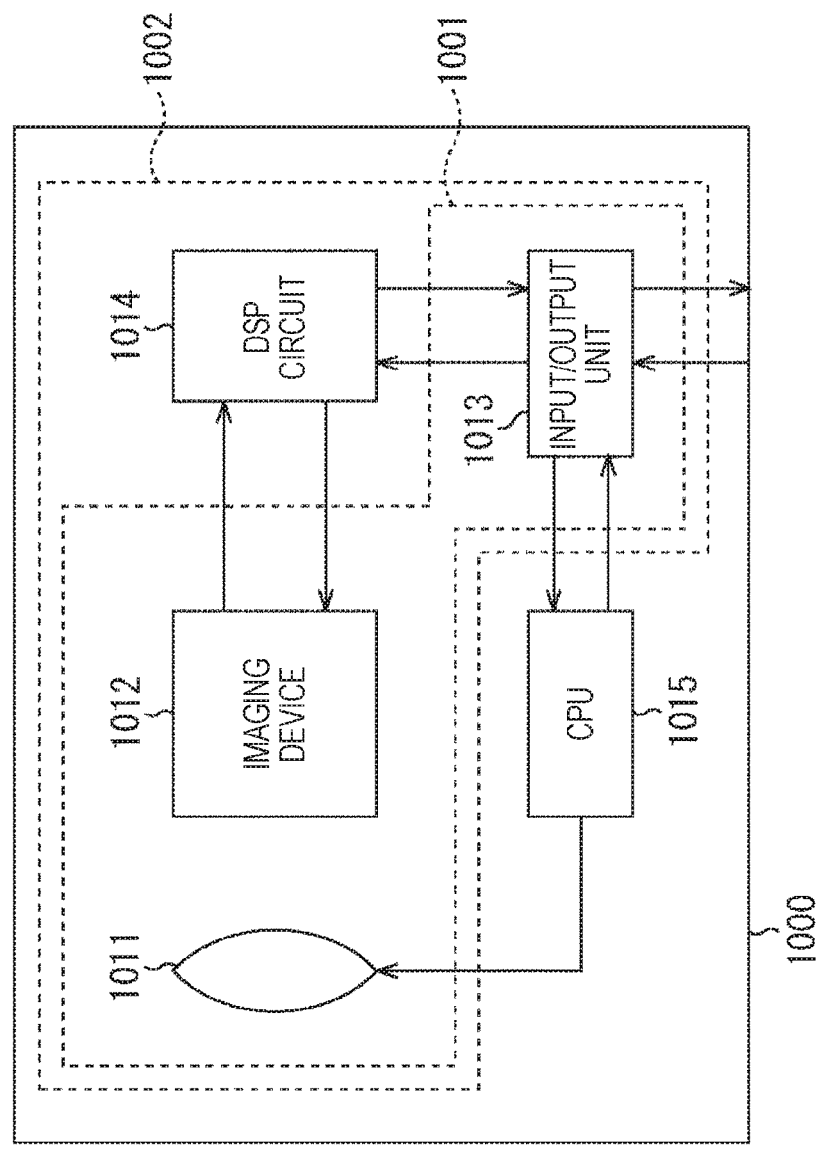
FIG. 36 is a diagram for explaining the configuration of a camera module.

FIG. 36 is a diagram showing an example configuration of a camera module including an imaging device.

In FIG. 36, a camera module 1000 is a module into which an optical lens system 1011, an imaging device 1012, an input/output unit 1013, a digital signal processor (DSP) circuit 1014, and a CPU 1015 are incorporated.

The imaging device 1012 includes the above described pixels 100, and the cross-sectional structure shown in FIG. 1 is adopted as its structure, for example. The imaging device 1012 captures incident light (image light) from the object via the optical lens system 1011, converts the amount of the incident light gathered on the imaging surface into an electrical signal for each pixel, and outputs the electrical signal as a pixel signal. The input/output unit 1013 serves as an input/output interface with the outside.

The DSP circuit 1014 is a signal processing circuit that processes signals supplied from the imaging device 1012. The CPU 1015 controls the optical lens system 1011, and exchanges data with the input/output unit 1013.

Alternatively, a camera module 1001 may be a module formed only with the optical lens system 1011, the imaging device 1012, and the input/output unit 1013, for example. In this case, pixel signals from the imaging device 1012 are output via the input/output unit 1013. Further, a camera module 1002 may be a module formed with the optical lens system 1011, the imaging device 1012, the input/output unit 1013, and the DSP circuit 1014. In this case, pixel signals from the imaging device 1012 are processed by the DSP circuit 1014, and are output via the input/output unit 1013.

The camera modules 1000, 1001, and 1002 are configured as above. The camera modules 1000, 1001, and 1002 each include the imaging device 1012 in which pixels (the pixels 100 shown in FIG. 1, for example) for improving image quality are provided. Thus, luminance unevenness can be reduced, and image quality can be improved.

<Configuration of an Electronic Apparatus>

Figure 37:
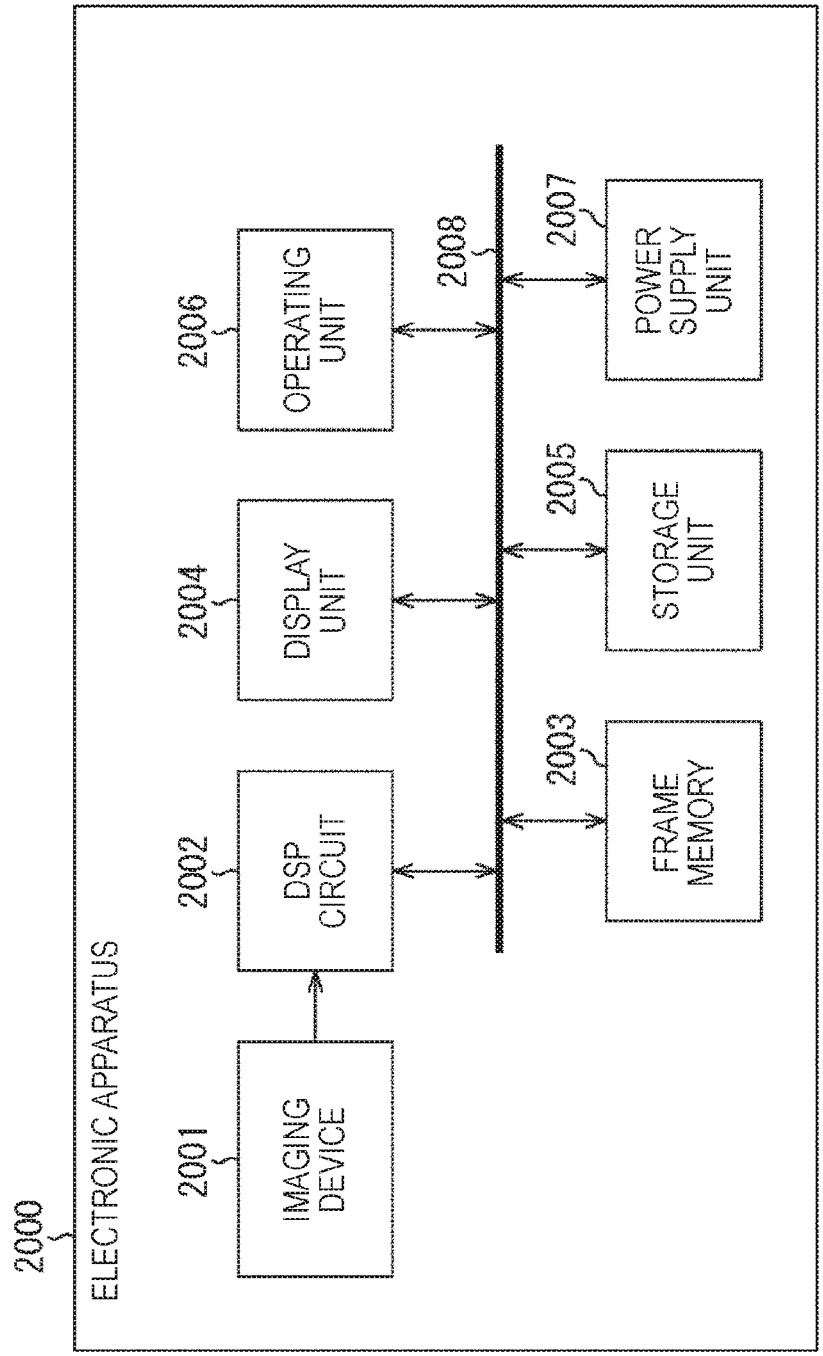
FIG. 37 is a diagram showing an example configuration of an electronic apparatus.

FIG. 37 is a diagram showing an example configuration of an electronic apparatus including an imaging device.

An electronic apparatus 2000 in FIG. 37 is an electronic apparatus, such as an imaging apparatus like a digital still camera or a video camera, or a mobile terminal device like a smartphone or a tablet, for example.

In FIG. 37, the electronic apparatus 2000 includes an imaging device 2001, a DSP circuit 2002, a frame memory 2003, a display unit 2004, a recording unit 2005, an operation unit 2006, and a power supply unit 2007. Also, in the electronic apparatus 2000, the DSP circuit 2002, the frame memory 2003, the display unit 2004, the recording unit 2005, the operation unit 2006, and the power supply unit 2007 are connected to one another via a bus line 2008.

The imaging device 2001 includes the pixels 100 shown in FIG. 1, and the cross-sectional structure shown in FIG. 1 is adopted as its structure, for example. The imaging device 2001 captures incident light (image light) from the object via an optical lens system (not shown), converts the amount of the incident light gathered on the imaging surface into an electrical signal on a pixel-by-pixel basis, and outputs the electrical signal as a pixel signal.

The DSP circuit 2002 is a signal processing circuit that processes signals supplied from the imaging device 2001, and is equivalent to the DSP circuit 1014 in FIG. 36. The DSP circuit 2002 outputs image data obtained by processing the signals from the imaging device 2001. The frame memory 2003 temporarily stores, on a frame-by-frame basis, the image data processed by the DSP circuit 2002.

The display unit 2004 is formed with a panel display device such as a liquid crystal panel or an organic electroluminescence (EL) panel, for example, and displays a moving image or a still image formed by the imaging device 2001. The recording unit 2005 records the image data of the moving image or the still image formed by the imaging device 2001 into a recording medium such as a semiconductor memory or a hard disk.

The operation unit 2006 outputs operation instructions as to the various functions of the electronic apparatus 2000, in accordance with operations performed by the user. The power supply unit 2007 supplies the DSP circuit 2002, the frame memory 2003, the display unit 2004, the recording unit 2005, and the operation unit 2006 with various power sources as the operation power sources for these supply destinations, as appropriate.

The electronic apparatus 2000 is configured as above. The electronic apparatus 2000 includes the imaging device 2001 in which pixels (the pixels 100 shown in FIG. 1, for example) for improving image quality are provided. Thus, luminance unevenness can be reduced, and image quality can be improved.

<Examples of Use of Imaging Devices>

FIG. 38 is a diagram showing examples of use of imaging devices serving as image sensors.

The above described imaging device (pixels 100) can be used in various cases where light such as visible light, infrared light, ultraviolet light, or an X-ray is sensed, as described below, for example. That is, as shown in FIG. 38, an imaging device can be used in an apparatus that is used not only in the appreciation activity field where images are taken and are used in appreciation activities, but also in the field of transportation, the field of home electric appliances, the fields of medicine and healthcare, the field of security, the field of beauty care, the field of sports, the field of agriculture, or the like, for example.

Specifically, in the appreciation activity field, for example, an imaging device can be used in an apparatus (the electronic apparatus 2000 in FIG. 37, for example) for taking images to be used in appreciation activities, such as a digital camera, a smartphone, or a mobile telephone with a camera function, as described above.

In the field of transportation, for example, an imaging device can be used in apparatuses for transportation use, such as vehicle-mounted sensors configured to take images of the front, the back, the surroundings, the inside, and the like of an automobile to perform safe driving like an automatic stop, recognize a driver's condition, and the like, surveillance cameras for monitoring running vehicles and roads, and ranging sensors for measuring distances between vehicles or the like.

In the field of home electric appliances, for example, an imaging device can be used in an apparatus to be used as home electric appliance, such as a television set, a refrigerator, or an air conditioner, to take images of gestures of users and operate the apparatus in accordance with the gestures. Also, in the fields of medicine and healthcare, for example, an imaging device can be used in an apparatus for medical use or healthcare use, such as an endoscope or an apparatus for receiving infrared light for angiography.

In the field of security, for example, an imaging device can be used in apparatuses for security use, such as surveillance cameras for crime prevention and cameras for personal authentication. Also, in the field of beauty care, for example, an imaging device can be used in an apparatus for beauty care use, such as a skin measurement apparatus configured to image the skin or a microscope for imaging the scalp.

In the field of sports, an imaging device can be used in apparatuses for sporting use, such as action cameras and wearable cameras for sports or the like. Also, in the field of agriculture, an imaging device can be used in apparatuses for agricultural use, such as cameras for monitoring conditions of fields and crops.

It should be noted that embodiments of the present technology are not limited to the above described embodiments, and various modifications may be made to them without departing from the scope of the present technology. For example, it is possible to employ a combination of all or some of the plurality of above described embodiments.

The present technology may also be embodied in the configurations described below.

(1)
An imaging device including:
a photodiode; and
a wiring layer formed on a surface facing an incident surface of the photodiode, a wiring line being formed in the wiring layer,
in which the wiring line in a pixel is formed in a different pattern from a pattern in a different pixel.

(2)
The imaging device according to (1), in which
when a position of the wiring line in a pixel is compared between different pixels, the positions are different.

(3)
The imaging device according to (1) or (2), in which
when a size of the wiring line in a pixel is compared between different pixels, the sizes are different.

(4)
The imaging device according to any of (1) to (3), in which
when a rotation angle of the wiring line in a pixel is compared between different pixels, the rotation angles are different.

(5)
The imaging device according to any of (1) to (4), in which
when a shape of the wiring line in a pixel is compared between different pixels, the shapes are different.

(6)
The imaging device according to (1), in which
the wiring line is periodically disposed, and the period of the wiring line and a period of the pixel are designed to be indivisible by each other.

(7)
The imaging device according to (1), in which
the wiring line is formed in a linear shape having a bend, and a period of the bend and a period of the pixel are designed to be indivisible by each other.

(8)
The imaging device according to (1), in which
the wiring line is formed in a plurality of layers, the wiring line in the respective layers are formed to have a predetermined period, and the period of the wiring line and a period of the pixel are designed to be indivisible by each other.

(9)
The imaging device according to any of (1) to (8), in which
a wiring capacitance to be generated between the wiring line in a pixel and a wiring line of a floating diffusion is kept constant.

(10)
The imaging device according to any of (1) to (9), in which
a pattern of the wiring line in a pixel is the different pattern at least from a pattern in an adjacent pixel of the same color.

(11)
An imaging device including:
a photodiode; and
a wiring layer formed on a surface facing an incident surface of the photodiode, a wiring line being formed in the wiring layer,
in which
a gap having a different dielectric constant from a dielectric constant of a material forming the wiring layer is formed in the wiring layer, and
the gap in a pixel is formed in a different pattern from a pattern in a different pixel.

(12)
The imaging device according to (11), in which
the gap is formed with air or one of an insulator, a conductor, and a semiconductor having a different dielectric constant from a dielectric constant of an insulator forming the wiring layer.

(13)
The imaging device according to (11) or (12), in which
when a position of the gap in a pixel is compared between different pixels, the positions are different.

(14)
The imaging device according to any of (11) to (13), in which
when a size of the gap in a pixel is compared between different pixels, the sizes are different.

(15)
The imaging device according to any of (11) to (14), in which
when a rotation angle of the gap in a pixel is compared between different pixels, the rotation angles are different.

(16)
The imaging device according to any of (11) to (15), in which
when a shape of the gap in a pixel is compared between different pixels, the shapes are different.

(17)
The imaging device according to any of (11) to (16), in which
the gap is periodically disposed, and the period of the wiring line and a period of the pixel are designed to be indivisible by each other.

(18)
The imaging device according to (11), in which
the gap is formed in a linear shape.

(19)
The imaging device according to (11), in which
the gap is formed in a plurality of layers.

(20)
The imaging device according to any of (11) to (19), in which
a pattern of the gap in a pixel is the different pattern at least from a pattern in an adjacent pixel of the same color.

REFERENCE SIGNS LIST

100 Pixel
101 Silicon substrate
102 Photodiode
103 Color filter
104 On-chip lens
105 Wiring layer
106 Wiring line
211 Wiring formation layer
212 Wiring formation interlayer
221 Air gap

The invention claimed is:
1. An imaging device, comprising:
a photodiode;
a wiring layer including a first wiring line and a second wiring line, wherein the wiring layer faces a surface opposite from an incident surface of the photodiode;

a first pixel including the first wiring line; and a second pixel, in direct contact with the first pixel, including the second wiring line, the first wiring line in the first pixel has a pattern different from that of the second wiring line in the second pixel, and the first pixel and the second pixel are of a same color.

2. The imaging device according to claim 1, wherein a position of the first wiring line in the first pixel is different from a position of the second wiring line in the second pixel.

3. The imaging device according to claim 1, wherein a size of the first wiring line in the first pixel is different from a size of the second wiring line in the second pixel.

4. The imaging device according to claim 1, wherein a rotation angle of the first wiring line in the first pixel is different from a rotation angle of the second wiring line in the second pixel.

5. The imaging device according to claim 1, wherein a shape of the first wiring line in the first pixel is different from a shape of the second wiring line in the second pixel.

6. The imaging device according to claim 1, further comprising a plurality of pixels arranged at a first periodic interval, wherein the plurality of pixels includes the first pixel and the second pixel, the first pixel further includes a plurality of wiring lines arranged at a second periodic interval, the plurality of wiring lines includes the first wiring line, and the first periodic interval is indivisible by the second periodic interval.

7. The imaging device according to claim 1, further comprising a plurality of pixels arranged at a first periodic interval, wherein the plurality of pixels includes the first pixel and the second pixel, the first pixel further includes the first wiring line, the first wiring line has a linear shape with a plurality of bends arranged at a second periodic interval, and the second periodic interval is indivisible by the first periodic interval.

8. The imaging device according to claim 1, further comprising a plurality of pixels arranged at a first periodic interval, wherein the plurality of pixels includes the first pixel and the second pixel, the first pixel further includes a plurality of wiring lines, the plurality of wiring lines is in a plurality of layers, the wiring lines, of the plurality of wiring lines, in each of the plurality of layers are arranged at a second periodic interval, and the first periodic interval is indivisible by the second periodic interval.

9. The imaging device according to claim 1, wherein a wiring capacitance between the first wiring line in the first pixel and a specific wiring line of a floating diffusion is constant.

10. An imaging device comprising:

a photodiode;

a first pixel including a first gap;

a second pixel including a second gap;

a wiring layer faces a surface opposite from an incident surface of the photodiode, wherein the wiring layer includes:

a wiring line;

the first gap;

the second gap; and an insulating layer including the wiring line, the first gap and the second gap, wherein each of the first gap and the second gap has a dielectric constant different from a dielectric constant of the insulating layer, the first gap in the first pixel has a pattern different from that of the second gap in the second pixel, wherein the first pixel is adjacent to the second pixel, and the first pixel and the second pixel are of a same color;

wherein the first pixel is in direct contact with the second pixel, and the first pixel and the second pixel are of a same color.

11. The imaging device according to claim 10, wherein each of the first gap and the second gap comprises one of:

an air gap, or one of an insulator, a conductor, or a semiconductor.

12. The imaging device according to claim 10, wherein a position of the first gap in the first pixel is different from a position of the second gap in the second pixel.

13. The imaging device according to claim 10, wherein a size of the first gap in the first pixel is different from a size of the second gap in the second pixel.

14. The imaging device according to claim 10, wherein a rotation angle of the first gap in the first pixel is different from a rotation angle of the second gap in the second pixel.

15. The imaging device according to claim 10, wherein a shape of the first gap in the first pixel is different from a shape of the second gap in the second pixel.

16. The imaging device according to claim 10, further comprising a plurality of pixels arranged at a first periodic interval, wherein the plurality of pixels includes the first pixel and the second pixel, the first pixel further includes a plurality of gaps arranged at a second periodic interval, the plurality of gaps includes the first gap, and the first periodic interval is indivisible by the second periodic interval.

17. The imaging device according to claim 10, wherein each of the first gap and the second gap has a linear shape.

18. The imaging device according to claim 10, further comprising a plurality of gaps in a plurality of layers.

* * * * *